United States Patent
Endoh et al.

(10) Patent No.: US 11,705,176 B2
(45) Date of Patent: Jul. 18, 2023

(54) STORAGE CIRCUIT PROVIDED WITH VARIABLE RESISTANCE TYPE ELEMENTS, AND ITS TEST DEVICE

(71) Applicant: TOHOKU UNIVERSITY, Sendai (JP)

(72) Inventors: Tetsuo Endoh, Sendai (JP); Hiroki Koike, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 17/395,210

(22) Filed: Aug. 5, 2021

(65) Prior Publication Data
US 2022/0172761 A1    Jun. 2, 2022

(30) Foreign Application Priority Data

Aug. 7, 2020 (JP) ................................. 2020-134555

(51) Int. Cl.
*G11C 11/16* (2006.01)
*G11C 29/04* (2006.01)

(52) U.S. Cl.
CPC ...... *G11C 11/1673* (2013.01); *G11C 11/1659* (2013.01); *G11C 29/04* (2013.01)

(58) Field of Classification Search
CPC . G11C 11/1673; G11C 11/1659; G11C 29/04; G11C 13/003; G11C 2013/0042;
(Continued)

(56) References Cited

U.S. PATENT DOCUMENTS 7,599,220 B2 * 10/2009 Lin .................... G11C 16/26
365/210.11
9,697,895 B1 * 7/2017 Zaitsu ................ G11C 13/0064
(Continued)

FOREIGN PATENT DOCUMENTS

JP    2002197853 A    7/2002
JP    2002260377 A    9/2002
(Continued)

OTHER PUBLICATIONS

Qing Dong et al., "A 1-Mb 28nm 1T1IMTJ STT-MRAM With Single-Cap Offset-Cancelled Sense Amplifier and In Situ Self-Write-Termination", IEEE Journal of Solid-State Circuits, vol. 54, No. 1, pp. 231-239, Jan. 2019.
(Continued)

*Primary Examiner* — Fernando Hidalgo
(74) *Attorney, Agent, or Firm* — Greer Burns & Crain Ltd.

(57) ABSTRACT

A storage circuit includes: the array of a memory cell MC including a variable-resistance element; a conversion circuit that converts the resistance value of each memory cell into the signal level of an electric signal; a reference signal generation circuit that generates a reference signal common to a plurality of columns; a correction circuit that corrects one of the signal level of the reference signal and the signal level of the electric signal for each column of the array of the memory cell; and an RW circuit that determines data stored in the memory cell belonging to a corresponding column by comparing one of the reference level and the signal level of the electric signal, corrected by the correction circuit, and the other of the reference level and the signal level of the electric signal.

15 Claims, 30 Drawing Sheets

(58) Field of Classification Search
CPC ........ G11C 2013/0054; G11C 2213/79; G11C 13/004; G11C 14/0081; G11C 7/062; G11C 7/065; G11C 29/021; G11C 29/026; G11C 29/1201; G11C 29/24; G11C 29/025; G11C 29/028; G11C 29/4401; G11C 29/81

USPC .......................................................... 365/158

See application file for complete search history.

(56) References Cited

U.S. PATENT DOCUMENTS

| | | | |
|---|---|---|---|
| 10,665,282 | B2 | 5/2020 | Koike et al. |
| 2006/0146625 | A1 | 7/2006 | Morita |
| 2010/0073999 | A1 | 3/2010 | Kitai et al. |
| 2013/0268795 | A1 | 10/2013 | Nomura et al. |
| 2013/0322161 | A1 | 12/2013 | Noguchi et al. |
| 2014/0050010 | A1 | 2/2014 | Toda |
| 2014/0334222 | A1 | 11/2014 | Bateman et al. |
| 2016/0078915 | A1* | 3/2016 | Katayama ............... G11C 7/065 365/158 |
| 2018/0137913 | A1 | 5/2018 | Kim |

FOREIGN PATENT DOCUMENTS

| | | | |
|---|---|---|---|
| JP | 2003257177 | A | 9/2003 |
| JP | 2003281880 | A | 10/2003 |
| JP | 2003317467 | A | 11/2003 |
| JP | 2003346475 | A | 12/2003 |
| JP | 2004046962 | A | 2/2004 |
| JP | 2004103202 | A | 4/2004 |
| JP | 2005518627 | A | 6/2005 |
| JP | 2009238327 | A | 10/2009 |
| JP | 2011065701 | A | 3/2011 |
| JP | 2011204287 | A | 10/2011 |
| JP | 2013161502 | A | 8/2013 |
| JP | 2015052938 | A | 3/2015 |
| JP | 5492324 | A | 5/2015 |
| WO | 2008044300 | A1 | 4/2008 |
| WO | 2015083754 | A1 | 6/2015 |
| WO | 2016186086 | A1 | 11/2016 |
| WO | 2019112068 | A1 | 6/2019 |
| WO | WO-2019112068 | A1 * | 6/2019 ............. G11C 11/16 |

OTHER PUBLICATIONS

T. Ohsawa et al., "Hi-Density and Low-Power Nonvolatile Static Random Access Memory Using Spin-Transfer-Torque Magnetic Tunnel Junction", Japanese Journal of Applied Physics 51, 2012, pp. 02BDO1-1-02BDO1-6.

S. Yamamoto et al., "Nonvolatile Static Random Access Memory Using Magnetic Tunnel Junctions with Current-Induced Magnetization Switching Architecture", Japanese Journal of Applied Physics 48, 2009, pp. 043001-1-043001-7.

K. Abe et al., "Hierarchical Cache Memory based on MRAM and Nonvolatile SRAM with Perpendicular Magnetic Tunnel Junctions for Ultra Low Power System", Solid State Devices Materials 2010, pp. 1144-1145.

Written opinion issued in PCT/JP2018/045354, dated Jan. 15, 2019.

Written opinion issued in PCT/JP2014/082040, dated Jan. 13, 2015.

Written opinion issued in PCT/JP2016/064531, dated Aug. 2, 2016.

Office action issued in counterpart JP Application No. 2015-551550, dated Apr. 10, 2018.

Intl Preliminary report on patentability issued in PCT/JP2016/064531, dated Jan. 1, 2017.

Takashi Ohsawa et al; U.S. Appl. No. 15/101,809, filed Jun. 3, 2016; issued as U.S. Pat. No. 9,633,708 on Apr. 25, 2017.

Hiroki Koike et al; U.S. Appl. No. 15/573,904, filed Aug. 13, 2018; issued as U.S. Pat. No. 10,665,282 on May 26, 2020.

Hiroki Koike et al; U.S. Appl. No. 16/770,411, filed Jun. 5, 2020.

* cited by examiner

| CORRECTION DATA D | | | CORRECTION VOLTAGE $V_{ame}$ |
|---|---|---|---|
| BIT2 | BIT1 | BIT0 | |
| 0 | 1 | 1 | +12mV |
| 0 | 1 | 0 | +8mV |
| 0 | 0 | 1 | +4mV |
| 0 | 0 | 0 | 0mV |
| 1 | 0 | 1 | -4mV |
| 1 | 1 | 0 | -8mV |
| 1 | 1 | 1 | -12mV |

FIG. 5

FIG. 6A  /RE 
FIG. 6B  WL₁ 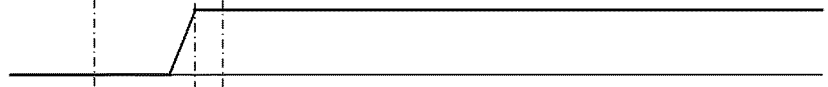
FIG. 6C  /SAE 
FIG. 6D  $V_{bj}$ 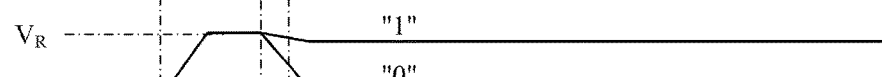
FIG. 6E  $EV_{ref}$ 
FIG. 6F  $CLR_j$ 
FIG. 6G  DATA 

READ DATA "1"

| CORRECTION VOLTAGE $V_{ame}$ | $MC_{11}$ | $MC_{21}$ | $MC_{31}$ | ... | $RMC_m$ |
|---|---|---|---|---|---|
| +12mV | CORRECT | CORRECT | CORRECT | ... | CORRECT |
| +8mV | CORRECT | CORRECT | CORRECT | ... | CORRECT |
| +4mV | CORRECT | CORRECT | CORRECT | ... | CORRECT |
| 0mV | CORRECT | CORRECT | CORRECT | ... | CORRECT |
| -4mV | CORRECT | CORRECT | CORRECT | ... | CORRECT |
| -8mV | CORRECT | INCORRECT | CORRECT | ... | INCORRECT |
| -12mV | INCORRECT | INCORRECT | INCORRECT | ... | INCORRECT |

FIG. 11A

READ DATA "0"

| CORRECTION VOLTAGE $V_{ame}$ | $MC_{11}$ | $MC_{21}$ | $MC_{31}$ | ... | $RMC_m$ |
|---|---|---|---|---|---|
| +12mV | INCORRECT | INCORRECT | INCORRECT | ... | INCORRECT |
| +8mV | INCORRECT | INCORRECT | INCORRECT | ... | INCORRECT |
| +4mV | CORRECT | INCORRECT | INCORRECT | ... | CORRECT |
| 0mV | CORRECT | CORRECT | CORRECT | ... | CORRECT |
| -4mV | CORRECT | CORRECT | CORRECT | ... | CORRECT |
| -8mV | CORRECT | CORRECT | CORRECT | ... | CORRECT |
| -12mV | CORRECT | CORRECT | CORRECT | ... | CORRECT |

FIG. 11B

STORAGE CIRCUIT PROVIDED WITH VARIABLE RESISTANCE TYPE ELEMENTS, AND ITS TEST DEVICE

FIELD

This disclosure relates to: a storage circuit including a variable-resistance element as a memory cell; and a device of testing the storage circuit.

BACKGROUND

International Publication No. WO 2019/112068 discloses a storage circuit including: a plurality of bit lines to which a plurality of variable-resistance memory cells are connected; and a plurality of sense amplifiers each of which determines data read out from the memory cell by amplifying a difference between a bit line voltage and a reference voltage. The common reference voltage is applied to the plurality of sense amplifiers.

PRIOR ART LITERATURE

Patent Literature

International Publication 2019/112068

Nonpatent Literature

J. Solid-State Circuits, January 2019 P231 "A 1-Mb 28 nm 1 T1 MT J STT-MRAM With Single-Cap Offset-Cancelled Sense Amplifier and In Situ Self-Write-Termination"

SUMMARY

The resistance values of the variable-resistance memory cells fluctuate or vary to some extent cell by cell. Therefore, even in the case of memory cells storing the same data, the voltage of the bit line varies depending on the memory cells. An explanation thereof will be given based on specific examples.

In a storage circuit illustrated in FIG. 28, a plurality of memory cells $MC_i$ (i represents a natural number) are connected to a bit line BL, and the bit line BL is connected to the positive input terminal of a sense amplifier SA. The bit line BL is pulled up to a readout voltage $V_R$ by a load transistor RT.

Selection transistors $ST_i$ are serially connected to the memory cells $MC_i$, respectively. The other ends of the selection transistors $ST_i$ are grounded through a source line SL and a grounding transistor GT.

Each of the memory cells $MC_i$ is formed of a variable-resistance element such as a magnetoresistive element, and set at a high or low resistance. Data "1" and "0" are assigned to the two resistance values, to thereby store the data. Here, it is assumed that "1" is assigned to the high-resistance, and "0" is assigned to the low resistance.

In such a configuration, when reading out the stored data from the memory cell $MC_i$, first, the load transistor RT and the grounding transistor GT are turned on. Subsequently, the voltage of the word line $WL_i$ is set at a high level to turn on the selection transistor $ST_i$. Then, the voltage (bit line voltage) $V_b$ of the bit line BL decreases gradually to a value obtained by dividing the readout voltage $V_R$ by (resistance value of memory cell $MC_i$+ON resistance of grounding transistor GT) and the ON resistance of the load transistor RT, as illustrated in FIG. 29. In FIG. 29, the solid line represents a change in the bit line voltage $V_b$ in a case in which the memory cell $MC_i$ stores data is "1" and has the high resistance, and the dashed line represents a change in the bit line voltage $V_b$ in a case in which the memory cell $MC_i$ stores data "0" and has the low resistance. Accordingly, the sense amplifier SA can determine the data stored in the memory cell $MC_i$ by setting the reference voltage $V_{ref}$ between the bit line voltages $V_b$ in cases in which the memory cell $MC_i$ is set at the high resistance and the low resistance, respectively.

However, the many memory cells MC are connected to the one bit line BL. The characteristics of the many memory cells MC are not identical with each other. Therefore, the bit line voltage $V_b$ is distributed or varied around bit line voltages $V_{b1}$ and $V_{b0}$ depending on whether the memory cells MC for readout stores "1" or "0", as illustrated in FIG. 30A. Accordingly, in order to correctly determine stored data, it is required that the reference voltage $V_{ref}$ is set between the distribution ranges of the bit line voltages $V_b$ in cases in which the stored data is "1" and "0", respectively.

In addition, the common reference voltages $V_{ref}$ are supplied to sense amplifiers SA in a plurality of columns in the storage circuit according to International Publication No. WO 2019/112068. However, it is unavoidable that, for example, the characteristics of the memory cells MC vary, the characteristics of load transistors RT vary, the characteristics of grounding transistors GT vary, and arrangement positions thereof vary. Therefore, the distributions of bit line voltages $V_b$ vary over the bit lines BL. Therefore, it is not easy to set the common reference voltages $V_{ref}$ to the sense amplifiers SA in the plurality of columns. For example, if bit line voltages $V_b$ vary between a bit line BL1 and a bit line BL2, as illustrated in FIG. 30B, it is difficult to correctly determine the data stored in all the memory cells MC even in the case of setting the reference voltages $V_{ref}$ at any value.

Moreover, an offset voltage $\Delta V_{offset}$ is generated in the sense amplifier SA in each column. It is desirable that the offset voltage $\Delta V_{offset}$ is 0 V; however, a certain significant voltage is actually generated as the offset voltage $\Delta V_{offset}$. Moreover, the offset voltage $\Delta V_{offset}$ varies over the sense amplifiers SA. Therefore, outputs from the sense amplifiers SA vary even when the identical bit line voltages $V_b$ and the identical reference voltages $V_{ref}$ are supplied.

In this context, an offset cancellation technology in which variations in the offset voltage of a sense amplifier are reduced is disclosed in J. Solid-State Circuits, January 2019 P231 "A 1-Mb 28 nm 1T1MTJ STT-MRAM With Single-Cap Offset-Cancelled Sense Amplifier and In Situ Self-Write-Termination". In the offset cancellation technology, a voltage corresponding to the offset voltage is held in a capacitor in a circuit, and the voltage is applied to the gate voltages of transistors included in the sense amplifier, to cancel the offset voltage.

In the offset cancellation technology, however, the capacitor which is an analog element and the plurality of transistors that controls charge are required, the circuit is large, and it is difficult to control a voltage by charge charged in the capacitor. In addition, a voltage setting operation is required for each operation of the sense amplifier, and is laborious.

Similar problems also occur in a storage circuit in which a memory element includes a pair of memory cells complementarily storing data, and outputs a pair of complementary read data.

SUMMARY

The present disclosure was made under such actual circumstances with an objective to enable data stored in a memory cell including a variable-resistance element to be precisely read out.

In order to achieve the objective described above, a storage circuit according to a first aspect of the present disclosure includes:

a memory cell array including a memory cell that includes a variable-resistance element and is arranged in a matrix form;

a selection circuit that selects the memory cell in the memory cell array;

a conversion circuit that converts a resistance value of the memory cell selected by the selection circuit into an electric signal;

a reference signal generation circuit that generates a reference signal for determining data stored in the memory cell;

a sense amplifier that is arranged in each column of the matrix, and compares the electric signal, into which the conversion has been performed by the conversion circuit, with the reference signal generated by the reference signal generation circuit, to determine the data stored in the memory cell selected by the selection circuit;

a correction data storage that stores correction data for correcting, for each of the sense amplifiers, a physical property for determining the data stored in the memory cell; and a correction circuit that corrects the physical property based on the correction data stored in the correction data storage, for each of the sense amplifiers.

For example, the correction circuit corrects a physical property of one signal of the electric signal and the reference signal, and each sense amplifier compares the one signal of either the reference signal or the electric signal, of which the physical property has been corrected by the correction circuit, with remaining one of the reference signal or the electric signal, to thereby determine the data stored in the memory cell.

For example, the physical property (physical quantity) is a voltage value or a current value. For example, the correction circuit corrects the voltage or current value of the one signal, the sense amplifier compares the voltage or current value of the one signal, of which the voltage or current value has been corrected by the correction circuit, with the voltage or current value of the other signal, to thereby determine the data stored in the memory cell.

The correction circuit includes, for example: a correction signal generation circuit that generates a correction signal based on correction data stored in the correction data storage, for each of the sense amplifiers; and adder circuits that add the correction signals, generated by the correction signal generation circuit, to one of the electric signals and the reference signal, and supplies the resultant to the sense amplifier.

The correction circuit includes, for example an amplifier circuit that amplifies one signal of the electric signal and the reference signal at an amplification factor based on the correction data stored in the correction data storage, to thereby correct the one signal.

The amplifier circuit includes, for example: an operational amplifier; and an amplification factor change circuit that changes at least one of a resistance value between an output terminal and negative input terminal of the operational amplifier, and a resistance value between the reference voltage and the negative input terminal of the operational amplifier, based on the correction data.

The correction circuit includes, for example, a partial dividing resistance changer that corrects an electric signal output from the conversion circuit by changing a resistance value between a first reference voltage and one end of each memory cell, and a resistance value between each memory cell and a second reference voltage, based on the correction data.

The correction circuit includes, for example, a plurality of transistors that electrically connects between the first reference voltage and one end of each memory cell, the plurality of transistors being turned on/off based on the correction data stored in the correction data storage.

The correction circuit includes, for example, resistance elements that are serially connected to current paths of the plurality of transistors.

The physical property is, for example, an offset voltage of the sense amplifier. For example, the correction circuit corrects the offset voltage of the sense amplifier based on the correction data.

In such a case, the sense amplifier includes, for example, a plurality of transistors connected to each other, and the correction circuit corrects a voltage of a predetermined connection node of the plurality of transistors included in the sense amplifier, based on the correction data.

The correction data storage includes, for example, a variable-resistance element of which a configuration is identical with that of the memory cell.

The memory cell includes, for example, a resistance value corresponding to variable data to be stored. For example, the conversion circuit generates an electric signal corresponding to the data stored in the memory cell selected by the selection circuit, and the reference signal generation circuit includes the memory cell including a resistance value corresponding to fixation data to be stored, and generates the reference signal based on the resistance value.

The memory cell includes, for example, a resistance value corresponding to variable data to be stored. For example, the reference signal generation circuit includes a matrix of a second memory cell that is arranged in correspondence with each memory cell and includes a variable-resistance element storing data complementarily with the corresponding memory cell, and generates the reference signal including a signal level corresponding to a resistance value of the second memory cell selected by the selection circuit.

A testing device of the present disclosure includes: a readout circuit that controls the correction circuit, sets a plurality of correction quantities in each memory cell, and reads out stored data for each correction quantity; a determiner that determines whether or not the stored data can be correctly read out when any correction quantity is set for each memory cell; and a setter that sets a correction quantity for each column in the correction circuit based on a result of determination, by unit of a column of a matrix of the memory cell, by the determiner.

For example, the setter sets, in the correction circuit, a correction quantity, at which it has been determined that all data stored in the memory cell in each column can be correctly read out, based on the result of the determination, by the unit of the column, by the determiner, for each column of the matrix of the memory cell.

The storage circuit includes, for example, a column of redundant memory cells, and the setter performs setting so that an access to a defective memory cell is replaced with an access to one of the redundant memory cells based on the result of the determination by the determiner.

In accordance with the storage circuit of the present disclosure, a physical property for determining stored data can be customized for each sense amplifier. Therefore, the stored data can be appropriately determined.

BRIEF DESCRIPTION OF THE DRAWINGS

FIG. 5 is a view for explaining a correction voltage $V_{ame}$ illustrated in FIG. 4;

FIGS. 6A to 6G are timing charts for explaining the readout operation of the storage circuit illustrated in FIG. 1;

FIGS. 11A and 11B are views illustrating examples of a corrigendum generated in the corrigendum generation process illustrated in FIG. 9;

EMBODIMENTS

A storage circuit 11 according to an embodiment of the present disclosure will be described below with reference to the drawings. The storage circuit 11 of the present embodiment is a storage circuit in which a reference voltage used in a sense amplifier arranged in each column of a memory cell array can be corrected and optimized for each column.

Figure 1:
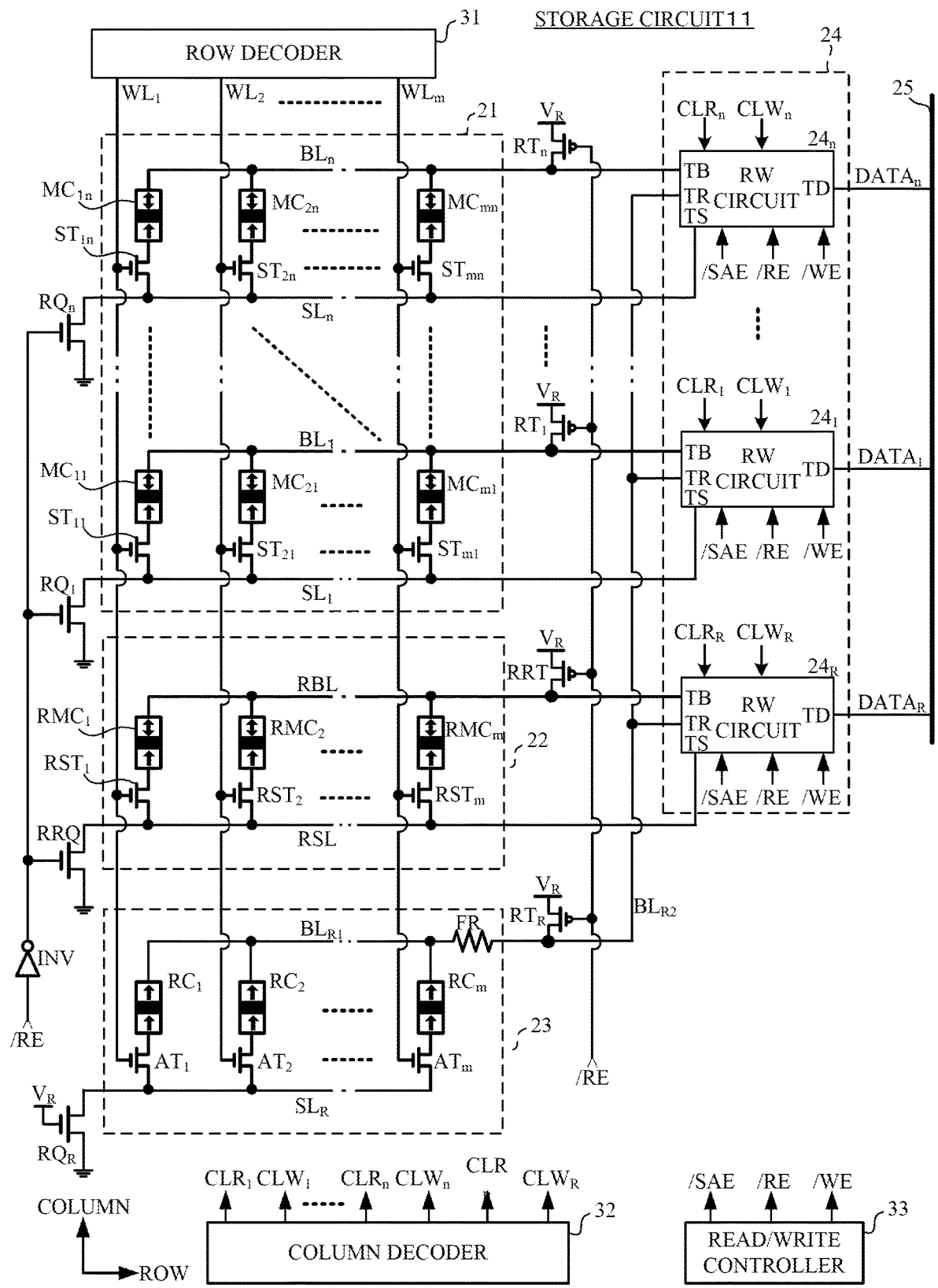
FIG. 1 is a block diagram of a storage circuit according to an embodiment of the present disclosure.

As illustrated in FIG. 1, the storage circuit 11 according to the present embodiment includes a memory cell array 21, a redundant memory cell array 22, a reference cell array 23, a read/write (RW) circuit array 24, a row decoder 31, a column decoder 32, and a read/write controller 33.

The memory cell array 21 includes memory cells $MC_{ij}$ (i=1 to m, j=1 to n) arrayed in a matrix form of m rows and n columns. Each of m and n is a natural number.

The redundant memory cell array 22 is arranged adjacently in the column direction of the memory cell array 21, and includes redundant memory cells $RMC_{ij}$ (i=1 to m, j=1 to N) arrayed in a matrix form of m rows and N columns. The case of N=1, that is, an example in which the redundant memory cells RMC are arrayed in a matrix form of m rows and one column is illustrated in FIG. 1. In the following description, it is assumed that N=1, and redundant memory cells $RMC_1$ to $RMC_m$ are arrayed.

The reference cell array 23 is arranged adjacently in the column direction of the redundant memory cell array 22. The reference cell array 23 includes:

reference cells $RC_i$ (i=1 to m) arrayed in a matrix form of m rows and one column;

and a common fixed resistance FR.

The memory cells $MC_{ij}$, the redundant memory cells $RMC_i$, and the reference cells $RC_i$ each include a magnetic tunneling junction (MTJ) element which is an example of a variable-resistance element, and have the same configuration and characteristics as each other. The details thereof will be described later with reference to FIGS. 2A and 2B.

The positions, in the row direction on a semiconductor substrate, of the memory cells $MC_{ij}$, the redundant memory cells $RMC_i$, and the reference cells $RC_i$, in the row i, are set to be the same as each other.

The RW circuit array 24 includes: an RW circuit $24_j$ (j=1 to n) arrayed in one row and n columns; and N redundant RW circuits $24_R$. In the present embodiment, one redundant RW circuit $24_R$ is arranged in FIG. 1 because of N=1.

Each of the RW circuits $24_j$ and $24_R$ has both of a read function and a write function, that is, i) a sense amplifier function of reading out data stored in the memory cell $MC_{ij}$ or redundant memory cell $RMC_i$ arranged in the same column as that thereof in a read operation, and ii) a function of writing data in the memory cell $MC_{ij}$ or redundant memory cell $RMC_i$ arranged in the same column as that thereof in a write operation. The details of the RW circuits $24_j$ and the redundant RW circuits $24_R$ will be described later. In the following discussion, the RW circuit $24_j$ and the redundant RW circuit $24_R$ may be collectively referred to as "RW circuits 24".

One end of the current path (source-drain path) of the selection transistor $ST_{ij}$ is connected to one end of memory cell $MC_{ij}$ included in the memory cell array 21. The other end of the current path of the selection transistors $ST_{ij}$ in the column j is connected in common to a source line $SL_j$ arranged in the column j. The selection transistor $ST_{ij}$ includes an NMOS transistor, the drain thereof is connected to one end of the corresponding memory cell $MC_{ij}$, and the source thereof is connected to the source line $SL_j$.

One end of the source line $SL_j$ is grounded through the current path of a grounding transistor $RQ_j$. The other end of the source line $SL_j$ is connected to the source line terminal TS of the RW circuit $24_j$.

The other end of the memory cell $MC_{ij}$ in the column j are connected in common to a bit line $BL_j$ arranged in the column j. One end of the bit line $BL_j$ in column j is connected to the bit line terminal TB of the RW circuit $24_j$ in the column j.

One end of the current path of a load transistor $RT_j$ is connected to the bit line $BL_j$ in the column j. A readout voltage $V_R$ is applied to the other end of the current path of the load transistor $RT_j$. The load transistor $RT_j$ includes a PMOS transistor, and functions as a load resistance when data is read out.

One end of the current path of redundant selection transistor $RST_i$ is connected to one end of the redundant memory cell $RMC_i$ included in the redundant memory cell array 22. The other end of the current path of each redundant selection transistor $RST_i$ is connected in common to a redundant source line RSL. Each redundant selection transistor $RST_i$ has the same configuration and characteristics as those of the selection transistor $ST_{ij}$.

One end of the redundant source line RSL is grounded through the current path of a redundant grounding transistor RRQ. The other end of the redundant source line RSL is connected to the source line terminal TS of the redundant RW circuit $24_R$.

The other end of the redundant memory cell $RMC_i$ is connected in common to a redundant bit line RBL. One end of the redundant bit line RBL is connected to the bit line terminal TB of the redundant RW circuit $24_R$.

One end of the current path of a redundant load transistor RRT is connected to the redundant bit line RBL. A readout voltage $V_R$ is applied to the other end of the current path of the redundant load transistor RRT. The redundant load transistor RRT has the same configuration as that of the load transistor $RT_j$.

One end of the current path of selection transistor $AT_i$ is connected to one end of reference cell $RC_i$ included in the reference cell array 23. The other end of the current path of the selection transistor $AT_i$ is connected in common to a reference source line $SL_R$. The selection transistor $AT_i$ has the same configuration and characteristics as those of the selection transistors $ST_{ij}$ and $RST_i$.

One end of the reference source line $SL_R$ is grounded through the current path of a grounding transistor $RQ_R$. The gate of the grounding transistor $RQ_R$ is pulled up to a readout voltage $V_R$.

The other end of the reference cell $RC_i$ is connected in common to a reference bit line $BL_R$. The one end of reference bit line $BL_R$ is connected in common to the reference bit line terminals TR of the RW circuits $24_1$ to $24_n$ and the redundant RW circuit $24_R$.

One end of the current path of a reference load transistor $RT_R$ is connected to a position, outside the reference cell array 23, of the reference bit line $BL_R$. A readout voltage $V_R$ is applied to the other end of the current path of the reference load transistor $RT_R$. The reference load transistor $RT_R$ functions as a load when data is read out, and has the same configuration and characteristics as those of the load transistors $RT_1$ to $RT_n$ and RRT.

A fixed resistance FR is inserted between a connection node between the reference bit line $BL_R$ and the reference cell $RC_m$ in the row m, and a connection node between the reference bit line $BL_R$ and the reference load transistor $RT_R$.

For distinction, i) the portion, closer to the reference memory cell $RC_i$ than the connection node between the reference bit line $BL_R$ and the reference load transistor $RT_R$, of the reference bit line $BL_R$ is referred to as "first reference bit line $BL_{R1}$", and ii) the portion, closer to the RW circuit array 24 than the connection node between the reference bit line $BL_R$ and the reference load transistor $RT_R$, of the reference bit line $BL_R$ is referred to as "second reference bit line $BL_{R2}$", in the following description.

The material, thickness, and width of the first reference bit line $BL_{R1}$ are equal to those of the bit line $BL_j$. In contrast, the cross-sectional area (product of thickness and width) of the second reference bit line $BL_{R2}$ is formed to be greater than the cross-sectional area of the first reference bit line $BL_{R1}$, and the resistance value per unit length of the second reference bit line $BL_{R2}$ is less than the resistance value per unit length of the first reference bit line $BL_{R1}$.

A low-active read enable signal /RE is applied to the gates of the grounding transistors $RQ_j$ and the redundant grounding transistor RRQ through an inverter INV.

A low-active read enable signal /RE is applied to the gates of the load transistor $RT_j$, the redundant load transistor RRT, and the reference load transistor $RT_R$.

The load transistor $RT_j$, the bit line $BL_j$, the selection transistor $ST_{ij}$, and the grounding transistor $RQ_j$ cooperatively function as an example of a conversion circuit that converts the resistance value of the memory cell $MC_{ij}$ into a bit line voltage $V_{bj}$. In the present embodiment, the resistance value of the memory cell $MC_{ij}$ is converted into a voltage signal which is an example of an electric signal, and the bit line voltage $V_{bj}$ is an example of the signal level of an electric signal.

The redundant load transistor RRT, the redundant bit line RBL, the redundant selection transistor $RST_i$, and the redundant grounding transistor RRQ cooperatively function as an example of a conversion circuit that converts the resistance value of each redundant memory cell $RMC_i$ into a redundant bit line voltage $RV_b$. The redundant bit line voltage $RV_b$ is an example of a signal level corresponding to the resistance value of each redundant memory cells $RMC_i$.

The reference load transistor $RT_R$, the reference bit line $BL_R$ ($BL_{R1}$, $BL_{R2}$), the selection transistor $AT_i$, and the grounding transistor $RQ_R$ cooperatively function as an example of a reference signal generation circuit that generates a reference voltage $V_{ref}$ that corresponds to the combined resistance of the reference memory cells $RC_i$ and the resistance value $R_{fix}$ of the fixed resistance FR and is common to all sense amplifiers 241. The reference voltage $V_{ref}$ is an example of the reference level of a reference signal.

The row decoder 31 decodes a row address from a higher-level device which is not illustrated, and sets, at a high level, the voltage of a word line $WL_i$ in a row belonging to a memory cell $MC_{ij}$ to be accessed.

The column decoder 32 decodes a column address from a higher-level device. According to a read/write control signal, the column decoder 32 i) outputs a high-active readout column selection signal $CLR_j$ to the RW circuit $24_j$ in a column to which a memory cell $MC_{ij}$ for readout belongs, and ii) outputs a high-active writing column selection signal $CLW_j$ to the RW circuit $24_j$ in a column to which a memory cell $MC_{ij}$ for writing belongs.

The row decoder 31, the column decoder 32, the word lines $WL_i$, and the selection transistors $ST_{ij}$ are an example of selection circuits that select the memory cell $MC_{ij}$.

According to a read/write control signal from a higher-level device which is not illustrated, the read/write controller 33 i) outputs a low-active read enable signal /RE in common to the gates of the load transistor $RT_j$ and the redundant load transistor RRT, ii) outputs a read enable signal /RE to the gates of the grounding transistor $RQ_j$ and the redundant grounding transistor RRQ through the inverter INV, and further iii) outputs a low-active sense amplifier activating signal to all the RW circuit $24_j$ and the redundant RW circuit $24_R$, in a readout operation. According to the read/write control signal, the read/write controller 33 outputs a low-active write enable signal /WE to all the RW circuit $24_j$ and the redundant RW circuit $24_R$, in a writing operation.

The bit line terminal TB, reference bit line terminal TR, and source line terminal TS of the RW circuit $24_j$ are connected to the bit line $BL_j$ in the same column as that thereof, the second reference bit line $BL_{R2}$ in the same column as that thereof, and the source line $SL_j$ in the same column as that thereof, respectively.

To the RW circuit $24_j$, the readout column selection signal $CLR_j$ and the writing column selection signal $CLW_j$ are supplied from the column decoder 32, and the read enable signal /RE, the write enable signal /WE, and a sense amplifier enable signal /SAE are supplied from the read/write controller 33.

When data is read out, the RW circuit $24_j$ in the column j differentially amplifies the bit line voltage $V_{bj}$ supplied from the bit line $BL_j$ and the reference voltage $V_{ref}$ supplied from the second reference bit line $BL_{R2}$ in response to the readout column selection signal $CLR_j$, the read enable signal /RE, and the sense amplifier enable signal /SAE, latches an amplification result (readout data $DATA_j$), and outputs the amplification result to a bus 25.

When data is written, the RW circuit $24_j$ in the column j applies a voltage between the bit line $BL_j$ and the source line $SL_j$ to write data in the memory cells $MC_{ij}$ according to the writing data DATA) supplied from the bus 25 in response to the writing column selection signal $CLW_j$ and the write enable signal /WE.

The redundant RW circuit $24_R$ basically includes the same configuration as that of the RW circuit $24_j$. When data is read out, the redundant RW circuit $24_R$ differentially amplifies the redundant bit line voltage $RV_b$ supplied from the redundant bit line RBL and the reference voltage $V_{ref}$ supplied from second reference bit line $BL_{R2}$ in response to a readout column selection signal $CLR_R$, the read enable signal /RE, and the sense amplifier enable signal /SAE, latches an amplification result (readout data DATA), and outputs the amplification result to the bus 25. When data is written, the redundant RW circuit $24_R$ applies a voltage between the redundant bit line RBL and the reference source line $SL_R$ to write data in the redundant memory cells $RMC_i$ according to the writing data DATA supplied from the bus 25 in response to a writing column selection signal $CLW_R$ and the write enable signal /WE.

The bus 25 is a bus having a bus width of 1 bit.

Figure 2A:
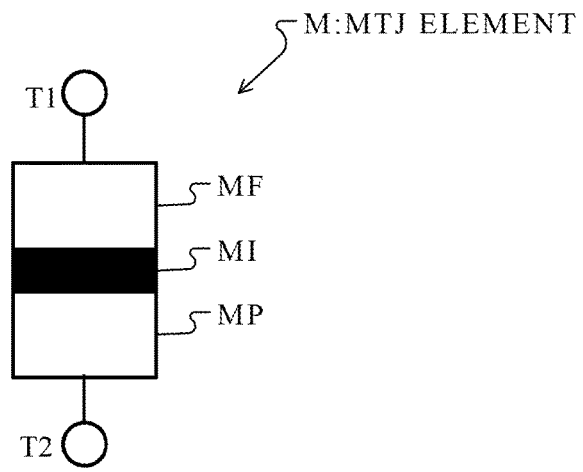
FIG. 2A is a view illustrating the configuration of a magnetic tunneling junction (MTJ) element.

The memory cell $MC_{ij}$, the redundant memory cell $RMC_i$, and the reference cell $RC_i$ will now be described with reference to FIGS. 2A and 2B. The memory cell $MC_{ij}$, the redundant memory cell $RMC_i$, and the reference cell $RC_i$ have the same configuration and characteristics, and are therefore described by taking the memory cell $MC_{ij}$ as an example in FIGS. 2A and 2B.

Each memory cell $MC_{ij}$ includes one two-terminal-type MTJ element M. The MTJ element includes three layers of a pinned (fixed) layer MP, an insulation layer MI, and a free layer MF, as illustrated in FIG. 2A.

The pinned layer MP and the free layer MF are formed of a material such as a ferromagnetic material (for example, CoFeB) or a ferromagnetic Heusler alloy (for example, $Co_2FeAl$ or $Co_2MnSi$).

The direction of the magnetization of the pinned layer MP is fixed. Even if a current flows into the layer, the direction of the magnetization of the layer is not changed.

In contrast, the direction of the magnetization of the free layer MF is changeable. When a current flows into the layer, the direction of the magnetization of the layer is changed.

The insulation layer MI is a thin film disposed between the pinned layer MP and the free layer MF. The insulation layer MI includes a material such as, for example, magnesium oxide (MgO), alumina ($Al_2O_3$), or a spinel single crystal ($MgAl_2O_4$).

When the direction of the magnetization of the free layer MF is relatively changed with respect to the direction of the magnetization of the pinned layer MP, the resistance value between one end T1 and the other end T2 of the MTJ element M is changed.

In the storage circuit 11 in FIG. 1, the free layer MF of the memory cell $MG_{ij}$ in the row i and the column j is connected to the bit line $BL_j$ in the same column, and the pinned layer MP of the memory cell $MC_{ij}$ in the row i and the column j is connected to the selection transistor $ST_{ij}$.

Figure 2B:
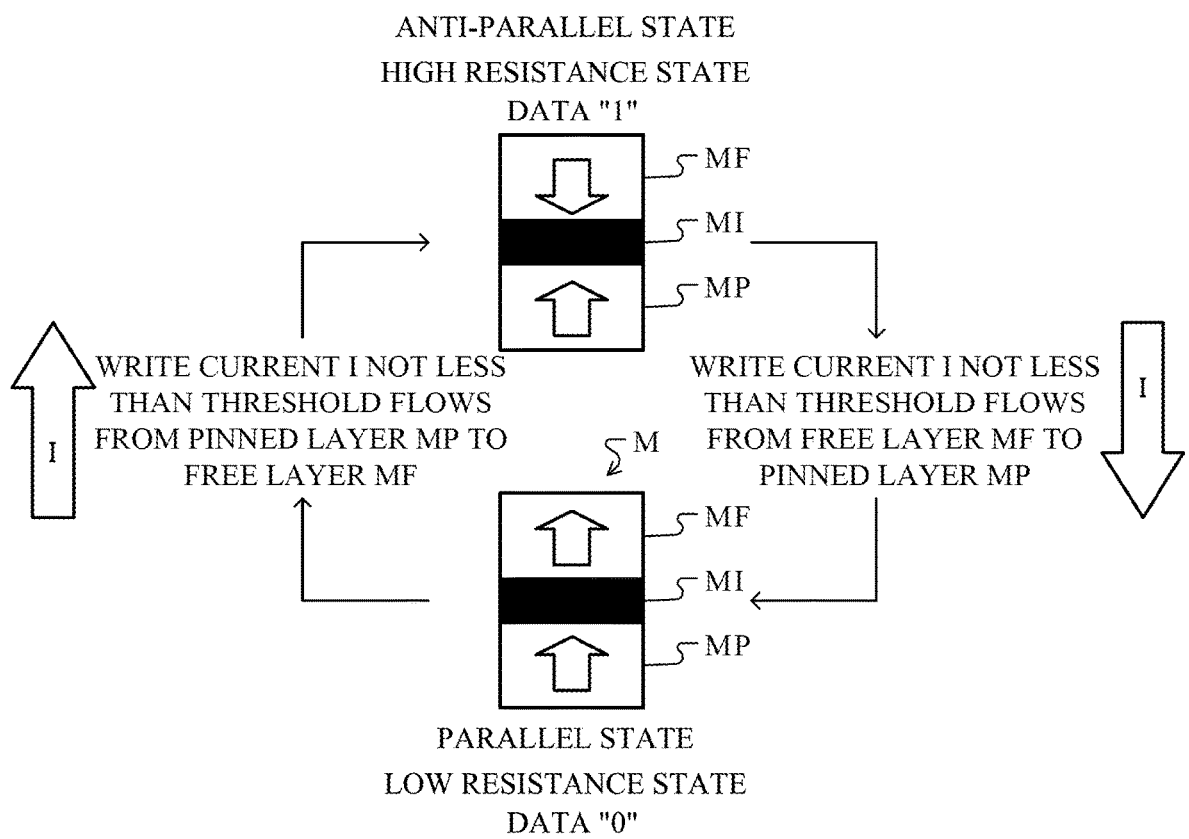
FIG. 2B is a view for explaining a change in the resistivity of the magnetic tunneling junction (MTJ) element.

As illustrated in FIG. 2B, a state in which the directions of the magnetizations of the pinned layer MP and the free layer MF (indicated by hollow arrows) are not the same (anti-parallel: state in which directions are parallel and opposite) is referred to as "anti-parallel state". In contrast, a state in which the directions of the magnetizations of the pinned layer MP and the free layer MF are the same is referred to as "parallel state".

The resistance value $R_{ap}$ of the MTJ element M in the anti-parallel state is greater than the resistance value $R_p$ of the MTJ element M in the parallel state. The resistance state of the MTJ element M in the anti-parallel state is referred to as "high-resistance state", while the resistance state of the MTJ element M in the parallel state is referred to as "low-resistance state".

In the present embodiment, the high-resistance state of the MTJ element M is associated with data "1", and the low-resistance state of the MTJ element M is associated with data "0".

In the present embodiment, it is considered that the MTJ element M is in the high-resistance state in a case in which a write current I having not less than a current threshold value flows from the pinned layer MP to the free layer MF, while the MTJ element M is in the low-resistance state in a case in which a write current I having not less than the current threshold value flows from the free layer MF to the pinned layer MP. Accordingly, for writing data "1" in the memory cell $MC_{ij}$, it is necessary to allow a current to flow from the pinned layer MP to the free layer MF, that is, from the source line $SL_j$ to the bit line $BL_j$ through the selection transistor $ST_{ij}$ and the memory cell $MC_{ij}$. In contrast, for writing data "0" in the memory cell $MC_{ij}$, it is necessary to allow a current from the free layer MF to the pinned layer MP, that is, from the bit line $BL_j$ to the source line $SL_j$ through the memory cell $MC_{ij}$ and the selection transistor $ST_{ij}$.

Figure 3:
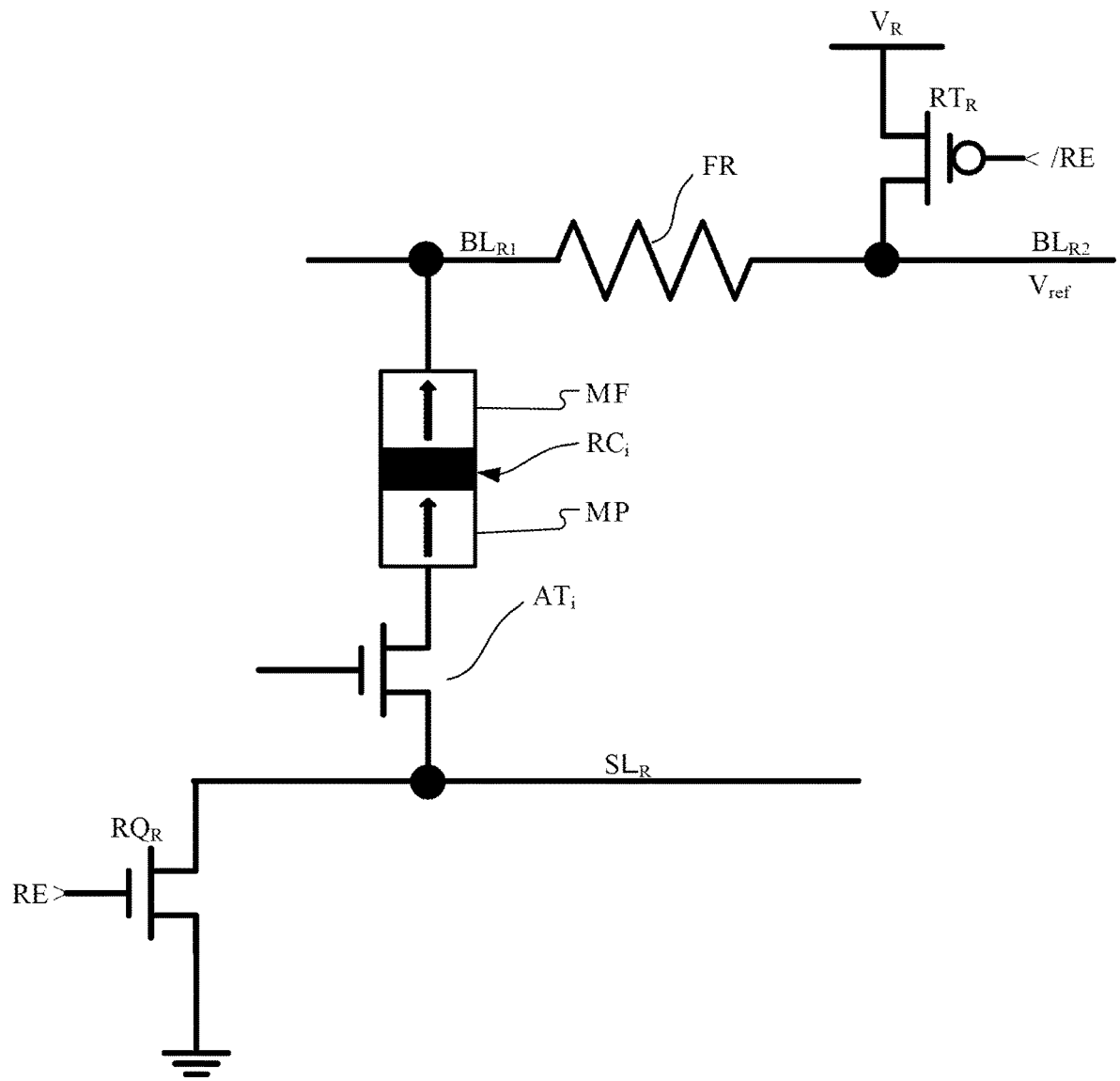
FIG. 3 is a view illustrating the configuration of a reference cell circuit illustrated in FIG. 1.

A reference circuit that generates the reference voltage $V_{ref}$ will now be described with reference to FIG. 3.

The reference circuit includes the reference cell $RC_i$ and the fixed resistance FR common to the reference cell $RC_i$.

The reference cell $RC_i$ has the same structure (material, size, impurity concentration, and the like) as that of the MTJ element M included in the memory cell $MC_{ij}$. However, the reference cell $RC_i$ is set in the low-resistance state (parallel state) in which the directions of the magnetizations of the pinned layer MP and the free layer MF are the same as each other, and stores fixed data. The same configuration does not mean the completely same configuration. It should be understood that a slight structural difference does not have any problem but is included within the same range if both the MTJ elements can achieve the substantially same function and action.

The fixed resistance FR is a high-precision linear resistance. The resistance value $R_{fix}$ of the fixed resistance FR is set to a value that is more than 0 and less than $R_{ap}-R_p$ (=$R_p \times$MR ratio). Moreover, the resistance value $R_{fix}$ of the fixed resistance FR is set to a value that allows a difference between the bit line voltage $V_b$ and reference voltage $V_{ref}$ transmitted to the positive input terminal and negative input terminal of the sense amplifier in the RW circuit 24, respectively, to be not less than the resolving power of the sense amplifier when stored data is read out from a memory cell MC.

The configuration of the RW circuit 24 will now be described with reference to FIG. 4.

As illustrated, the RW circuit $24_j$ in the column j includes a readout circuit $240_j$ and a writing circuit $246_j$.

The readout circuit $240_j$ includes a sense amplifier $241_j$, a correction memory $242_j$, a D-A conversion circuit $243_j$, an adder circuit $244_j$, and a memory controller $245_j$.

One end of the bit line $BL_j$ arranged in the same column as that of the sense amplifier $241_j$ is connected to the positive input terminal of the sense amplifier $241_j$, and the output terminal of the adder circuit $244_j$ is connected to the negative input terminal of the sense amplifier $241_j$.

The sense amplifier $241_j$ amplifies a difference ($V_{bj}-EV_{refj}$) between the bit line voltage $V_{bj}$ and the effective bit line voltage $EV_{refj}$, where $V_{bj}$ is the voltage of the bit line $BL_j$ connected to the positive input terminal, and $EV_{refj}$ is an effective reference voltage supplied from the adder circuit $244_j$ to the negative input terminal, latches the amplified difference ($V_{bj}-EV_{refj}$), and outputs the latched data. In other words, the sense amplifier $241_j$ generates and latches data "1" in the case of ($V_{bj}-EV_{refj}$)>0 or data "0" in the case of ($V_{bj}-EV_{refj}$)<0, and outputs the latched data $DATA_j$ of 1 bit to the bus 25.

The correction memory $242_j$ stores correction data $D_j$ of 3 bits, instructing a correction voltage $V_{amej}$. The correction memory $242_j$ includes rewritable nonvolatile storage elements. The nonvolatile storage elements may be, for example, MTJ elements manufactured with the same manufacturing process as the process of manufacturing the memory cells MC or the like. However, the nonvolatile storage elements and a circuit configuration are optional.

When a writing control signal $WC_j$ and the correction data $D_j$ of 3 bits are supplied from the memory controller $245_j$, the correction memory $242_j$ stores the correction data $D_j$ of 3 bits, and then outputs the stored correction data Dj of 3 bits to the D-A conversion circuit $243_j$.

The D-A (digital-analog) conversion circuit $243_j$ converts, into the analog correction voltage $V_{amej}$, the correction data $D_j$ of 3 bits output by the correction memory $242_j$, and supplies the analog correction voltage $V_{amej}$ to the adder circuit $244_j$. The correspondence relationship between the correction data $D_j$ and the correction voltage $V_{amej}$ is set forth in FIG. 5. In this example, analog correction voltage $V_{amej}$ of -12 mV to +12 mV in seven phases are generated from the correction data of 3 bits.

Figure 4:
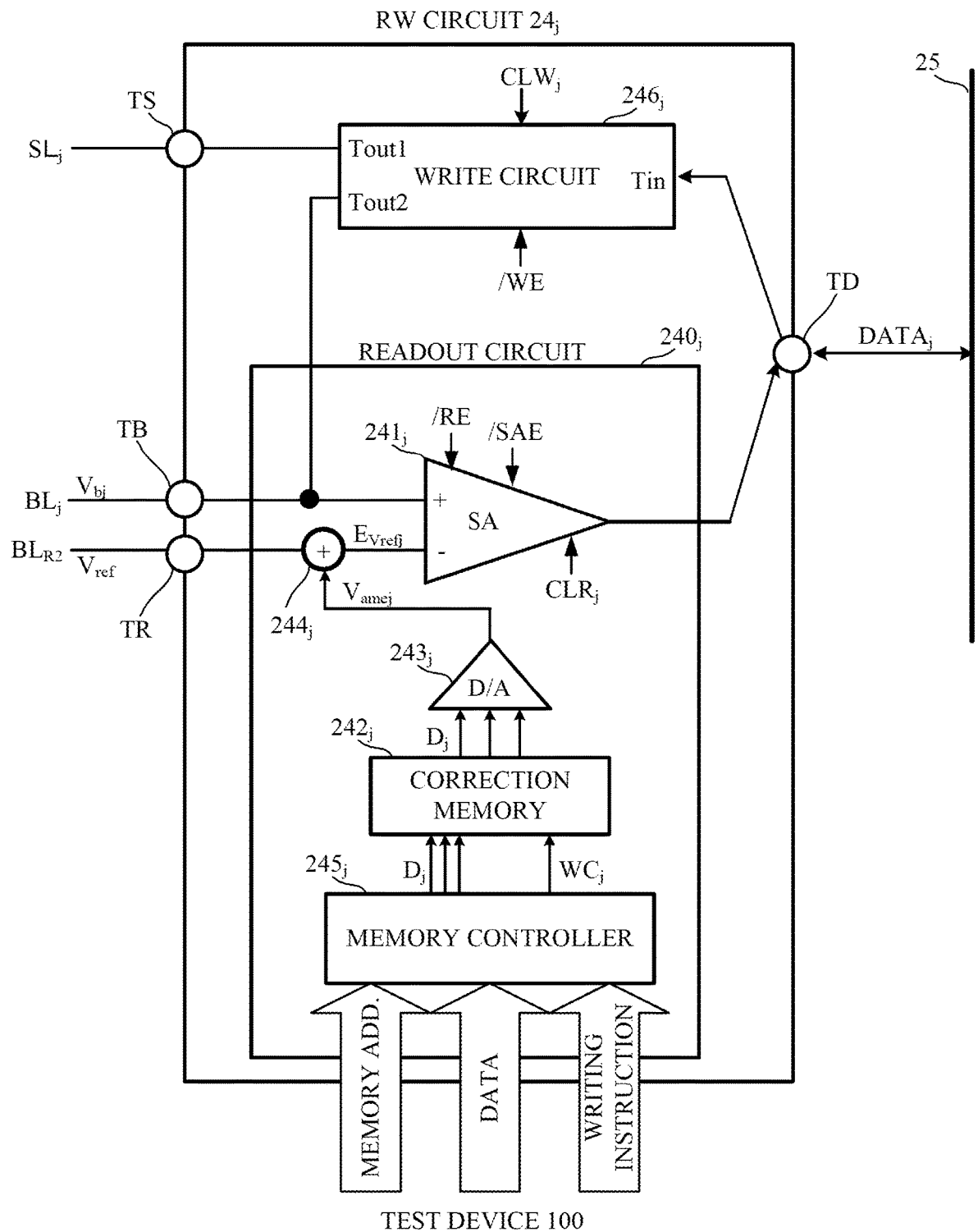
FIG. 4 is a block diagram illustrating the configuration of an RW circuit illustrated in FIG. 1.

As illustrated in FIG. 4, the adder circuit $244_j$ adds the reference voltage $V_{ref}$ applied to one input terminal and the correction voltage $V_{amej}$ applied to the other input terminal, to thereby correct the reference voltage $V_{ref}$ to a value suitable for the column j and output the value. For distinction, output voltage of adder circuit $244_j$=(reference voltage $V_{ref}$+correction voltage $V_{amej}$) is referred to as "effective reference voltage $EV_{refj}$". As described above, the sense amplifier $241_j$ amplifies the difference ($V_{bj}-EV_{refj}$) between the bit line voltage $V_{bj}$ and the effective reference voltage $EV_{refj}$, latches it, and outputs the latched data.

The D-A conversion circuit $243_j$ and the adder circuit $244_j$ cooperatively convert, into the analog correction voltage $V_{amej}$, the correction data $D_j$ of 3 bits output by the correction memory $242_j$, and supply the analog correction voltage $V_{amej}$ to the adder circuit $244_j$. The correspondence relationship between the correction data $D_j$ and the correction voltage $V_{amej}$ is set forth in FIG. 5. In this example, analog correction voltages $V_{amej}$ of -12 mV to +12 mV in seven phases are generated from the correction data of 3 bits.

The memory controller $245_j$ receives a memory address from a higher-level device, data, and a writing instruction signal. When the memory controller $245_j$ is specified by a memory address and a writing control signal is turned on, the memory controller $245_j$ supplies the supplied correction data $D_j$ and the writing control signal $WC_j$ to the correction memory $242_j$ to write the correction data $D_j$ in the correction memory $242_j$.

The correction memory $242_j$ is an example of a correction data storage that stores the correction data $D_j$ for correcting a physical property (physical quantity) for determining stored data for respective sense amplifier. The physical property to be corrected in such a case is the reference voltage $V_{ref}$ corresponding to the magnitude (physical quantity) of a signal input into the sense amplifier $241_j$. Moreover, each of the correction memory $242_j$, the D-A conversion circuit $243_j$, the adder circuit $244_j$, and the memory controller $245_j$ is an example of a correction circuit that corrects the physical property of a reference signal for the sense amplifier circuit. Moreover, the correction memory $242_j$ and the D-A conversion circuit $243_j$ is an example of a correction signal generation circuit that generates a correction signal that generates the correction signal.

In the writing circuit $246_j$, the bit line $BL_j$ is connected to an output terminal Tout1, and the source line $SL_j$ is connected to an output terminal Tout2. Moreover, the write enable signal /WE and the writing column selection signal $CLW_j$ are supplied to the writing circuit $246_j$. Moreover, the writing data $DATA_j$ is supplied from the bus 25 to the data terminal TD of the writing circuit 246.

When the write enable signal /WE is at a low level and the writing column selection signal $CLW_j$ specifies the column to which the writing circuit $246_j$ belongs, the writing circuit $246_j$ controls a voltage between the output terminal Tout1 and the output terminal Tout2 in accordance with the writing data $DATA_j$ supplied from the bus 25, to write data in the memory cell $MC_{ij}$ to be accessed. Specifically, the writing circuit $246_j$ applies a first voltage V1 to the output terminal Tout2 and a second voltage V2 that is lower than the first voltage V1 to the output terminal Tout1, to flow a current through output terminal Tout2→bit line $BL_j$→selected memory cell $MC_{ij}$→selection transistor $ST_{ij}$ that is turned on→source line $SL_j$→output terminal Tout1, and writes data "0" in the memory cell $MC_{ij}$, as illustrated in FIG. 2B, in the case of writing data $DATA_j=0$. In contrast, the writing circuit 246 applies the second voltage V2 to the output terminal Tout2 and the first voltage V1 that is higher than the second voltage V2 to the output terminal Tout1, to flow a current through output terminal Tout1→source line $SL_j$→selection transistor $ST_{ij}$ that is turned on→selected memory cell $MC_{ij}$→bit line $BL_j$→output terminal Tout2, and writes data "1" in the memory cell $MC_{ij}$, in the case of writing data $DATA_j=1$.

The redundant RW circuit $24_R$ has the same configuration and function as those of the RW circuit $24_j$.

The operations of the storage circuit 11 having the configuration described above will now be described.

First, a readout operation will be described with reference to timing charts in FIGS. 6A to 6G.

Here, to facilitate understanding, the readout operation is described by taking, as an example, an operation with a page mode in which data stored in a plurality of memory cells MC in the same row is read out in turn. A row for the readout is regarded as the row 1, and the stored data is read out in order of memory cell $MC_{11}$ in row 1 and column 1→memory cell $MC_{12}$ in row 1 and column 2→ . . . →memory cell $MC_{1n}$ in row 1 and column n.

Moreover, the correction data $D_j$ with a suitable value has been stored in the correction memory $242_j$ included in the readout circuit $240_j$ of each RW circuit 24. The manner of the storage will be described later.

First, to perform the readout, the read/write controller 33 sets the read enable signal /RE at a low level which is an active level, as illustrated in FIG. 6A.

All of the load transistors $RT_1$ to $RT_n$, the redundant load transistor RRT, and the reference load transistor $RT_R$ are turned on in response to setting of the read enable signal /RE at the low level. As a result, all of the bit lines $BL_1$ to $BL_n$, the redundant bit line RBL, and the reference bit line $BL_R$ are charged in the readout voltage $V_R$, as illustrated in FIGS. 6D and 6E.

Moreover, the inverted signal of the read enable signal /RE is supplied to the gates of the grounding transistors $RQ_1$ to $RQ_n$ and the redundant grounding transistor RRQ to turn on the grounding transistors $RQ_1$ to $RQ_n$ and the redundant grounding transistor RRQ. As a result, all of the source lines $SL_1$ to $SL_n$, redundant source line RSL, and reference source line $SL_R$ become a ground level.

Moreover, all the RW circuits $24_1$ to $24_n$ and the redundant RW circuit $24_R$ become a read mode, and the sense amplifiers 241 of the interiors thereof become a standby state.

Subsequently, the row decoder 31 sets the voltage of the word line $WL_1$ at a high level and maintains the voltages of the other word lines WL at a low level to access the memory cell $MC_{1j}$ in the row 1, as illustrated in FIG. 6B. The setting of the voltage of the word line $WL_1$ at the high level allows the selection transistors $ST_{11}$ to $ST_{1n}$, $RST_1$, and $AT_1$ in the row 1 to be turned on.

Then, a current flows through load transistor $RT_j$→bit line $BL_j$→memory cell $MC_{ij}$ in row 1→selection transistor $ST_{1j}$ in row 1→source line $SL_j$→grounding transistor $RQ_j$→grounding, in each column. Therefore, the bit line voltage $V_{bj}$ depending on the resistance value of the memory cell $MC_{1j}$ is generated at the bit line $BL_j$, as illustrated in FIG. 6D. Timing at which the bit line voltage $V_{bj}$ arrives at the RW circuit $24_j$ is substantially equal in all columns. In a similar manner, the bit line voltage $RV_b$ depending on the resistance value of the redundant memory cell $RMC_1$ is generated in the redundant bit line RBL, and arrives at the redundant RW circuit $24_R$.

Moreover, a current flows through reference load transistor $RT_R$→fixed resistance FR→first reference bit line $BL_{R1}$→reference cell $RC_1$ in row 1→selection transistor $AT_1$ in row 1→reference source line $SL_R$→grounding transistor $RQ_R$→grounding, and the reference voltage $V_{ref}$ depending on the sum (combined resistance) of the resistance value of the reference cell $RC_1$ and the resistance value of the fixed resistance FR is generated in the first reference bit line $BLR_1$, as illustrated in FIG. 6E. The reference voltage $V_{ref}$ is constant during the readout operation unless the row is changed, and is applied in parallel with the RW circuit $24_j$ and the redundant RW circuit $24_R$.

The adder circuit $244_j$ adds the correction voltage $V_{amej}$ supplied from the D-A conversion circuit $243_j$, to the reference voltage $V_{ref}$ supplied through the reference bit line terminal TR, to obtain the effective reference voltage $EV_{refj}$, in the interior of each RW circuit $24_j$ and the redundant RW circuit $24_R$. In other words, the adder circuit $244_j$ corrects the reference voltage $V_{ref}$ common to all the sense amplifiers 241 to the effective reference voltage $EV_{refj}$ for the column j by adding the correction voltage $V_{amej}$ corresponding to a correction quantity suitable for the column j. The effective reference voltage $EV_{refj}$ is equivalent to a reference voltage optimal for determining data stored in the plurality of memory cells $MC_{ij}$ connected to the bit line $BL_j$ in the column.

Here, the read/write controller 33 sets the sense amplifier enable signal /SAE at a low level (active), as illustrated in FIG. 6C.

The sense amplifiers $241_j$ in all the columns and redundancy columns differentially amplify the bit line voltage $V_{bj}$ and the effective reference voltage $EV_{refj}$ in parallel in response to the fall of the sense amplifier enable signal /SAE, and latch the amplified data.

The column decoder 32 decodes a column address, and sets the readout column selection signals $CLR_1$ to $CLR_n$ at high levels in turn according to a read/write control signal, as illustrated in FIG. 6F. As a result, the sense amplifier $241_j$ outputs the latched readout data $DATA_j$ onto the bus 25 in turn, as illustrated in FIG. 6G.

Afterward, a similar operation is repeated according to the row and column addresses of a memory cell MC for readout.

Without limitation to the readout of stored data in a page mode, it is also possible to switch row and column addresses in turn, access a memory cell MC, and read out the stored data.

Here, it is assumed that the memory cell $MC_{1k}$ in the row 1 and the column k (k is any of 1 to n) of the memory cell array 21 is defective, and the memory cell $MC_{1k}$ in the row 1 and the column k is replaced with the redundant memory cell $RMC_1$ in advance. In such a case, the row and column addresses of the defective memory cell $MC_{1k}$ are registered as addresses targeted for replacement in the row decoder 31 and the column decoder 32, and the row and column addresses of the redundant memory cell $RMC_1$ are registered as addresses destined for replacement in advance. The way of the registration will be described later.

When the row and column addresses specify the row 1 and the column k, the row decoder 31 sets the word line $WL_1$ in the row 1 at a high level, and the column decoder 32 sets the readout column selection signal $CLR_R$ that selects a redundancy column at a high level while maintaining the readout column selection signal $CLR_k$ at a low level, according to the setting.

As described above, the sense amplifier $241_R$ differentially amplifies the redundant bit line voltage $RV_b$ and the effective reference voltage $EV_{refR}$ in response to the fall of the sense amplifier enable signal /SAE, and latches the amplified data.

Subsequently, when the column address specifies the column k, the column decoder 32 sets the readout column selection signal $CLR_R$ that selects a redundancy column at a high level while maintaining the readout column selection signal $CLR_k$ at a low level. As a result, the sense amplifier $241_R$ in the redundancy column outputs the latched readout data DATA onto the bus 25.

In such a manner, data stored in each memory cell $MC_{ij}$ is determined and read out based on the effective reference voltage $EV_{refj}$. Moreover, the defective memory cell $MC_{ij}$ is replaced with the redundant memory cell $RMC_j$, and stored data is read out from the redundant memory cell $RMC_j$.

Figure 30A:
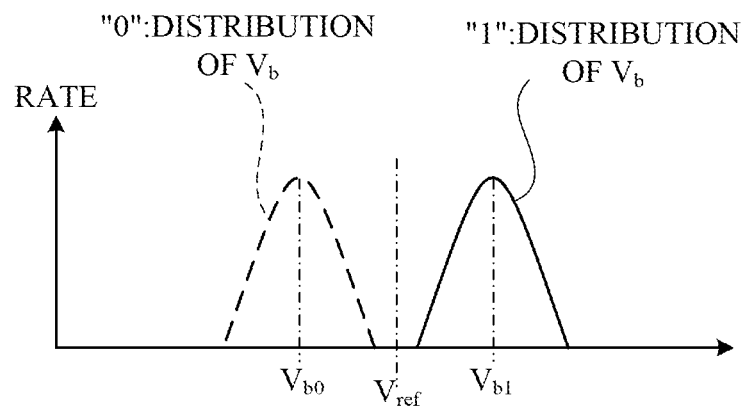
FIGS. 30A and 30B are views for explaining the variations of bit line voltages.
Figure 30B:
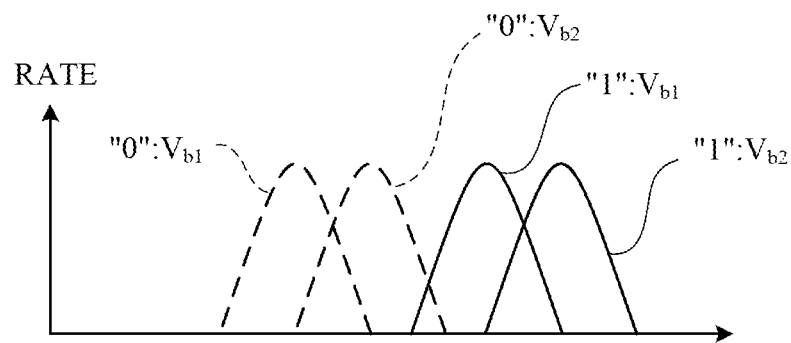

It is difficult to set a reference voltage $V_{ref}$ suitable for determining data stored in memory cells MC in a plurality of columns, as described with reference to FIG. 30B. In accordance with the present embodiment, the reference voltage $V_{ref}$ is common to all the columns, and the suitable effective reference voltage $EV_{ref}$ can be set with limitation to the memory cell MC in each column by setting the correction voltage $V_{ame}$ for each column. Therefore, the effective reference voltage $EV_{ref}$ can be relatively easily set as illustrated in FIG. 30A, and stored data can be precisely determined.

It is also conceivable that a reference voltage generation circuit is provided in each column of a memory cell array to optimize the reference voltage $V_{ref}$ for each column. However, the size of the reference voltage generation circuit is too large in such a method. In the present embodiment, the effective reference voltage $EV_{refj}$ in each column can be relatively easily set in the relatively small size of the circuit.

Moreover, the sense amplifier 241 of the present embodiment also has an offset voltage $\Delta V_{offset}$ as described in the section of Background, and fluctuates or varies between the sense amplifiers 241. If any measures are not taken, stored data may be mistakenly determined due to variations in the offset voltage $\Delta V_{offset}$. In contrast, in the present embodiment, the correction voltage $V_{ame}$ can be set for each sense amplifier 241, to substantially cancel out the offset voltage. Accordingly, it is possible to suppress false determination due to the variations in the offset voltage $\Delta V_{offset}$.

In the present embodiment, the reference cell $RC_i$ in the row i and the memory cell $MC_{ij}$ in the row i are arranged at the same position in the row direction. Therefore, the position of the accessed reference cell $RC_i$ is changed with the position in the row direction of the memory cell $MC_{ij}$ to be accessed. Therefore, the reference voltage $V_{ref}$ is also changed in response to a change in bit line voltage $V_{bj}$ due to a change in the position in the row direction of the memory cell $MC_{ij}$ to be accessed. Accordingly, data from the memory cell $MC_{ij}$ can be precisely read out.

The writing operation of the storage circuit 11 will now be described. Here, it is assumed that data is written in the memory cell $MC_{ij}$ in the row i and the column j.

First, the read/write controller 33 sets the write enable signal /WE at a low level according to a read/write control signal.

The row decoder 31 decodes a row address, and sets, at a high level, the voltage of the word line $WL_i$ in the row i to which the memory cell $MC_{ij}$ to be written belongs.

Moreover, the column decoder 32 decodes a column address, and supplies the writing column selection signal $CLW_j$ to the RW circuit $24_j$ in the column j to which the memory cell $MC_{ij}$ to be written belongs.

Moreover, a higher-level device outputs "1" or "0" as the writing data $DATA_j$ of 1 bit onto the bus 25. The data is transmitted to all the writing circuits 246.

The writing circuit $246_j$ executes a write operation in response to the write enable signal /WE at the low level and the writing column selection signal $CLW_j$ at the high level, and sets the voltage of the output terminal Tout2 at the first voltage V1 at a high level and the voltage of the output terminal Tout1 at the second voltage V2 at a low level in a case in which the writing data $DATA_j$ is "0". As a result, a write current I flows through output terminal Tout2→bit line $BL_j$ memory cell $MC_{ij}$→selection transistor $ST_{ij}$→source line $SL_j$→output terminal Tout1, and data "0" is written in the memory cell $MC_{ij}$. The writing circuit $246_j$ sets the voltage of the output terminal Tout2 at the second voltage V2 at the low level and the voltage of the output terminal Tout1 at the first voltage V1 at the high level in a case in which the writing data is "1". As a result, the write current I flows through output terminal Tout1→source line $SL_j$→selection transistor $ST_{ij}$→memory cell $MC_{ij}$→bit line $BL_j$→output terminal Tout2, and data "1" is written in the memory cell $MC_{ij}$.

Here, it is assumed that the memory cell $MC_{ik}$ in the row i and the column k (k is any of 1 to n) of the memory cell array 21 is defective, and is replaced with the redundant memory cell $RMC_i$ in advance. In such a case, the column decoder 32 is set to set the writing column selection signal CLW$_R$ that selects a redundancy column at a high level while maintaining the writing column selection signal CLW$_k$ at a low level when the defective memory cell MC$_{ik}$ is specified.

When the column address specifies the column k which is a defect column, the column decoder 32 sets the writing column selection signal CLW$_R$ that selects a redundancy column at a high level while maintaining the writing column selection signal CLW$_k$ at the low level, according to the setting. The writing circuit 246R executes the write operation to write the writing data DATA$_j$ in the redundant memory cell RMC$_i$ in response to the write enable signal /WE at the low level and the writing column selection signal CLW$_R$ at the high level.

A method of setting the correction data D$_j$ in the correction memory 242$_j$ in the readout circuit 240$_j$ of each RW circuit 24$_j$ to generate the suitable effective reference voltage EV$_{refj}$ for each column will now be described. This setting process is performed in, for example, an operation of testing a semiconductor chip including the storage circuit 11 after the manufacturing of the storage circuit 11.

First, a testing device that executes the testing operation will be described.

Figure 7:
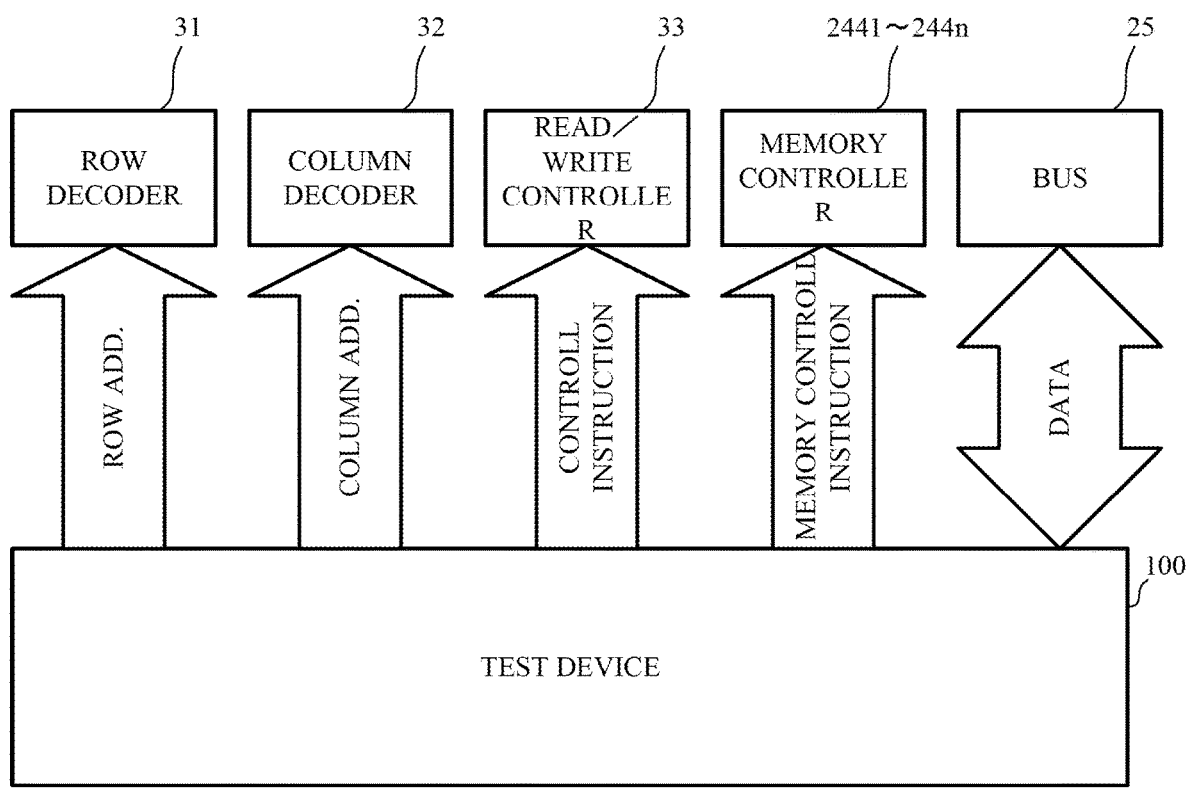
FIG. 7 is a view for explaining a device of testing the storage circuit illustrated in FIG. 1.

As illustrated in FIG. 7, a testing device 100 is connected to the row decoder 31, column decoder 32, and read/write controller 33 of the storage circuit 11, the memory controllers 245$_1$ to 245$_n$, and 245$_R$ of all the RW circuits 24, and the bus 25.

When the testing device 100 is connected, the row decoder 31 outputs, on an as-is basis, a row address supplied from the testing device 100, the column decoder 32 outputs, on an as-is basis, a column address supplied from the testing device 100, and the read/write controller 33 outputs, on an as-is basis, the sense amplifier enable signal /SAE, read enable signal /RE, and write enable signal /WE supplied from testing device 100. When the address of each of the memory controllers 245$_1$ to 245$_n$, and 245$_R$ is specified, each of the memory controllers 245$_1$ to 245$_n$, and 245$_R$ outputs the correction data D$_j$ and writing control signal WC$_j$, supplied from the testing device 100, to the correction memory 242$_j$ on an as-is basis.

Figure 8:
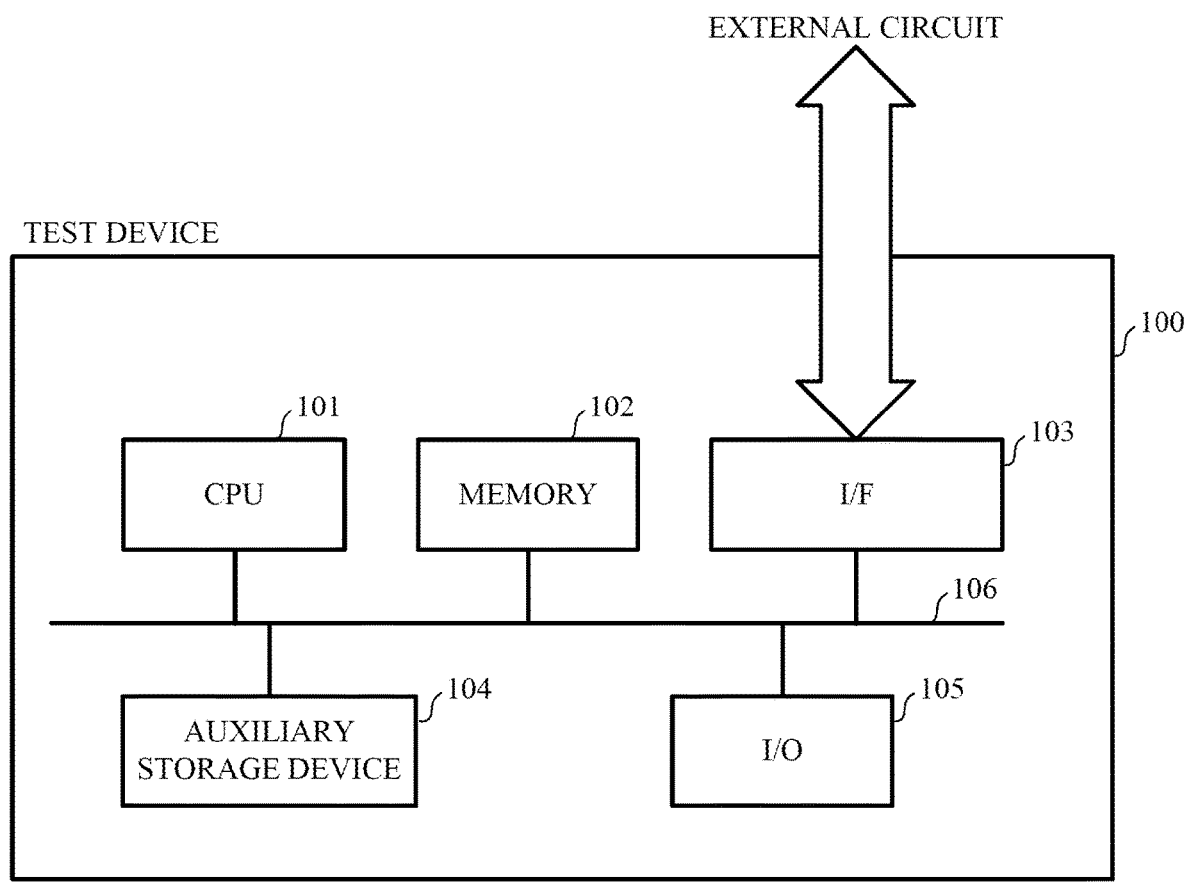
FIG. 8 is a block diagram illustrating the configuration of the testing device illustrated in FIG. 7.

The testing device 100 includes a CPU 101, a memory 102, an interface (I/F) 103, an auxiliary storage device 104, and an input-output device (I/O device) 105, as illustrated in FIG. 8.

The central processing unit (CPU) 101 executes a test program stored in the memory 102, and executes evaluation and testing processes described later.

The memory 102 includes a random access memory (RAM), a read only memory (ROM), and/or the like, stores the test program executed by the CPU 101, and functions as the working memory of the CPU 101.

The interface (I/F) 103 is connected to the row decoder 31, column decoder 32, and read/write controller 33, of the storage circuit 11 to be tested, each of the memory controllers 245$_1$ to 245$_n$, and 245$_R$, and the bus 25, and transmits and receives a signal.

The auxiliary storage device 104 includes a flash memory, a hard disk device, and/or the like, and stores the intermediate data of the test, and a test result, for example, a corrigendum illustrated as an example in FIG. 11A or 11B.

The I/O device 105 includes an input device, a display device, and the like, and functions as a user interface.

The operation in which the testing device 100 tests the storage circuit 11 will now be described.

Figure 9:
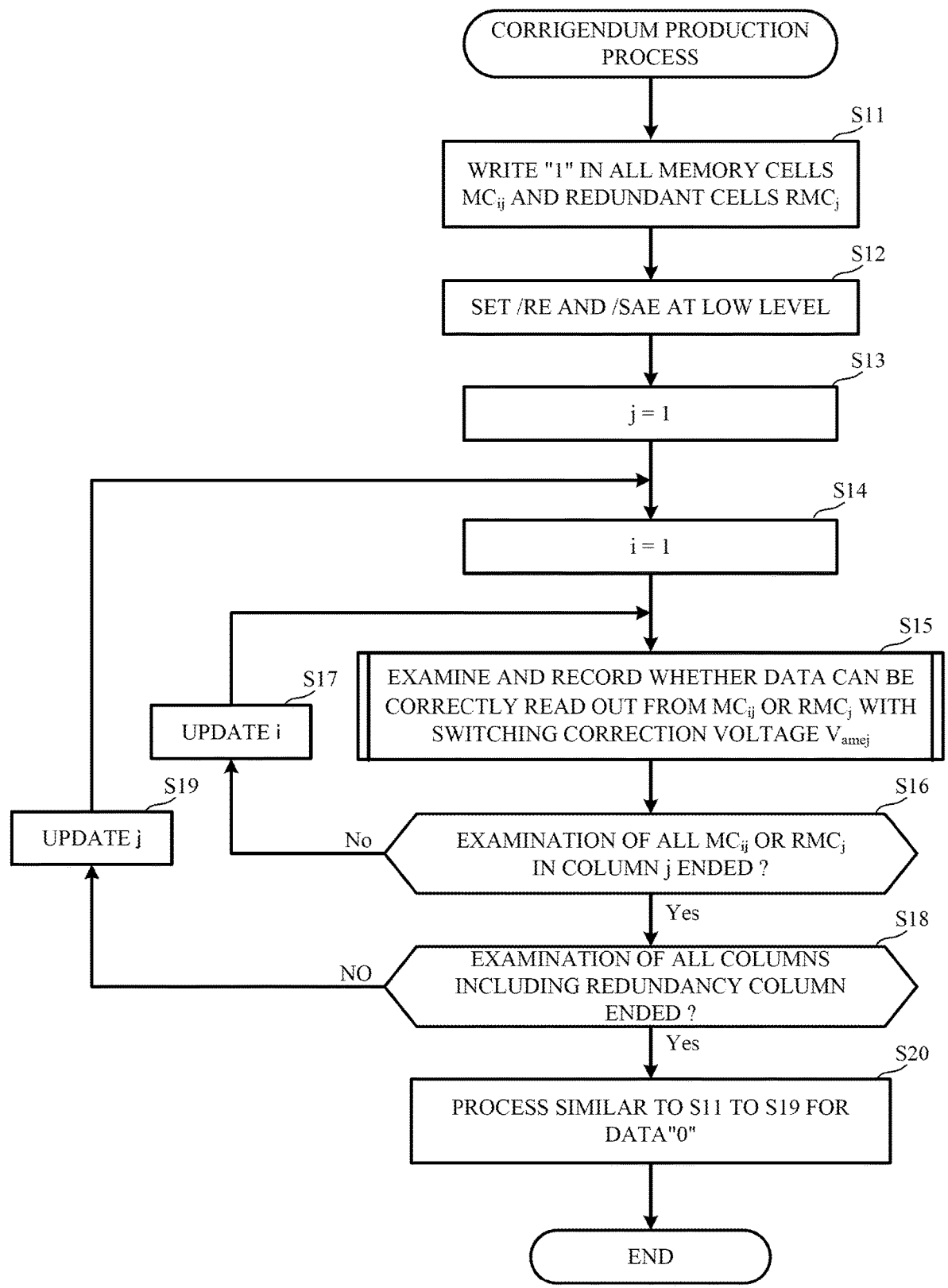
FIG. 9 is a flow chart of a corrigendum generation process executed by the testing device illustrated in FIGS. 7 and 8.
Figure 12:
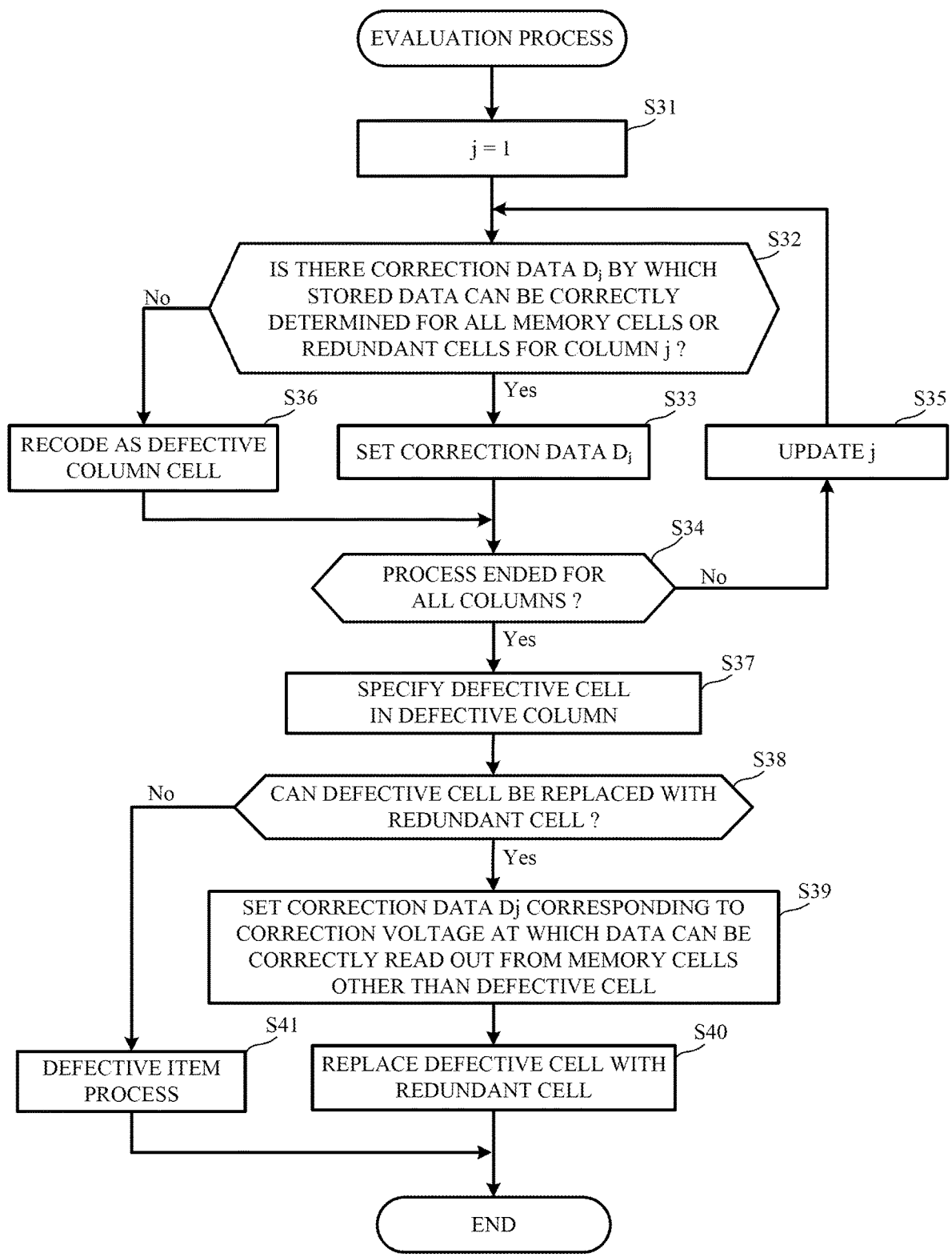
FIG. 12 is a flow chart of an evaluation process executed following the corrigendum production process illustrated in FIG. 9.

The testing operation generally includes a corrigendum generation process illustrated in FIG. 9, and an evaluation process illustrated in FIG. 12.

The corrigendum generation process is a process of determining whether or not data stored in the memory cell MC$_{ij}$ and the redundant memory cell RMC$_i$ can be correctly read out for a plurality of correction voltages, and of generating a corrigendum indicating the results thereof. The evaluation process is a process in which suitable correction data D$_j$ is set in the correction memory 242$_j$ according to each column on the basis of the generated corrigendum. The processes will be described in turn below.

First, the I/F 103 of the testing device 100 is connected to the storage circuit 11, as illustrated in FIG. 7.

A person responsible for the test operates the I/O device 105 to instruct the corrigendum generation process to be started. In response to the instruction, the CPU 101 starts the execution of the test program stored in the memory 102, and starts the corrigendum production process illustrated in the flow chart in FIG. 9.

First, the CPU 101 controls the read/write controller 33, the column decoder 32, and the row decoder 31 to write bit data "1" in all the memory cells MC$_{ij}$ and all the redundant memory cells RMC$_i$ in turn (step S11). Collective writing by magnetic writing may be used as the writing. It is assumed that data "0" is stored in the reference cells RC$_i$ in advance.

Then, the CPU 101 sets the read enable signal /RE at a low level which is an active level and the sense amplifier enable signal /SAE at a low level which is an active level (step S12).

Then, the CPU 101 sets a column pointer j=1 (step S13) and a row pointer i=1 (step S14).

Then, the CPU 101 determines whether or not the data "1" stored in the selected memory cell MC$_{ij}$ can be correctly read out for each of correction voltages V$_{amej}$ in seven phases, that is, a plurality of correction quantities (step S15). The execution of step S15 allows the CPU 101 to function as a determiner.

Figure 10:
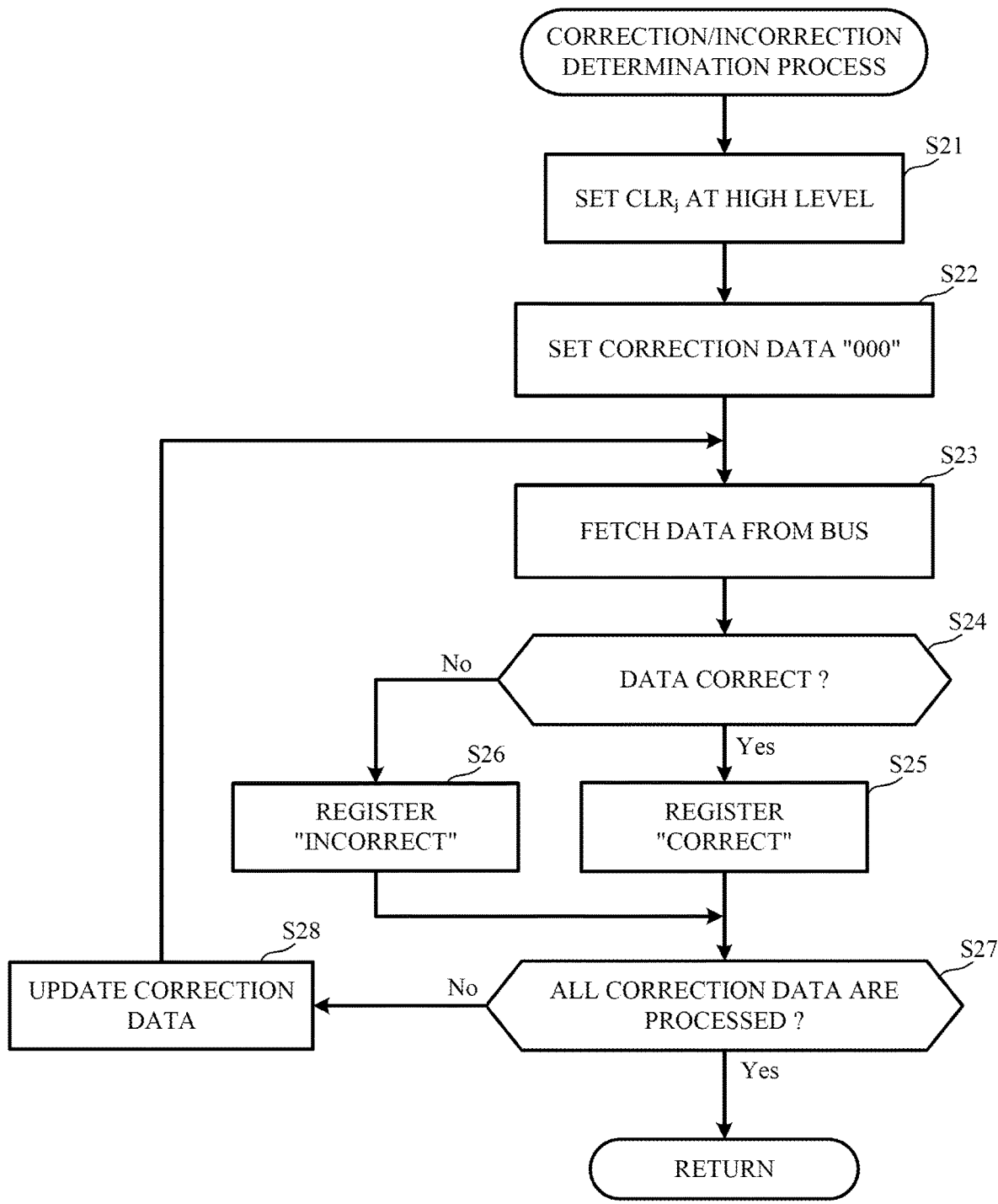
FIG. 10 is a flow chart of a correction/incorrection determination process in the corrigendum generation process illustrated in FIG. 9.

Specific explanation will be given with reference to FIG. 10. First, the CPU 101 sets the readout column selection signal CLR$_j$ at a high level (step S21). As a result, the sense amplifier 241$_j$ in the column j becomes in the state of being capable of outputting data.

The CPU 101 writes correction data D$_j$ "000" in the correction memory 242 through the selected memory controller 245$_j$ in the column j (step S22). As a result, the D-A conversion circuit 243$_j$ outputs a correction voltage V$_{amej}$ of 0 mV. The adder circuit 244$_j$ sets the effective reference voltage EV$_{refj}$ at (V$_{ref}$+0 mV). The sense amplifier 241$_j$ compares the bit line voltage V$_{bj}$ of the bit line BL$_j$ in the column j with the effective reference voltage EV$_{refj}$, and determines and latches read-out data. The sense amplifier 241$_j$ outputs the latched data DATA$_j$ to the bus 25.

The CPU 101 sets correction data D$_j$, stands by for a certain period of time until the output data is stable, subsequently fetches the data output from the bus 25 through the I/F 103 (step S23), and determines whether or not the read-out data is "1" (step S24). When the read-out data is "1" and correct (step S24: Yes), the CPU 101 registers "correct" in the corrigendum (step S25). When the read-out data is "0" and incorrect (step S24: No), the CPU 101 registers "incorrect" in the corrigendum (step S26).

Then, the CPU 101 determines whether or not the process for all of the seven items of the correction data D$_j$ is ended (step S27). When the process is not ended (step S27: No), one unprocessed item of the correction data D$_j$, for example, "001" is selected and set in the correction memory 242$_j$ to update the correction data D$_j$ (step S28). Then, the control returns to step S23, and a similar process is repeated.

When the process is ended for the seven items of the correction data $D_j$, a corrigendum indicating a correction voltage $V_{amej}$ at which it is possible to correctly read out the stored data "1" and a correction voltage $V_{amej}$ at which it is impossible to correctly read out the stored data "1" is formed for the selected memory cell $MC_{ij}$.

Then, in step S27, it is determined that all the items of the correction data $D_j$ have been processed (step S27: Yes), and the control goes to step S16 in FIG. 9.

In step S16, the CPU 101 determines whether or not the process of generating the corrigendum is ended for all the currently selected memory cells $MC_{ij}$ or redundant memory cells $RMC_i$ in the column j.

When the process is not ended (step S16: No), a row pointer i is updated (+1) (step S17), the control is allowed to return to step S15, a process similar to the process described above is executed for the next memory cell $MC_{ij}$.

In such a manner, a corrigendum is generated in turn for each selected memory cell $MC_{ij}$ in the column j in the auxiliary storage device 104, as illustrated in FIG. 11A.

When the corrigendum is generated for all the selected memory cells $MC_{ij}$ or redundant memory cells $RMC_i$ in the column j or the redundancy column, it is determined that the corrigendum in the column j is completed in step S16 (step S16: Yes), and the process goes to step S18.

In step S18, it is determined whether or not the process is ended for all the columns of the memory cells $MC_{ij}$ and the redundant memory cells $RMC_i$.

When an unprocessed column remains (step S18: No), the column pointer j is updated (step S19), the process returns to step S14, and the operation described above is repeated. It is assumed that the CPU 101 basically sets the column pointer j=j+1 in step S19. However, when the updated column pointer is (m+1), j=the column 1 of the redundant memory cell array 22 is set.

The corrigendum indicating the correction voltages $V_{amej}$ at which it is possible or impossible to correctly read out stored data "1" is completed for all the memory cells $MC_{ij}$ and the redundant memory cells $RMC_i$ in the auxiliary storage device 104, as illustrated in FIG. 11A, by repeating the process described above.

Then, in step S18, it is determined that the process is ended for all the columns of the memory cell array 21 and the redundant memory cell array 22 (step S18: Yes), and the control goes to step S20.

In step S20, bit data "0" is written in all the memory cells $MC_{ij}$ and the redundant memory cells $RMC_i$, and operations similar to those in steps S12 to S19 are subsequently repeated, whereby a corrigendum for the readout data "0" is generated as illustrated in FIG. 11B.

The corrigenda as illustrated in FIGS. 11A and 11B are completed.

Subsequently, the CPU 101 starts the evaluation process of setting the correction data $D_j$, illustrated in FIG. 12.

First, the CPU 101 sets the column pointer j at 1 (step S31).

Then, it is determined whether correction data $D_j$ in which both data "1" and "0" can be correctly read is present for all the memory cells $MC_{1j}$ to $MC_{mj}$ in the column j with reference to the corrigenda illustrated in FIGS. 11A and 11B (step S32).

For example, for the memory cell $MC_{11}$, data "1" can be correctly read out at correction voltage $V_{ame1}$=+12 my to −8 my, and data "0" can be correctly read out at correction voltage $V_{ame1}$=+4 mV to −12 mV, in examination with reference to the corrigenda in FIGS. 11A and 11B. Accordingly, it is determined that a correction voltage $V_{ame1}$ in a range of +4 mV to −8 mV is suitable for the memory cell $MC_{11}$. Likewise, it is determined that a correction voltage $V_{ame1}$ in a range of 0 mV or −4 mV is suitable for the memory cell $MC_{21}$, and it is determined that a correction voltage $V_{ame1}$ in a range of 0 mV to −8 mV is suitable for the memory cell $MC_{31}$.

In consideration of only the memory cells $MC_{11}$, $MC_{21}$, and $MC_{31}$ in the corrigenda in FIGS. 11A and 11B, a correction voltage at which data "1" and "0" can be correctly read out is 0 mV or −4 mV, and "present" is determined (step S32: Yes).

When it is determined that a correction quantity, that is, a correction voltage $V_{amej}$, at which stored data can be appropriately determined, is present for all the memory cells $MC_{ij}$ in the column j, the CPU 101 sets correction data $D_j$ corresponding to the correction voltage $V_{amej}$ in the correction memory $242_j$ (step S33). In other words, the CPU 101 functions as a setter, and sets a suitable correction quantity in the correction memory according to each column.

In consideration of only the memory cells $MC_{11}$, $MC_{21}$, and $MC_{31}$ in the corrigenda in FIGS. 11A and 11B, one item of the correction data $D_j$ "000" and "101" corresponding to correction voltages 0 mV and −4 mV at which data can be correctly determined is set in the correction memory $242_j$.

When an odd number of correction voltages $V_{amej}$ at which stored data can be appropriately determined are specified for all the memory cells $MC_{ij}$ in the column j, correction data $D_j$ in which the median correction voltage thereof can be obtained is set. When an even number of correction voltages $V_{amej}$ at which stored data can be correctly determined are specified for all the memory cells $MC_{ij}$ in the column j, one of the two medians thereof is set based on an error rate and/or the like so that the maximum operation margin is achieved.

In consideration of only the memory cells $MC_{11}$, $MC_{21}$, and $MC_{31}$ in the corrigenda in FIGS. 11A and 11B, the number of incorrect determinations is two (the memory cells $MC_{21}$ and $MC_{31}$ in a case in which readout data is "0") in the case of a correction voltage of 4 mV adjacent to a correction voltage of 0 mV. In contrast, the number of an incorrect determination is one (the memory cell $MC_{21}$ in a case in which readout data is "1") in the case of a correction voltage of −8 mV adjacent to a correction voltage of −4 mV. Accordingly, it is considered that an operation margin is greater in the case of setting a correction voltage at −4 mV than the case of setting a correction voltage at 0 mV. Accordingly, the correction data $D_1$ "101" corresponding to a correction voltage of −4 mV is set in the correction memory $242_j$ in consideration of this example.

Then, the CPU 101 determines whether or not the process is ended for all the columns of the memory cell array 21 and the redundant memory cell array 22 (step S34).

When an unprocessed column remains (step S34: No), the column pointer j is updated (step S35), the process returns to step S32, and the operation described above is repeated. In step S35, the CPU 101 basically sets the column pointer j=j+1. However, when the updated column pointer is (m+1), j=column 1 of redundant memory cell array 22 is set.

In such a manner, the CPU 101 sets the correction data $D_j$ instructing a correction quantity, that is, the correction voltage $V_{amej}$ in the correction memory $242_j$ for the normal column j.

When it is determined that any correction voltage $V_{amej}$ at which stored data can be appropriately determined is not present for all the memory cells $MC_{ij}$ or the redundant memory cells $RMC_i$ in the column j in step S32 (step S32:

No), a column number is recorded as a defective column (step S36), and the process goes to step S34.

When it is determined that the process is ended for all the columns in step S34 (step S34: Yes), the CPU 101 specifies a defective memory cell included in the defective column recorded in step S36 (step S37). Specifically, a memory cell MC in which it is impossible to correctly read out stored data at any correction voltage $V_{amej}$ is regarded as the defective memory cell.

Then, it is determined whether or not the specified defective memory cell can be replaced with a redundant memory cell (step S38). For example, it is determined that it is possible to replace the defective memory cell when a redundant memory cell in the same row as that of the defective memory cell has not been used, and it is determined that it is impossible to replace the defective memory cell when a redundant memory cell in the same row as that of the defective memory cell has been already used or is a defective cell.

Then, when it is determined it is possible to replace the specified defective memory cell with the redundant memory cell (step S38: Yes), a correction voltage $V_{amej}$ at which data can be correctly read out from a memory cell MC other than the defective memory cell MC in the defective column is specified, correction data $D_j$ corresponding to the specified correction voltage $V_{amej}$ is set in the correction memory 242 in the defective column (step S39).

Then, when the defective memory cell MC is addressed, the row decoder 31 and column decoder 32 are set so that a redundant memory cell RMC in the same row in the redundant memory cells is selected (step S40). In other words, the CPU 101 functions as a setter, and sets the defective memory cell MC to be replaced with the redundant memory cell RMC.

For example, it is assumed that the memory cell in the row 1 and the column k of the memory cell array 21 is incapable of correctly reading out stored data at any correction voltage $V_{amek}$. In addition, it is assumed that only the memory cell $MC_{1k}$ in the row 1 in the memory cells $MC_{ik}$ in the column k is a defective memory cell. Moreover, it is assumed that the redundant memory cell $RMC_1$ in the row 1 is normal and not used.

In such a case, the memory cell $MC_{1k}$ in the row 1 and the column k is specified as a defective cell (step S37). Then, as the redundant memory cell $RMC_1$ in the row 1 of the redundant memory cell column is not used, it is determined to be able to be replaced (step S38: Yes). Subsequently, in such a case, the CPU 101 sets the correction data $D_k$ in the correction memory $242_k$ in the column k so that data stored in the memory cells $MC_{2k}$ to $MC_{mk}$ in the rows 2 to m and the column k can be correctly read out (step S39). When an address specifying the row 1 and the column k is supplied to the row decoder 31 and the column decoder 32, the row decoder 31 carries out the setting for setting the word line $WL_1$ at a high level, and setting, at a high level, the readout column selection signal $CLR_R$ or the writing column selection signal $CLW_R$ specifying the row 1 in the column of the redundant memory cell RMC.

In contrast, when it is impossible to replace the defect memory cell MC with the redundant memory cell RMC in step S38 (step S38: No), the storage circuit 11 is regarded as a defective item (step S41). In such a case, for example, the I/O device 105 is informed accordingly.

When there is a plurality of defective memory cells, steps S35 to S41 are executed for each memory cell.

As described above, the testing process is ended.

As described above, each sense amplifier $241_j$ determines the level of the bit line voltage $V_{bj}$ on the basis of the effective reference voltage $EV_{refj}$ peculiar to each sense amplifier $241_j$ in accordance with the storage circuit 11 according to the present embodiment. Accordingly, data can be more precisely determined. Moreover, the effective reference voltage $EV_{refj}$ can be easily generated based on the reference voltage $V_{ref}$ common to all the sense amplifiers 241 and the correction voltage $V_{amej}$ peculiar to each sense amplifier $241_j$. Moreover, the defect of the storage circuit 11 in which it is impossible to precisely determine data can be suppressed, resulting in enabling the yield rate of the circuit to be increased.

The embodiments described above are examples of the present disclosure, and the present disclosure is not limited thereto.

Figure 13A:
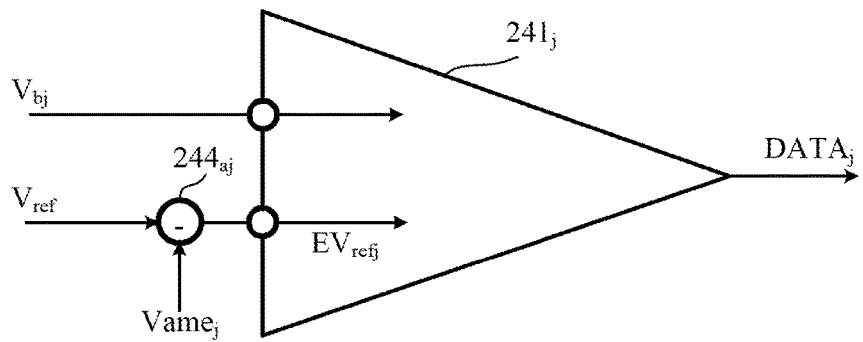
FIG. 13A is a view illustrating an example of a configuration in which an effective reference voltage is generated by subtracting a correction voltage from a reference voltage by a subtraction circuit.

For example, the example in which the adder circuit $244_j$ adds the correction voltage $V_{amej}$ to the reference voltage $V_{ref}$ to generate the effective reference voltage $EV_{refj}$ is described in FIG. 4. This disclosure is not limited thereto. For example, a subtraction circuit $244_{aj}$ that subtracts the correction voltage $V_{amej}$ from the reference voltage $V_{ref}$ may be arranged as illustrated in FIG. 13A. In the present disclosure, the subtraction circuit is one aspect of an adder circuit in view of addition of a negative value, and is included in the adder circuit. When the suitable effective reference voltage $EV_{refj}$ can be obtained by adding the correction voltage $+V_{amej}$ to the reference voltage $V_{ref}$ by the adder circuit $244_j$, the suitable effective reference voltage $EV_{refj}$ can be obtained by subtracting the correction voltage $-V_{amej}$ from the reference voltage $V_{ref}$ by the subtraction circuit $244_{aj}$.

Figure 13B:
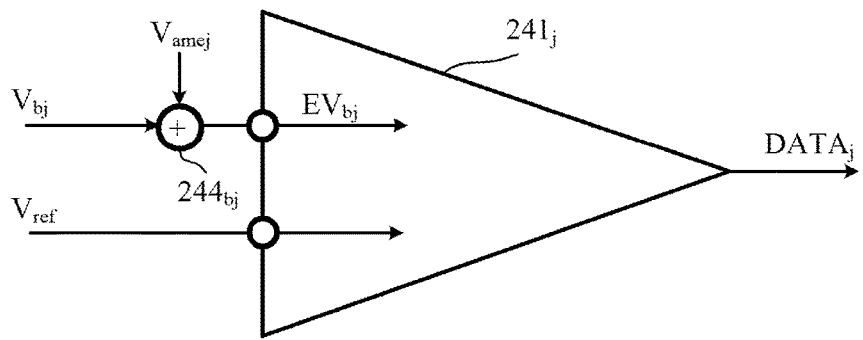
FIG. 13B is a view illustrating an example of a configuration in which an effective bit line voltage is generated by adding a correction voltage to a bit line voltage by an adder circuit.

In the embodiment, a physical property to be corrected is regarded as the reference voltage $V_{ref}$, and the correction (customization) is performed according to each sense amplifier $241_j$. Without limitation thereto, it is acceptable that a physical property to be corrected is regarded as the bit line voltage $V_{bj}$, and the bit line voltage $V_{bj}$ is customized for each sense amplifier $241_j$, as illustrated in FIG. 13B. For example, it is acceptable that the correction voltage $V_{amej}$ is added to the bit line voltage $V_{bj}$ by an adder circuit $244_{bj}$, and the effective bit line voltage $EV_{bj}$ is generated and supplied to the sense amplifier $241_j$. The sense amplifier $241_j$ compares the reference voltage $V_{ref}$ with the effective bit line voltage $EV_{bj}$ to output the data $DATA_j$. When the suitable effective reference voltage $EV_{refj}$ can be obtained by adding the correction voltage $+V_{amej}$ to the reference voltage $V_{ref}$ by the adder circuit $244_j$, the suitable effective bit line voltage $EV_{bj}$ can be obtained by adding the correction voltage $-V_{amej}$ to the bit line voltage $V_{bj}$ by the adder circuit $244_{bj}$. Moreover, the adder circuit $244_{bj}$ can also be replaced with a subtraction circuit. As described above, the subtraction circuit is one aspect of an adder circuit in the present disclosure.

Figure 13C:
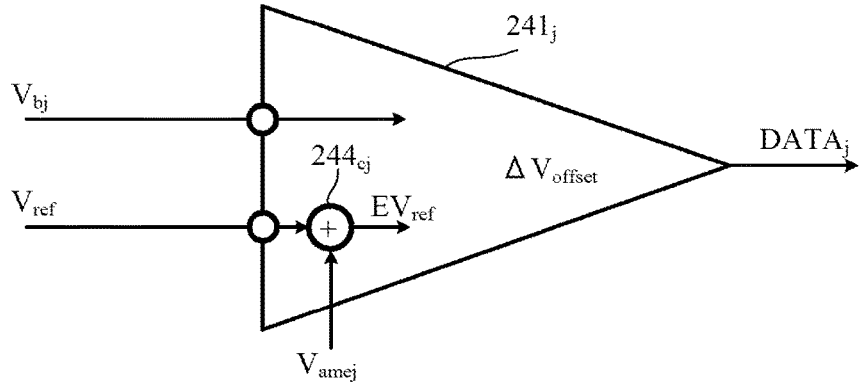
FIGS. 13C and 13D are views illustrating examples of configurations in which an adder circuit is arranged in a sense amplifier to adjust an offset voltage.
Figure 13D:
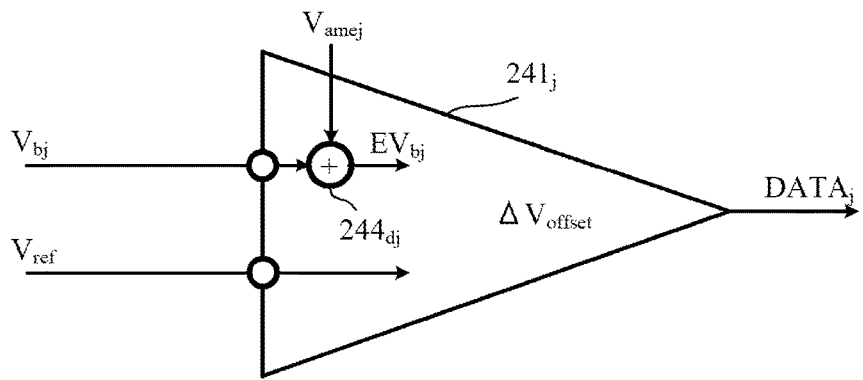

As illustrated in FIGS. 13C and 13D, an adder circuit $244_{cj}$ (including a subtraction circuit) or an adder circuit $244_{dj}$ (including a subtraction circuit) may be incorporated into the interior of the sense amplifier $241_j$. This is also equivalent to adjustment of the offset voltage $\Delta V_{offset}$ of the sense amplifier $241_j$ as a physical property to be corrected.

As illustrated in FIGS. 14A to 14D, amplifier circuits $247_{fj}$ to $247_{ij}$ may be arranged instead of the adder circuit (including the subtraction circuit). The amplifier circuits $247_{ej}$ and $247_{hj}$ amplify the reference voltage $V_{ref}$, which is a physical property to be corrected, at an amplification factor according to the correction signal $V_{amej}$, and output the effective reference voltage $EV_{refj}$. The amplifier circuits $247_{gj}$ and $247_{ij}$ amplify the bit line voltage $V_{bj}$, which is a physical property to be corrected, at an amplification factor according to the correction signal $V_{amej}$, and output the effective bit line voltage $EV_{bj}$.

Figure 15A:
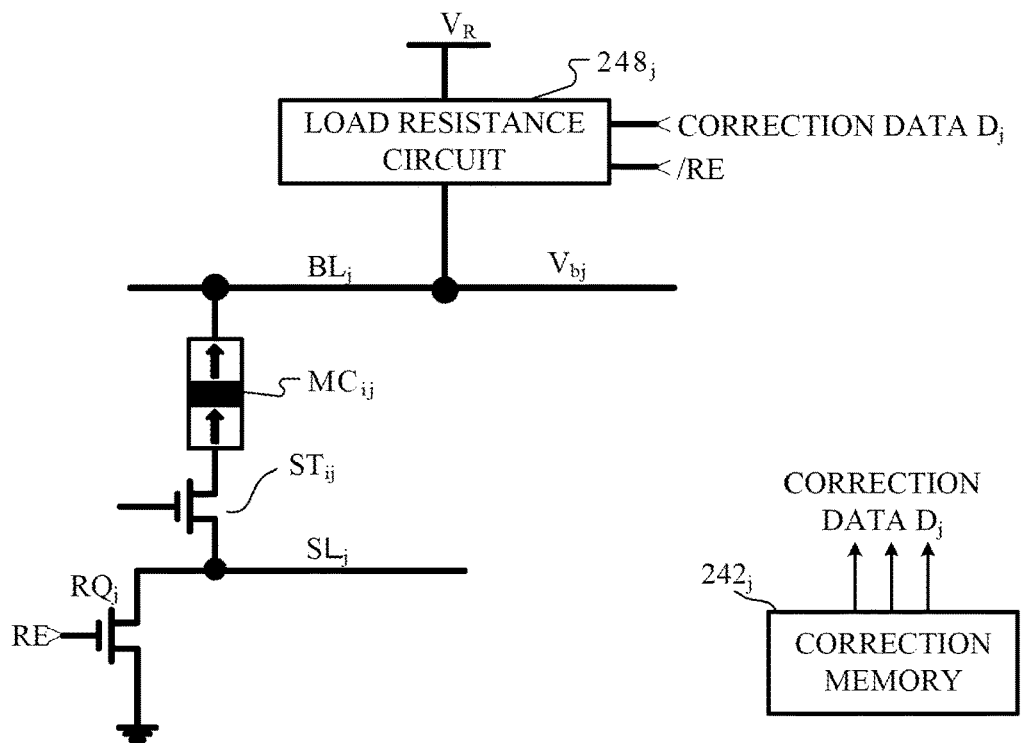
FIG. 15A is a circuit diagram illustrating an example of a configuration in which a bit line voltage is adjusted by adjusting the resistance value of a load resistance.

This disclosure is not limited to these techniques. If the reference voltage $V_{ref}$ or the bit line voltage $V_{bj}$ can be adjusted to a suitable voltage level according to the data stored in the correction memory $242_j$ in the column j, that is, if a potential difference between the two input voltages of the sense amplifier $241_j$ can be adjusted, the configuration thereof is optional. For example, the bit line voltage $V_{bj}$ of the bit line $BL_j$ can also be adjusted to a suitable voltage by controlling the resistance value of the load resistance (transistor $RT_j$) arranged in each column of the memory cell array 21 according to the correction data $D_j$ stored in the correction memory $242_j$ in the column j. In such a case, for example, a load resistance circuit $248_j$ is arranged instead of the load transistor $RT_j$ in the column j, as illustrated in FIG. 15A. The load resistance circuit $248_j$ connects the bit line $K_j$ in the column j and a terminal, to which the readout voltage $V_R$ is applied, to each other.

The load resistance circuit $248_j$ connects the bit line $K_j$ in the column j and the terminal, to which the readout voltage $V_R$ is applied, to each other when the read enable signal /RE is at a low level, and changes the resistance value according to the correction data $D_j$ stored in the correction memory $242_j$.

The bit line voltage $V_{bj}$ is $V_R$-(combined resistance value of resistance value of memory cell $MC_{ij}$, ON resistance value of selection transistor $ST_{ij}$, and ON resistance value of grounding transistor $RQ_j$)/(combined resistance of resistance value of load resistance circuit $248_j$, resistance value of memory cell $MC_{ij}$, ON resistance value of selection transistor $ST_{ij}$, and ON resistance value of grounding transistor $RQ_j$). Accordingly, the bit line voltage $V_{bj}$ can be decreased by increasing the resistance value of the load resistance circuit $248_j$, and the bit line voltage $V_{bj}$ can be increased by decreasing the resistance value of the load resistance circuit $248_j$.

Figure 15B:
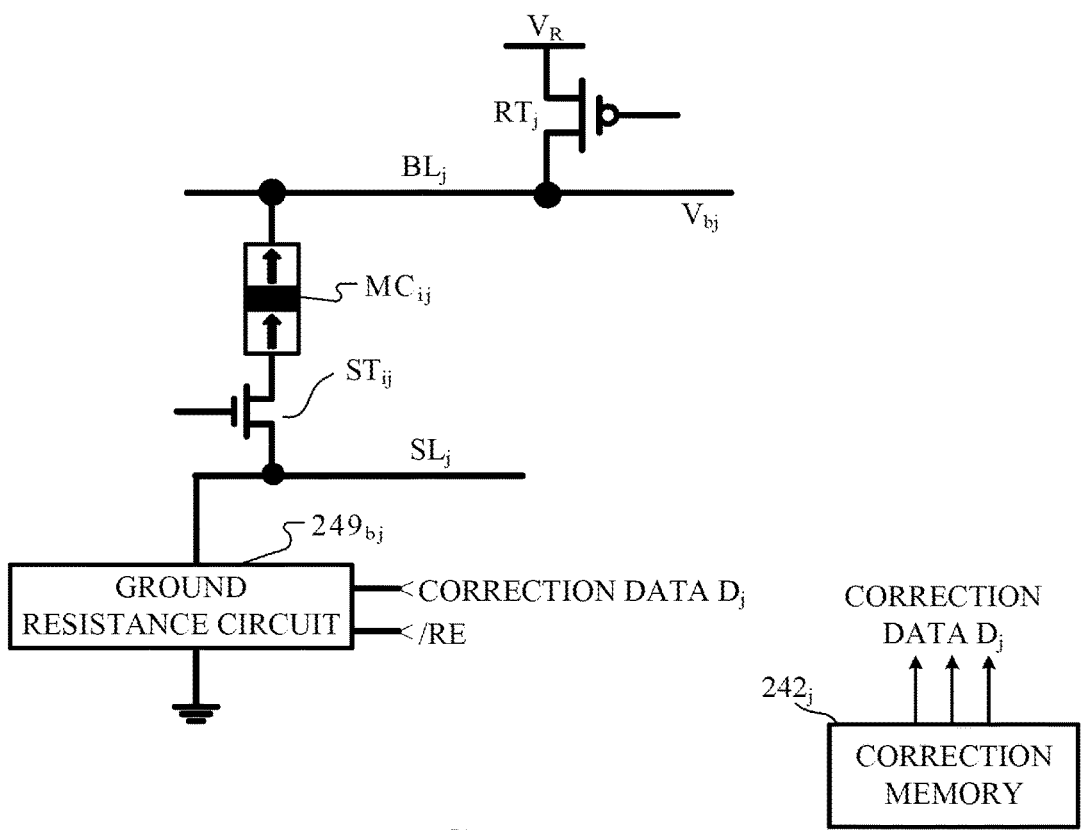
FIG. 15B is a circuit diagram illustrating an example of a configuration in which a bit line voltage is adjusted by adjusting the resistance value of a ground resistance circuit.

A similar function can also be achieved by arranging a ground resistance circuit $249_j$ instead of the grounding transistor $RQ_j$ in the column j as illustrated in FIG. 15B, and by changing the resistance value thereof according to the correction data $D_j$ output by the correction memory $242_j$.

The load resistance circuit $248_j$ and the ground resistance circuit $249_j$ may have configurations in which the resistance values thereof are changed according to the correction voltage $V_{amej}$.

In the configurations illustrated in FIGS. 15A and 15B, the readout voltage $V_R$ is an example of the first reference voltage, the ground voltage is an example of the second reference voltage, and the load resistance circuit $248_j$ and the ground resistance circuit $249_j$ are examples of dividing resistance changers that correct the physical property of the sense amplifier $241_j$ by changing the resistance values thereof, that is, by changing the dividing resistances, in accordance the correction data $D_j$.

In the embodiments described above, an example is described in which the correction voltage $V_{ame}$ is set in seven phases in total, of which the median is 0 V, with ±3 phases. However, the number of correction voltages $V_{ame}$ is optional.

It is also acceptable that the reference voltage $V_{ref}$ is set at a lower voltage in advance, and the correction voltage $V_{ame}$ is set only at a positive voltage. Likewise, it is also acceptable that the reference voltage $V_{ref}$ is set at a higher voltage in advance, and the correction voltage $V_{ame}$ is set only at a negative voltage.

In the embodiments described above, data stored of all the memory cells MC in the selected row is read out in parallel, and determined in the readout operation. This disclosure is not limited to such a form. A configuration is also acceptable in which only a memory cell specified by row and column addresses is read-accessed to read out a bit line voltage $V_b$ and to determine stored data.

In the embodiments described above, an explanation is given in which the testing operation is executed after the completion of the storage circuit 11. However, the present disclosure is not limited thereto. For example, the testing operation may be executed upon each lapse of a certain period of time to address aged deterioration. The testing operation may be executed periodically, for example, every six months.

A configuration is acceptable in which read-out data is automatically written back in a memory cell MC after the end of the readout operation.

In the embodiments described above, the low resistance of the MTJ element is assigned with data "0", and the high-resistance of the MTJ element is assigned with data "1". However, the low resistance of the MTJ element may be assigned with data "1", and the high resistance of the MTJ element may be assigned with data "0".

In the configurations in FIG. 1 and the like, the selection transistors $ST_{ij}$ are arranged at positions closer to the source lines $SL_j$ than the memory cells $MC_{ij}$. However, the arrangement order thereof is optional. The selection transistors $ST_{ij}$ may be at positions closer to the bit lines $BL_j$ than the memory cells $MC_{ij}$. Likewise, the redundant selection transistors $RST_i$ may be arranged at positions closer to the redundant bit line RBL than the redundant memory cells $RMC_i$. Likewise, in the configuration in FIG. 1, the selection transistors $AT_i$ are arranged at positions closer to the reference source line $SL_R$ than the reference cells $RC_i$. However, the arrangement order thereof is optional, and the selection transistors $AT_i$ may be arranged at positions closer to the first reference bit line $BLR_1$ than the reference cells $RC_i$.

The configuration of the testing device 100 is optional as long as a similar function can be achieved.

The test sequence is an example. A procedure itself is optional as long as optimal correction data is specified based on a column unit and can be set in the correction memory 242.

In FIG. 1, the number of the column of the redundant memory cells RMC is one. However, the number of the columns of the redundant memory cells RMC is optional. The redundant memory cells RMC are arranged based on a column unit. However, the redundant memory cells RMC may be arranged based on a row unit.

When the memory cells MC are multivalued memories, a common correction voltage $V_{ame}$ may be added to a plurality of reference voltages $V_{ref1}$ to $V_{refs}$, or a configuration is acceptable in which correction voltages $V_{ame1}$ to $V_{ames}$ optimized for each of the plurality of reference voltages $V_{ref1}$ to $V_{refs}$ are added.

In the above description, the circuits, in which a voltage is an electric signal, or which is operated with a voltage, are described. Resistance variable storage devices include those operated with a current as an electric signal. The present disclosure can also be applied to a storage circuit that is operated with a current. An explanation will be given below with reference to FIG. 16.

Figure 16:
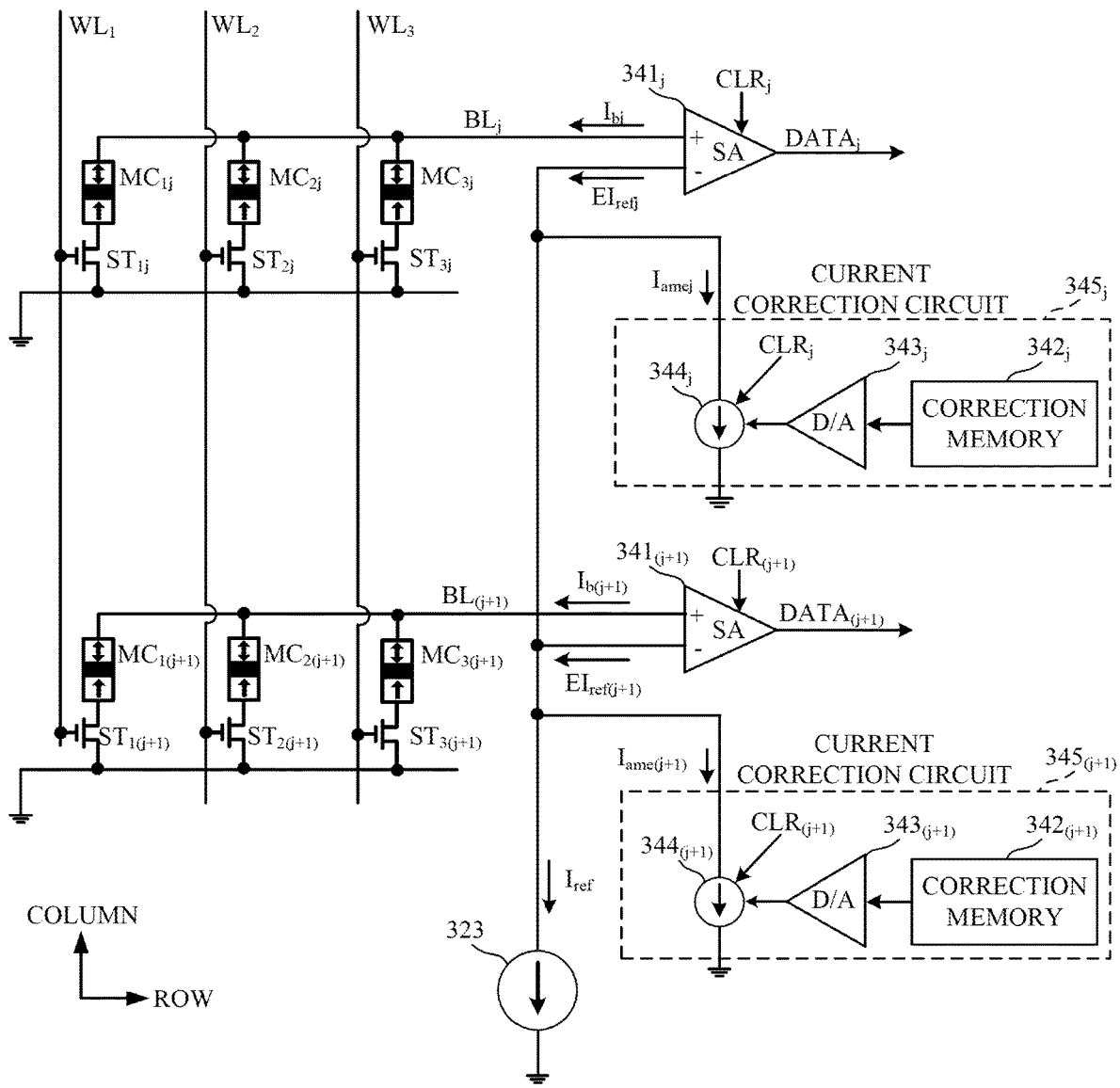
FIG. 16 is a block diagram illustrating a configuration example of a storage circuit using a current drive type sense amplifier.

FIG. 16 illustrates the basic configuration of the storage circuit 12 using a current drive type sense amplifier. FIG. 16 illustrates memory cells MC in three rows and two columns.

The configurations of the memory cells $MC_{ij}$ and selection transistors $ST_{ij}$ are the same as the configurations illustrated in FIG. 1.

A sense amplifier $341_j$ applies a readout voltage to a bit line $K_j$ connected to a positive input terminal. Then, a bit line current $I_{bj}$ with a magnitude depending on the resistance value (stored data) of the selected memory cell $MC_{ij}$ flows through the bit line $BL_j$. The magnitude of the bit line current $I_{bj}$ is equivalent to the signal level of an electric signal.

A constant current source 323 is connected to the negative input terminal of the sense amplifier $341_j$ through a reference current line. The reference current line $BL_R$ is connected to the negative input terminals of a plurality of sense amplifiers $341_j$ in common, and a reference current $I_{ref}$ from the constant current source 323 flows through the reference current line $BL_R$. The reference current $I_{ref}$ is equivalent to the signal level of a reference signal.

A current correction circuit $345_j$ is arranged in each sense amplifier $341_j$. The current correction circuit $345_j$ includes a correction memory $342_j$, a D-A conversion circuit $343_j$ for correction, and a correction current source $344_j$.

The correction memory $342_j$ corresponds to the correction memory $242_j$, and stores correction data $D_j$ set by a higher-level device (testing device). The D-A conversion circuit $343_j$ for correction converts correction data are into a correction voltage. The correction current source $344_j$ allows a correction current $I_{amej}$ corresponding to the correction voltage generated by the D-A conversion circuit $343_j$ for correction to flow. The correction current $I_{amej}$ is equivalent to a correction quantity at which the current correction circuit $345_j$ corrects the reference current $I_{ref}$.

An effective reference current $EI_{refj}$ equivalent to the sum of the reference current $I_{ref}$ and the correction current $I_{amej}$ flows through the negative terminal of the sense amplifier $341_j$. Switching to such a sense amplifier $341_j$ in a selected column is performed, and the reference current $I_{ref}$ is supplied to the sense amplifier $341_j$ in the selected column. In contrast, the correction current $I_{amej}$ is peculiar to each individual sense amplifier $341_j$.

Each sense amplifier $341_j$ amplifies the difference ($I_{bj}$–$EI_{refj}$), where $I_{bj}$ is the bit line current, and $EI_{refj}$ is the effective reference current, latches amplified difference ($I_{bj}$–$EI_{refj}$), and outputs the latched data. A readout column selection signal $CLR_j$ is supplied to the sense amplifier $341_j$ and the correction current source $344_j$, and they operate when the memory cells $MC_{ij}$ in the column j are selected as targets for readout.

Even in such a configuration, the reference current $I_{ref}$ in the column j can be corrected with the correction current $I_{amej}$ to optimize the effective reference current $EI_{refj}$ supplied to each sense amplifier $341_j$ for each column by setting the correction data $D_j$ in accordance with the characteristic of each column in the correction memory $342_j$. However, the reference current $I_{ref}$ can be used in common in such sense amplifiers $341_j$ in a plurality of columns.

Figure 17A:
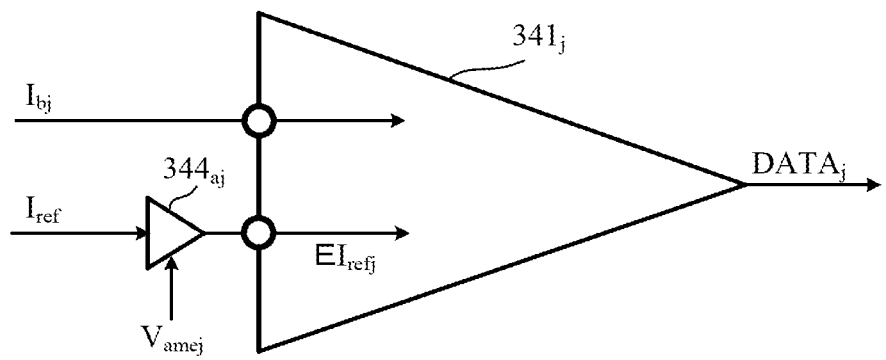
FIG. 17A is a view illustrating an example of a configuration in which a reference current is amplified by a current amplifier to generate an effective reference current.
Figure 17B:
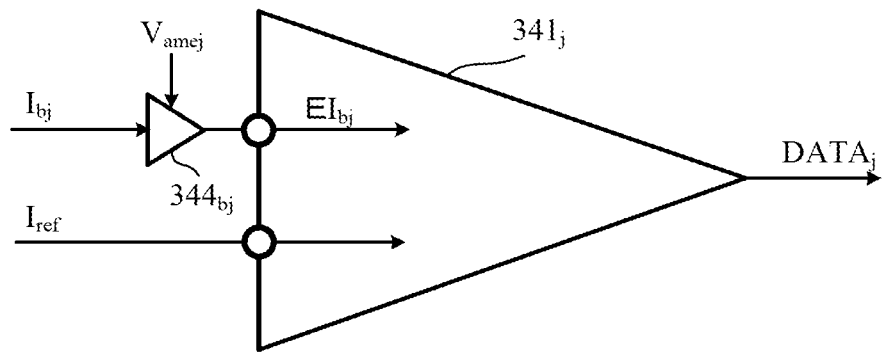
FIG. 17B is a view illustrating an example of a configuration in which a bit line current is amplified by a current amplifier to generate an effective bit line current.

As illustrated in FIGS. 17A and 17B, current amplifiers 346a and 346b may be arranged instead of a current adder circuit (including a current subtraction circuit). The current amplifier 346a outputs the effective reference current $EI_{refj}$ by amplifying the reference current $I_{ref}$ which is an example of physical properties to be corrected at an amplification factor in accordance with a correction signal $V_{amej}$. The current amplifier 346b outputs an effective bit line current $EI_{bj}$ by amplifying a bit line current $I_{bj}$ which is a physical property to be corrected by an amplification factor corresponding to the correction signal $V_{amej}$.

A specific circuit example of each portion of the storage circuit 11 according to the embodiment will now be described.

First, a circuit example of the voltage driving type sense amplifier $241_j$ illustrated in FIG. 4 and FIGS. 13A to 13D will be described with reference to FIG. 18.

Figure 18:
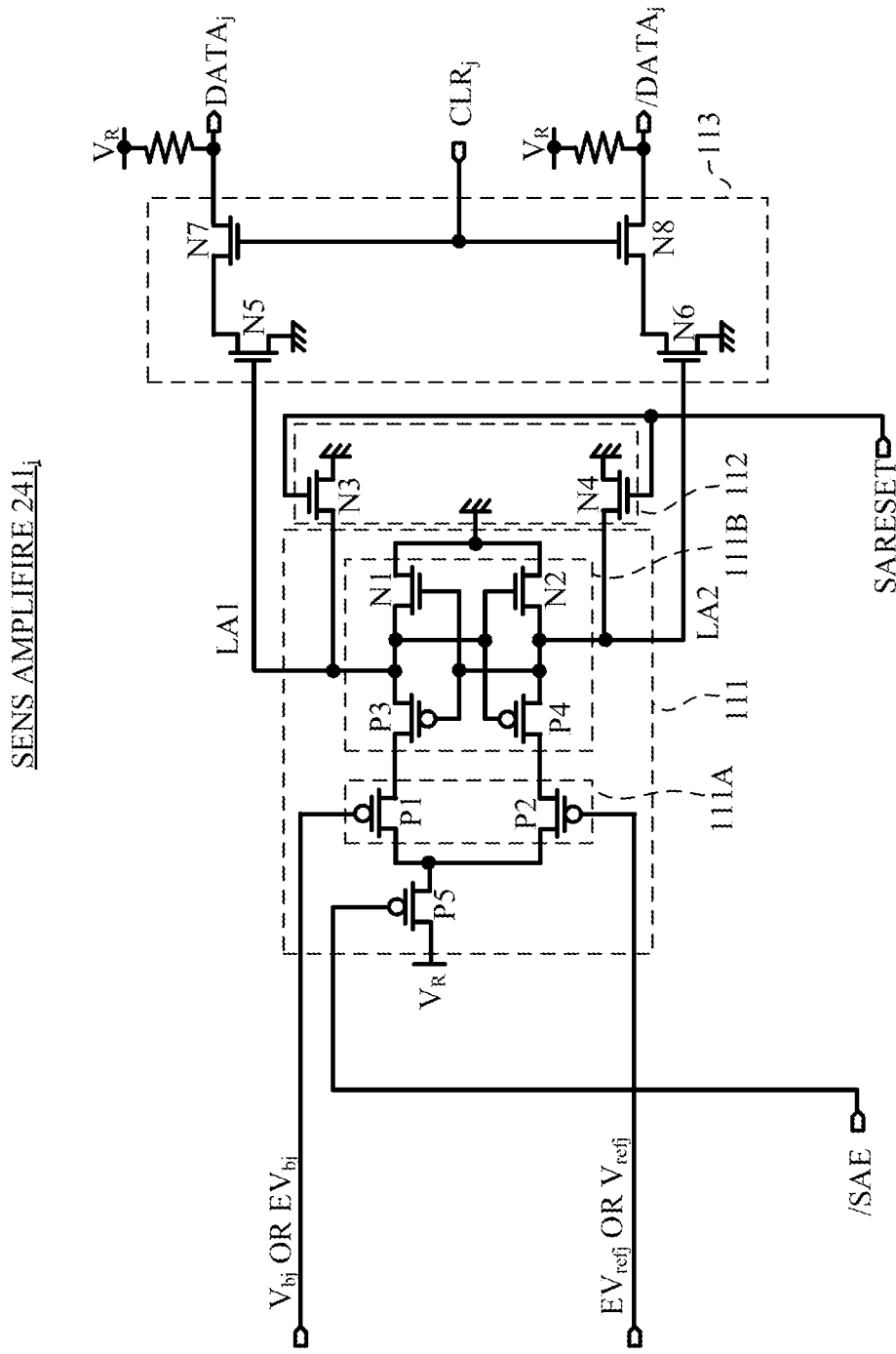
FIG. 18 is a circuit diagram illustrating an example of the circuit configuration of a sense amplifier.

As illustrated in FIG. 18, the sense amplifier $241_j$ includes a latch body 111, a reset circuit 112, and an output circuit 113.

The latch body 111 includes PMOS transistors P1 to P5, and NMOS transistors N1 to N2. The latch body 111 functionally includes: an input transistors circuit 111A of which the gate receives an input voltage; a CMOS latch 111B; and the PMOS transistor P5 that activates/deactivates a latch circuit.

The input transistors circuit 111A includes the PMOS transistors P1 and P2. A bit line voltage $V_{bj}$ or effective bit line voltage $EV_{bj}$ to be determined is applied to the gate of the PMOS transistor P1. The source of the PMOS transistor P1 is connected to the drain of the PMOS transistor P5, and the drain is connected to the source of the PMOS transistor P3. An effective reference voltage $EV_{ref}$ or a reference voltage $V_{ref}$ is applied to the gate of the PMOS transistor P2. The source of the PMOS transistor P2 is connected to the drain of the PMOS transistor P5, and the drain is connected to the source of the PMOS transistor P4.

The CMOS latch 111B includes a CMOS circuit including the PMOS transistors P3 and P4, and the NMOS transistors N1 and N2. The drain of the PMOS transistor P3 is connected to the drain of the NMOS transistor N1. The source of the NMOS transistor N1 is grounded. The drain of the PMOS transistor P4 is connected to the drain of the NMOS transistor N2. The source of the NMOS transistor N2 is grounded.

A readout voltage $V_R$ is applied to the source of the PMOS transistor P5, and a sense amplifier enable signal /SAE is applied to the gate of the PMOS transistor P5.

The gate of the PMOS transistor P3, the gate of the NMOS transistor N1, and the connection node between the PMOS transistor P4 and the NMOS transistor N2 are connected to each other. The gate of the PMOS transistor P4, the gate of the NMOS transistor N2, and the connection node between the PMOS transistor P3 and the NMOS transistor N1 are connected to each other.

The reset circuit 112 includes NMOS transistors N3 and N4, and resets the sense amplifier.

One end of the current path of the NMOS transistor N3 is connected to the connection node LA1 between the drain of the PMOS transistor P3 and the drain of the NMOS transistor N1, and the other end of the current path is grounded. One end of the current path of the NMOS transistor N4 is connected to the connection node LA2 between the drain of the PMOS transistor P4 and the drain of the NMOS transistor N2, and the other end of the current path is grounded. In addition, a sense amplifier reset signal SARESET is applied to the gates of the NMOS transistors N3 and N4. The sense amplifier reset signal SARESET is a signal that is maintained at a high level during normal operation, allows the sense amplifier $241_j$ to be maintained in a reset state (in which both the connection nodes LA1 and LA2 are at ground levels), and becomes at a low level when the sense amplifier $241_j$ is operated.

The output circuit 113 includes NMOS transistors N5 to N8. The connection node LA1 is connected to the gate of the NMOS transistor N5. One end of the current path of the NMOS transistor N5 is grounded, and the other end thereof is connected to one end of the current path of the NMOS transistor N7. The other end of the current path of the NMOS transistor N7 is pulled up to output the output data DATA.

The connection node LA2 is connected to the gate of the NMOS transistor N6. One end of the current path of the NMOS transistor N6 is grounded, and the other end thereof is connected to one end of the current path of the NMOS transistor N8. The other end of the current path of the NMOS transistor N8 is pulled up to output the inverting output data /DATA. Accordingly, output data is a pair of $DATA_j$ and complementary data $/DATA_j$.

A readout column selection signal $CLR_j$ is supplied to the gates of the NMOS transistor N7 and the NMOS transistor N8.

Another configuration example of such a sense amplifier $241_j$ will be described with reference to FIG. 19.

Figure 19:
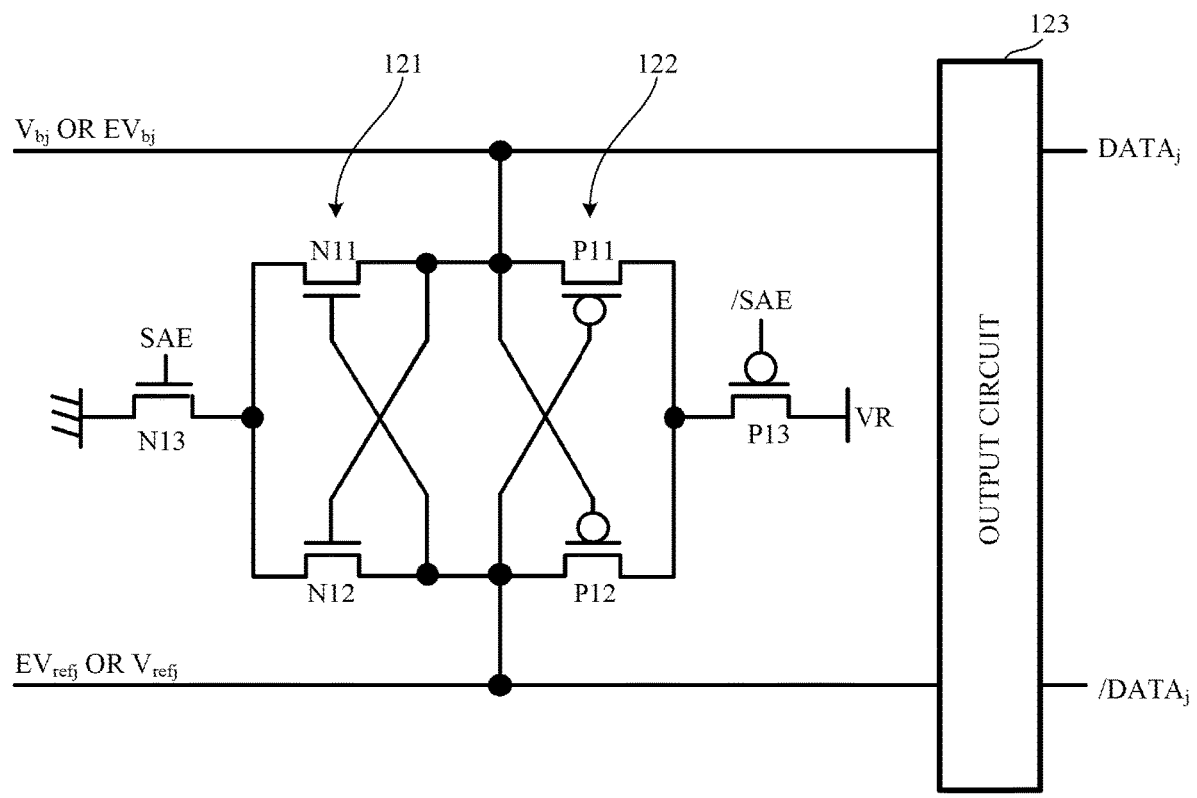
FIG. 19 is a circuit diagram illustrating another example of the circuit configuration of the sense amplifier.

In FIG. 19, the sense amplifier $241_j$ includes a sense circuit 121, a latch circuit 122, and an output circuit 123.

The sense circuit 121 includes: NMOS transistors N11 and N12 which are cross-couple-connected to each other; and an NMOS transistor N13 included in a grounding transistor. The inverted signal SAE of the sense amplifier enable signal /SAE is applied to the gate of the grounding transistor N13.

The latch circuit 122 is connected to the sense circuit 121, and includes: PMOS transistors P11 and P12 cross-couple-connected to each other; and a PMOS transistor P13 that activates/deactivates the sense amplifier $241_j$. The sense amplifier enable signal /SAE is applied to the gate of the PMOS transistor P13.

When the sense amplifier enable signal /SAE is changed to a low level, the NMOS transistor N13 and the PMOS transistor P13 are turned on. Then, the NMOS transistors N11 and N12 included in the sense circuit 121 amplify the potential difference between the bit line voltage $V_{bj}$ (or effective bit line voltage $EV_{bj}$) and the effective reference voltage $EV_{refj}$ (reference voltage $V_{ref}$). The PMOS transistors P11 and P12, which are included in the latch circuit 122 and cross-couple-connected, latch the amplified voltage.

The output circuit 123 outputs data $DATA_j$ latched by the latch circuit 122, and the complementary data $/DATA_j$ thereof.

In such a manner, a sense amplifier of a type in which the gate of MOSFET receives a voltage signal (FIG. 18), or a sense amplifier of a type in which the drain of the MOSFET receives a voltage signal (FIG. 19) can be applied as the sense amplifier $241_j$.

A configuration example of the correction memory 242 illustrated in FIG. 4 will now be described with reference to FIG. 20.

Figure 20:
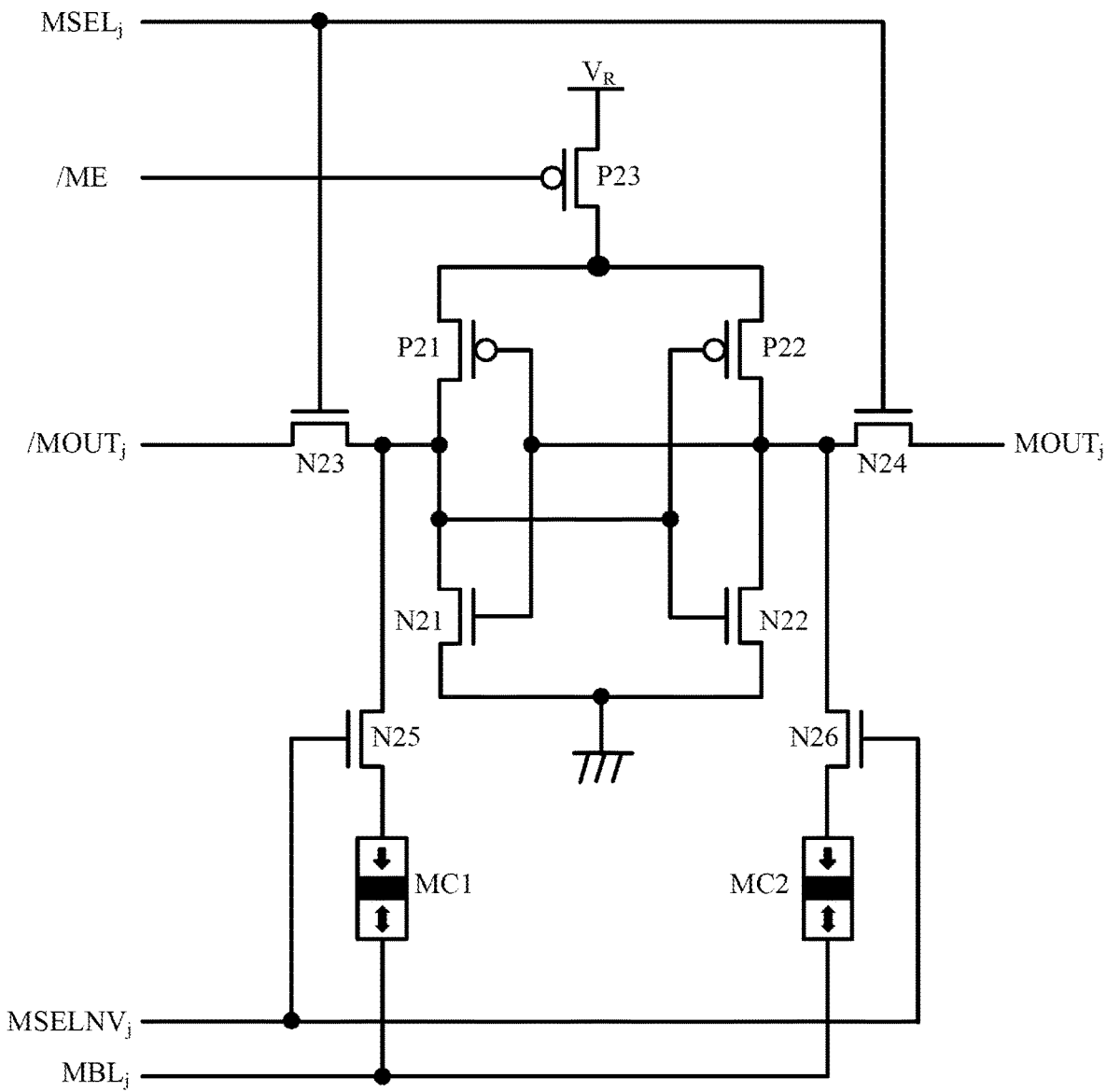
FIG. 20 is a circuit diagram illustrating an example of the configuration, corresponding to 1 bit, of a correction memory illustrated in FIG. 4.

FIG. 20 illustrates the configuration of the memory element 242a of 1 bit of the correction memory 242. As illustrated, the memory element 242a includes a CMOS circuit including PMOS transistors P21 to P23 and NMOS transistors N21 and N22. The drain of the PMOS transistor P21 is connected to the drain of the NMOS transistor N21. The source of the NMOS transistor N21 is grounded. The drain of the PMOS transistor P22 is connected to the drain of the NMOS transistor N22. The source of the NMOS transistor N22 is grounded.

The connection node between the gate of the PMOS transistor P21 and the gate of the NMOS transistor N21, and the connection node between the drain of the PMOS transistor P22 and the drain of the NMOS transistor N22 are connected to each other. The connection node between the gate of the PMOS transistor P22 and the gate of the NMOS transistor N22, and the connection node between the drain of the PMOS transistor P21 and the drain of the NMOS transistor N21 are connected to each other.

A readout voltage $V_R$ is applied to the source of the PMOS transistor P23, a memory enable signal /ME is applied to the gate of the PMOS transistor P23, and the drain of the PMOS transistor P23 is connected to the sources of the PMOS transistors P21 and P22.

The connection node between the drain of the PMOS transistor P21 and the drain of the NMOS transistor N21 is connected to a data terminal $/MOUT_j$ through an NMOS transistor N23 included in a transfer gate. The connection node between the drain of the PMOS transistor P22 and the drain of the NMOS transistor N22 is connected to a data terminal $MOUT_j$ through an NMOS transistor N24 included in a transfer gate.

The connection node between the PMOS transistor P21, the NMOS transistor N21, and the data terminal $/MOUT_j$ is connected to one end of a memory cell MC1 through an NMOS transistor N25 included in a selection transistor. The other end of the memory cell MC1 is connected to a bit line MBL.

The connection node between the PMOS transistor P22, the NMOS transistor N22, and the data terminal $MOUT_j$ is connected to one end of a memory cell MC2 through the NMOS transistor N26 included in the selection transistor. The other end of the memory cell MC2 is connected to the bit line MBL.

A memory selection signal $MSEL_j$ is applied to the gates of the NMOS transistors N23 and N24. A memory cell selection signal $MSELNV_j$ is applied to the gates of NMOS transistors N25 and N26.

The correction memory $242_j$ illustrated in FIG. 4 has 3 bits, and therefore includes three memory elements 242a. For example, the data terminal $MOUT_j$ of the three memory elements 242a is connected to the input terminal of the D-A conversion circuit $243_j$.

The memory selection signal $MSEL_j$, the memory enable signal /ME, and the memory cell selection signal $MSELNV_j$ are signals common to the three memory elements 242a included in the correction memory $242_j$ in the column j. The bit line MBL is connected in common to the memory cells MC1 and MC2 of the three memory elements 242a included in the correction memory $242_j$ in the column j.

The memory cells MC1 and MC2 store complementary data.

The operation of the memory elements 242a will now be described.

Each memory element 242a includes: a volatile memory that is primarily operated during passing current; and a nonvolatile memory that saves, at the time of power off, data stored in the volatile memory. In other words, first, correction data is written in the volatile memory when the correction data is written in the memory elements 242a during the test operation illustrated in FIG. 9. In such a manner, correction data is exchanged primarily in the volatile memory through the complementary data terminals $MOUT_j$ and $/MOUT_j$ during passing current (here, the nonvolatile memory need not be used). When a power source is turned off, data in the volatile memory is transferred to the nonvolatile memory so that the data is prevented from being lost. A functioning method is performed in which the data is retransferred from the nonvolatile memory to the volatile memory in the next turning-on of the power source to prepare for usual operation.

The volatile memory includes the PMOS transistors P21, P22, and P23, and the NMOS transistors N21, N22, N23, and N24, has a circuit configuration similar to the circuit configuration of a common six-transistor-type SRAM cell, and operates in a manner similar to the manner of SRAM. In other words, data is written by setting the memory enable signal /ME at a low level and the memory selection signal $MSEL_j$ at a high level, followed by setting voltages according the data, intended to be written, in the complementary data terminals $MOUT_j$ and $/MOUT_j$.

By setting the memory enable signal /ME at a low level and the memory selection signal $MSEL_j$ at a high level, a voltage depending on data stored in the memory element is generated in the complementary data terminals $MOUT_j$ and $/MOUT_j$, and therefore, the readout of data from the volatile memory is enabled by sensing the voltage.

The nonvolatile memory includes the NMOS transistors N25 and N26 and the memory cells MC1 and MC2, has a circuit configuration similar to the circuit configuration of a so-called 2T2MTJ-type MRAM cell, and operates in a manner similar to the manner of 2T2MTJ-type MRAM. In other words, data is written by setting the bit line MBL terminal in a floating state and the memory cell selection signal $MSELNV_j$ at a high level in a state in which the drain terminals of the NMOS transistors N25 and N26 (the common connection terminal of the MOS transistors P21, N23, and N21 of the volatile memory, and the common connection terminal of the MOS transistors P22, N24, and N26, respectively) are at voltages complementary to each other. As a result, for example, when the drain terminals of the NMOS transistors N25 and N26 are at high and low levels, respectively, a current flows in a pathway of NMOS transistor N25→memory cell MC1→memory cell MC2→NMOS transistor N26, and high and low resistances are written in the memory cells MC1 and MC2, respectively. The reversal of the drain terminals of the NMOS transistors N25 and N26 results in the reversal of the resistance values of the memory cells MC1 and MC2.

In the operation described above, a similar writing operation is also enabled by putting one pulse of which the level is changed in the manner of (1) low level→(2) high level→(3) low level, instead of by setting the bit line MBL terminal in the floating state. This is caused by performing the following operation in each period of (1) to (3). For example, when the drain terminals of the NMOS transistors N25 and N26 are at high and low levels, respectively, first, a current flows in the direction of NMOS transistor N25→bit line MBL in the period of (1) (and (3)), and the writing operation of the memory cell MC1 in a high-resistance state is performed. In such a case, the operation of writing data does not occur because both the bit line MBL and the drain terminal of the NMOS transistor N26 are at the same low level, and a current does not flow through the memory cell MC2. Then, a current flows in the direction of bit line MBL→the NMOS transistor N26 in the period of (2), and the writing operation of the memory cell MC2 in a low-resistance state is performed. In such a case, the operation of writing data does not occur because both the bit line MBL and the drain terminal of the NMOS transistor N25 are at the same high level, and a current does not flow through the memory cell MC1. When the drain terminals of the NMOS transistors N25 and N26 are at low and high levels, respectively, in reverse with respect to the above, the reversal of the resistance values of the memory cells MC1 and MC2 occurs.

The readout of data in the nonvolatile memory is the operation of transferring the data from the memory cells MC1 and MC2 of the nonvolatile memory to the SRAM which is the volatile memory. From a state in which the memory enable signal /ME is set at a high level, the memory cell selection signal $MSELNV_j$ is set at a low level, and the bit line MBL is set at a low level, first, $MSELNV_j$ is set at a high level, and /ME is then set at a low level. In such a manner, a voltage depending on the resistance states of the memory cells MC1 and MC2 is latched by the memory element 242a, and therefore, the data in the nonvolatile memory is transferred to the volatile memory.

Figure 14A:
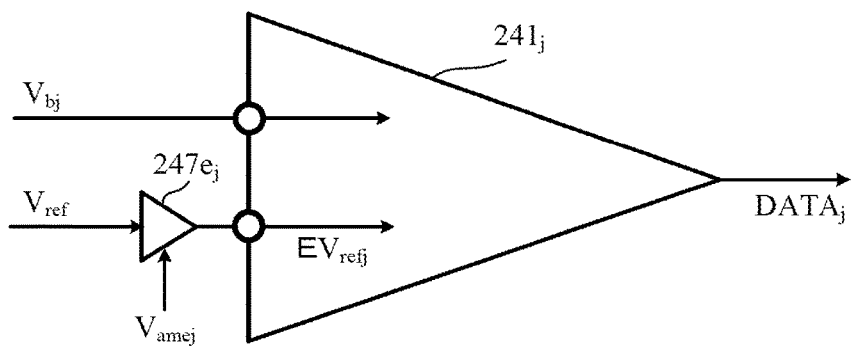
FIG. 14A is a view illustrating an example of a configuration in which a reference voltage is amplified by an amplifier to generate an effective reference voltage.
Figure 14B:
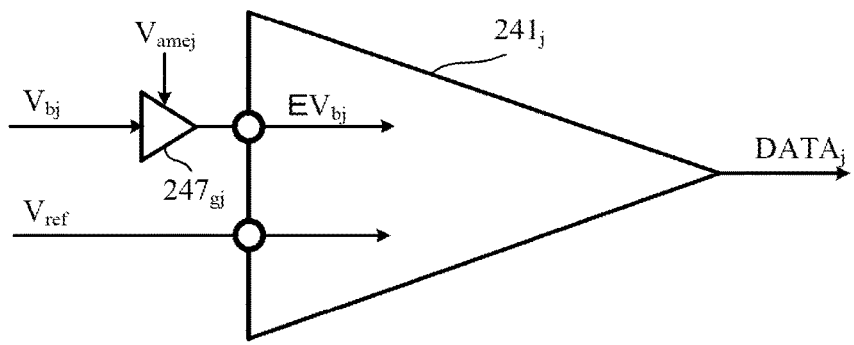
FIG. 14B is a view illustrating an example of a configuration in which a bit line voltage is amplified by an amplifier to generate an effective bit line voltage.
Figure 14C:
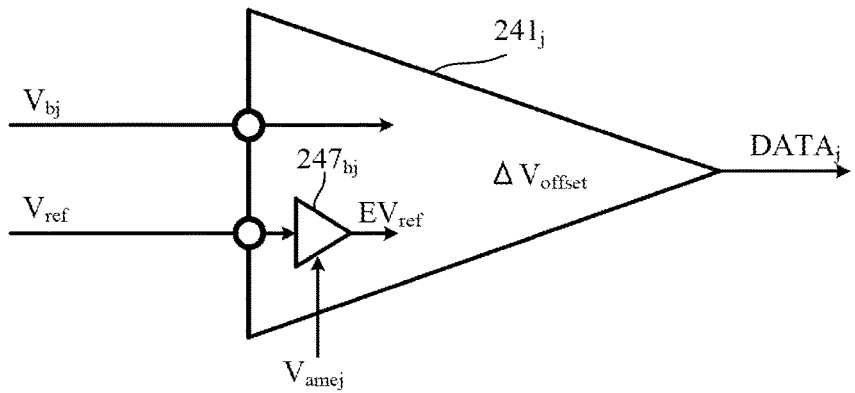
FIGS. 14C and 14D are views illustrating examples of configurations in which an amplifier circuit is arranged in a sense amplifier to adjust an offset voltage.
Figure 14D:
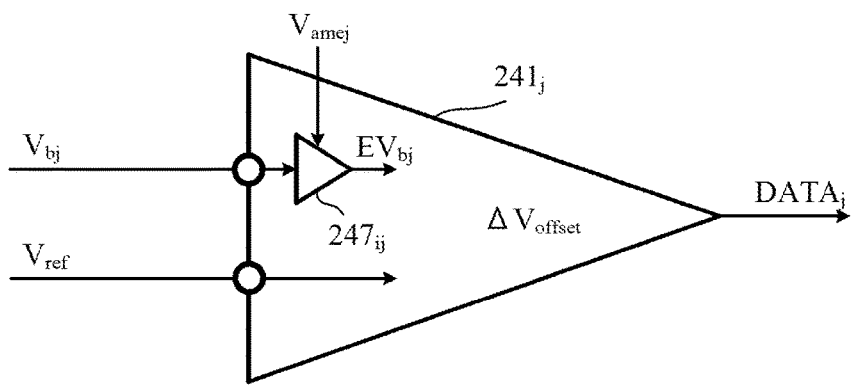

Specific examples of the amplifier circuits $247_{ej}$ and $247_{hj}$ illustrated in FIGS. 14A and 14B will now be described with reference to FIGS. 21A to 23B.

First, a first example of a correction circuit that generates an effective reference voltage $EV_{refj}$ from a reference voltage $V_{ref}$ in the column j is described with reference to FIG. 21A. This example is an example of the correction circuit that amplifies the reference voltage $V_{ref}$ to generate the effective reference voltage $EV_{refj}$.

Figure 21A:
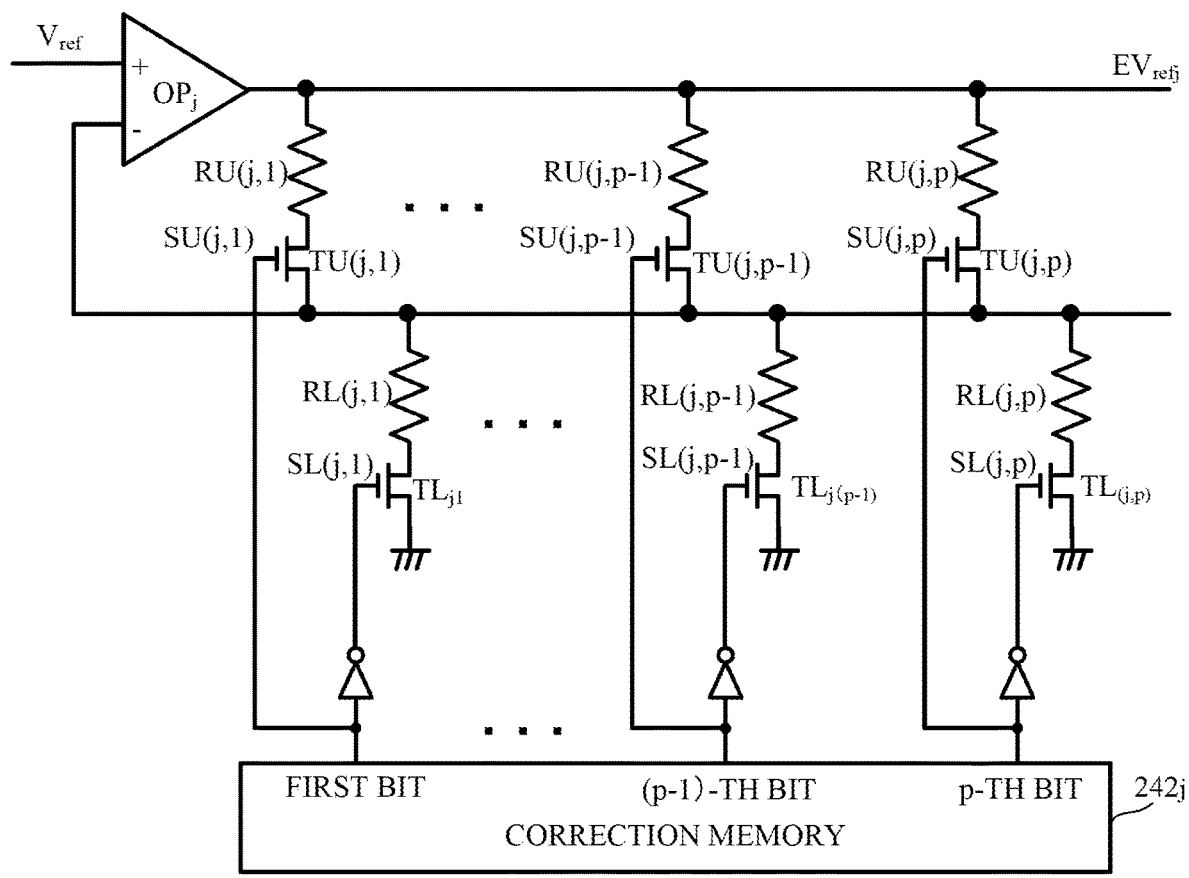
FIG. 21A is a circuit diagram illustrating another configuration example in which an effective reference voltage is generated from a reference voltage.

As illustrated in FIG. 21A, the amplifier circuit $247_j$ for the column j includes: an operational amplifier $OP_j$; and an amplification factor change circuit that changes an amplification factor by changing at least one of a resistance value between the output terminal and negative input terminal of the operational amplifier $OP_j$ and a resistance value between the negative input terminal and the reference voltage corresponding to correction data $D_j$. The amplification factor change circuit includes p resistances RU (j, 1) to RU (j, p), p resistances RL (j, 1) to RL (j, p), p NMOS transistors TU (j, 1) to TU (j, p), and p NMOS transistors TL (j, 1) to TL (j, p).

The reference voltage $V_{ref}$ is applied to the positive input terminal of the operational amplifier $OP_j$. The series circuits of the first resistance RU (j, 1) to the p-th resistance RU (j, p) and the first NMOS transistor TU (j, 1) to the p-th NMOS transistor TU (j, p) are connected in parallel between the operational amplifier $OP_j$ and the negative input terminal thereof. Moreover, the series circuits of the first resistance RL (j, 1) to the p-th resistance RL (j, p) and the NMOS transistor TL (j, 1) to the p-th NMOS transistor TL (j, p) are connected in parallel between the negative input terminal of the operational amplifier $OP_j$ and the ground.

Each of the NMOS transistor TU (j, k) and the NMOS transistor TL (j, k) (k=natural number of 1 to p) is included in a switch. In the correction memory $242_j$ in FIG. 4, p=3 is established because stored data has 3 bits.

The bit signal SU (j, k) of the k-th bit of the correction memory 242 is applied to the gate of the NMOS transistor TU (j, k), and the inverted signal SL (j, k) of the bit signal of the k-th bit of the correction memory $242_j$ is applied to the gate of the NMOS transistor TL (j, k). SL (j, k)=/SU (j, k) is established.

The resistance values of the resistances RU (j, 1) to RU (j, p) and RL (j, 1) to RL (j, p) are optional. For example, the resistance values may be equal to each other or different from each other, or it is also acceptable that only some of the resistance values are equal to each other and the other are different from each other. The setting of the resistance values at values different from each other can result in an increase in the number of the possible values of the effective reference voltage $EV_{refj}$, and is more desirable.

In accordance with such a configuration, one of the NMOS transistor TU (j, k) and the NMOS transistor TL (j, k) is turned on depending on whether the bit signal of the k-th bit of the correction memory $242_j$ is "1" or "0". Therefore, the amplification factor of the amplifier circuit is changed to change the effective reference voltage $EV_{refj}$ depending on data stored in the correction memory $242_j$. Therefore, the reference voltage $V_{ref}$ can be customized for each column.

Figure 21B:
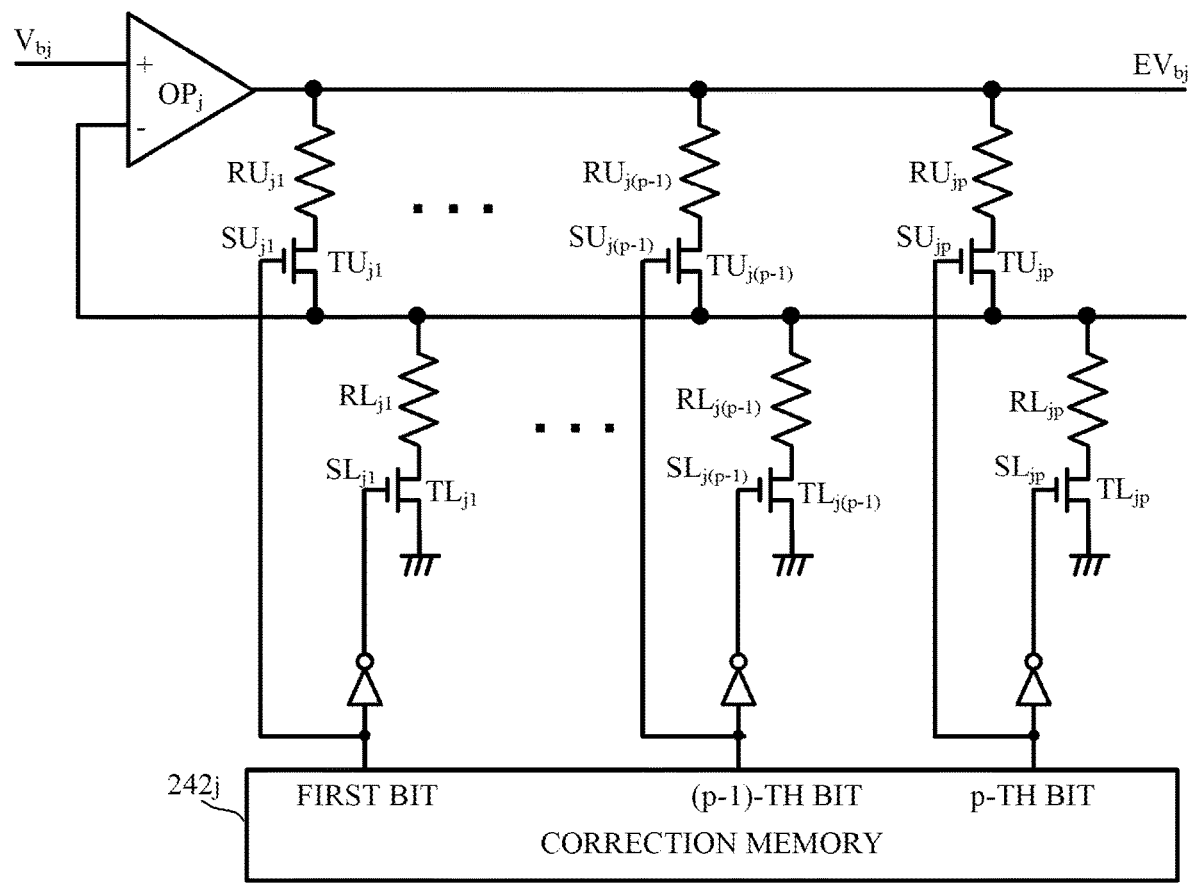
FIG. 21B is a circuit diagram illustrating another example of a configuration in which an effective bit line voltage is generated from a bit line voltage.

As illustrated in FIG. 21B, an effective bit line voltage $EV_{bj}$ can also be generated by supplying a bit line voltage $V_{bj}$ in the column j, instead of the reference voltage $V_{ref}$, to the amplifier circuit $247_j$.

In the above description, complementary signals are supplied to the gates of the NMOS transistor TU (j, k) and the NMOS transistor TL (j, k). However, different bit signals may be supplied to the gates. In such a case, the number of the bits of the correction memory $242_j$ is 2·p.

Figure 22:
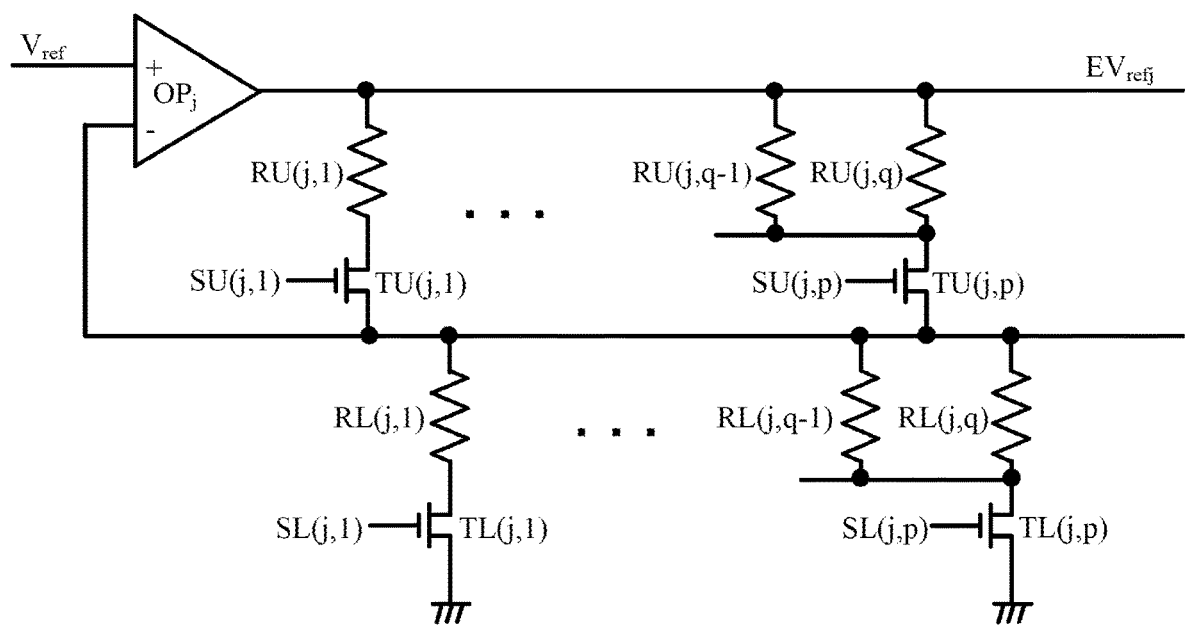
FIG. 22 is a circuit diagram illustrating another configuration example in which an effective reference voltage is generated from a reference voltage.

As long as the effective reference voltage $EV_{refj}$ or the effective bit line voltage $EV_{bj}$ can be adjusted by changing the amplification factor of the amplifier circuit depending on the correction data $D_j$, the configuration of the circuit is optional. For example, a plurality of resistances RU or RL may be connected to each NMOS transistor TU or TL, as illustrated in FIG. 22. An example in which the NMOS transistor TU or TL connected only to the one resistance RU or RL and the NMOS transistor TU or TL connected to the plurality of resistances RU or RL coexist is illustrated in FIG. 22. Such a configuration enables different resistance values to be obtained using a resistance element having the same configuration and a weight to be assigned to each bit of the correction memory $242_j$.

Figure 23A:
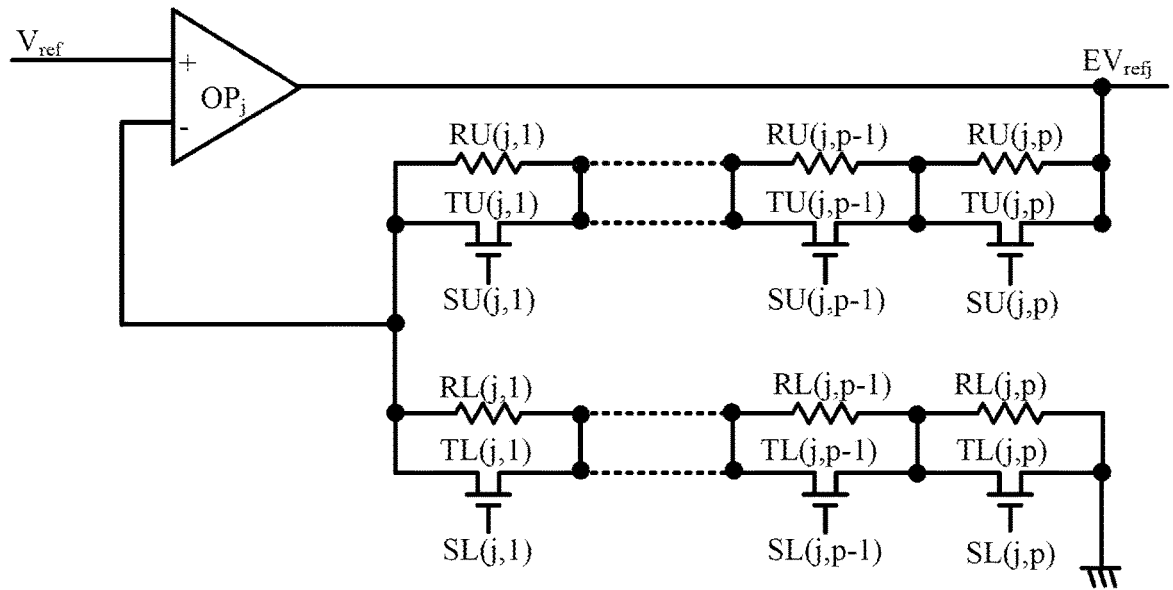
FIGS. 23A and 23B, each shows a circuit diagram of another configuration example in which an effective reference voltage is generated from a reference voltage.
Figure 23B:
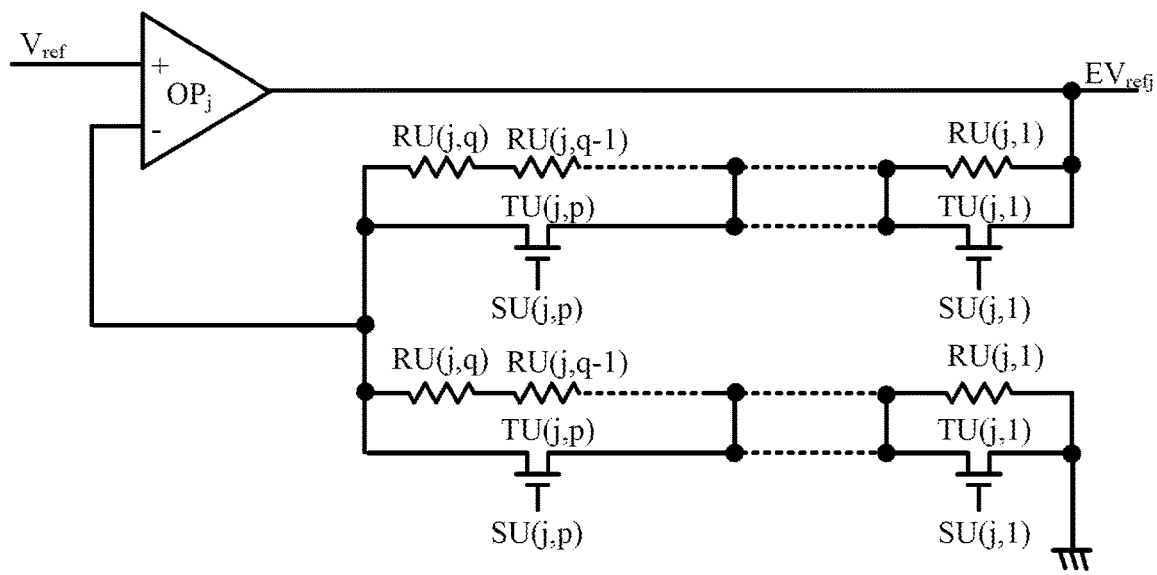

In addition, the series circuit of resistances RU and RL can also establish connection between the output terminal and negative input terminal of the operational amplifier $OP_j$, and between the negative input terminal of the operational amplifier $OP_j$ and the ground, as illustrated in FIGS. 23A and 23B.

In the configuration in FIG. 23A, the current path of one NMOS transistor TU or TL is connected in parallel to one resistance RU or RL. Turn-on of the NMOS transistor TU or TL enables the short circuit of both ends of the resistance and the adjustment of the resistance value of the series resistance circuit. As a result, the amplification factor of the amplifier circuit is changed, and the effective reference voltage $EV_{refj}$ is changed.

Moreover, an example in which one or more resistances RU or RL are connected to one NMOS transistor TU or TL is illustrated in FIG. 23B.

In the configurations in FIGS. 22, 23A, and 23B, the effective bit line voltage $EV_{bj}$ can also be generated by supplying the bit line voltage $V_{bj}$ in the column j, instead of the reference voltage $V_{ref}$.

A specific example of the load resistance circuit $248_j$ illustrated in FIG. 15A will now be described with reference to FIGS. 24A, 24B, 25A, and 25B.

Figure 24A:
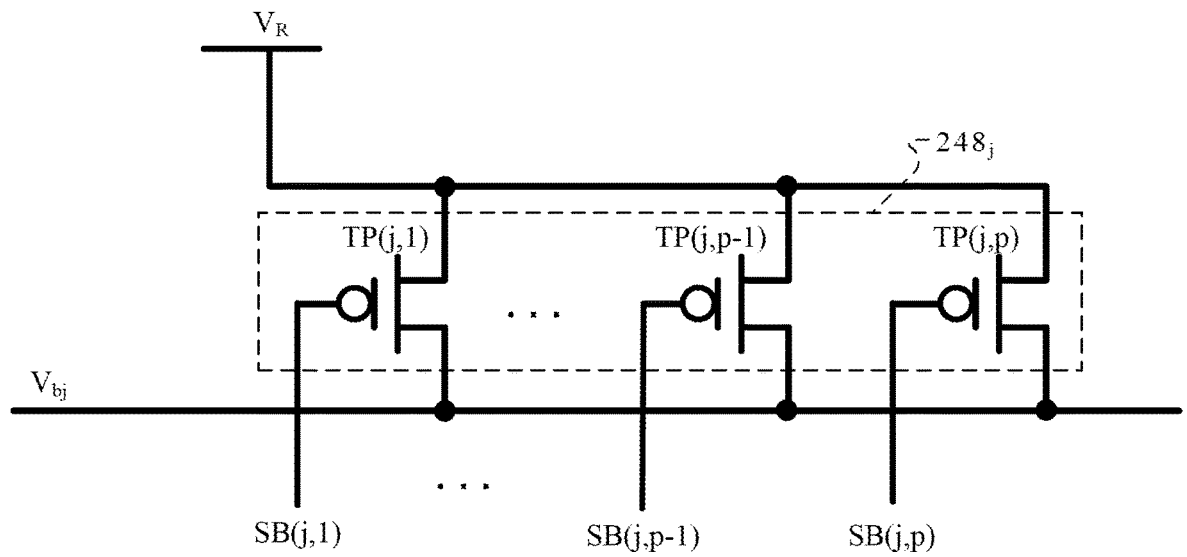
FIGS. 24A and 24B, each shows a circuit diagram illustrating another configuration example of a load resistance circuit that adjusts a bit line voltage.

FIG. 24A illustrates an example of the load resistance circuit $248_j$ that adjusts the bit line voltage $V_{bj}$ in the column j.

In such a configuration, the bit line $BL_j$ in the column j is pulled up to the readout voltage $V_R$ by a plurality of PMOS transistors TP (j, 1) to TP (j, p). Voltages SB (j, 1) to SB (j, p) obtained by analog conversion of bit data of a bit corresponding to the correction data $D_j$ stored in the correction memory 242 are applied to the gates of the PMOS transistors TP (j, 1) to TP (j, p). As a result, electrical connection between one end of each memory cell $MC_{ij}$ and the readout voltage $V_R$ (terminal to which the readout voltage $V_R$ is applied) is established by the current paths of the plurality of transistors TP (j, 1) to TP (j, p). The plurality of transistors TP (j, 1) to TP (j, p) is turned on/off in accordance with the correction data $D_j$.

The ON resistances (current drive abilities) of the PMOS transistors TP (j, 1) to TP (j, p) may be identical with or the same as each other. The bit line voltage $V_{bj}$ can be adjusted depending on data stored in the correction memory $242_j$ by adjusting the number of turned-on PMOS transistors TP (j, 1) to TP (j, p), or selecting turned-on PMOS transistors, and further by a combination thereof. It is desirable to set the correction data $D_j$ so that at least one of the PMOS transistors TP (j, 1) to TP (j, p) is turned on.

Figure 24B:
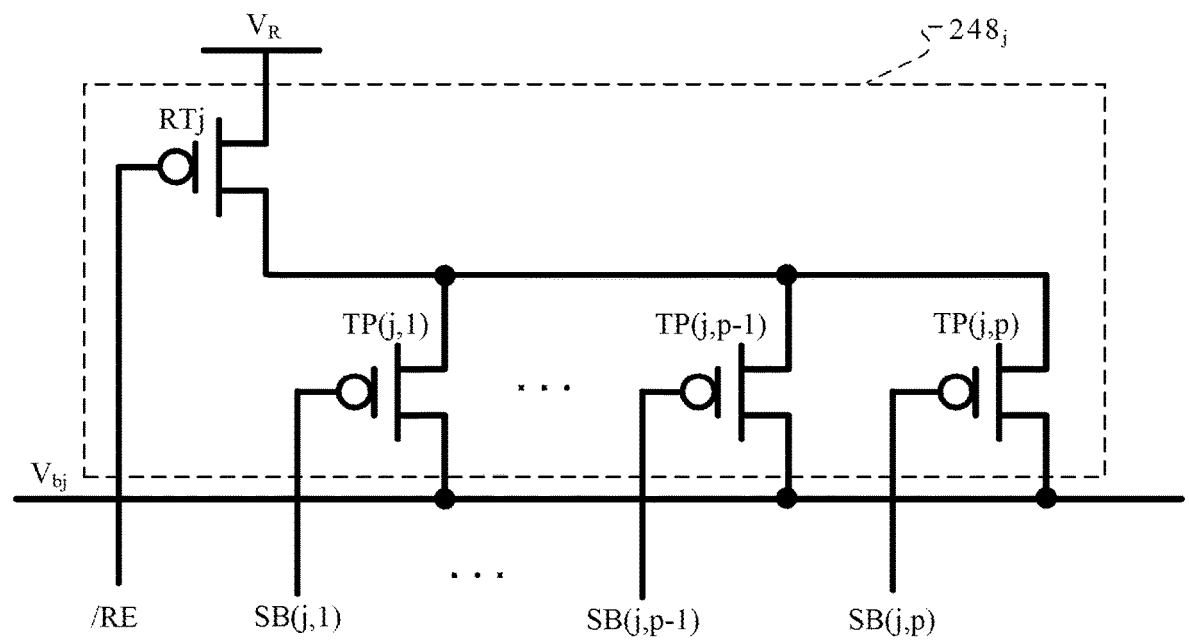

A voltage signal obtained by the generation of the logical product of each bit of the correction data $D_j$ and a read enable signal /RE, and the analog conversion of each bit of operation results may be applied to the gate of the PMOS transistor TP (j, k). A load transistor $RT_j$ turned on/off by the read enable signal /RE may be arranged, as illustrated in FIG. 24B.

Figure 25A:
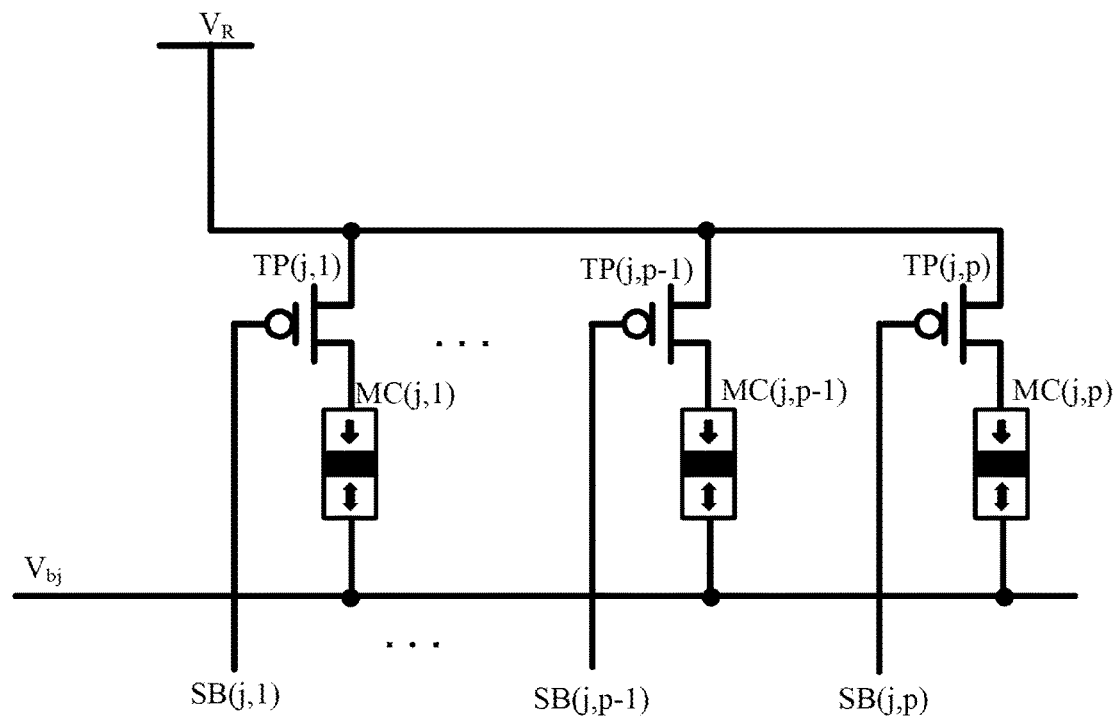
FIGS. 25A and 25B, each shows a circuit diagram illustrating another configuration example of a load resistance circuit that adjusts a bit line voltage.
Figure 25B:
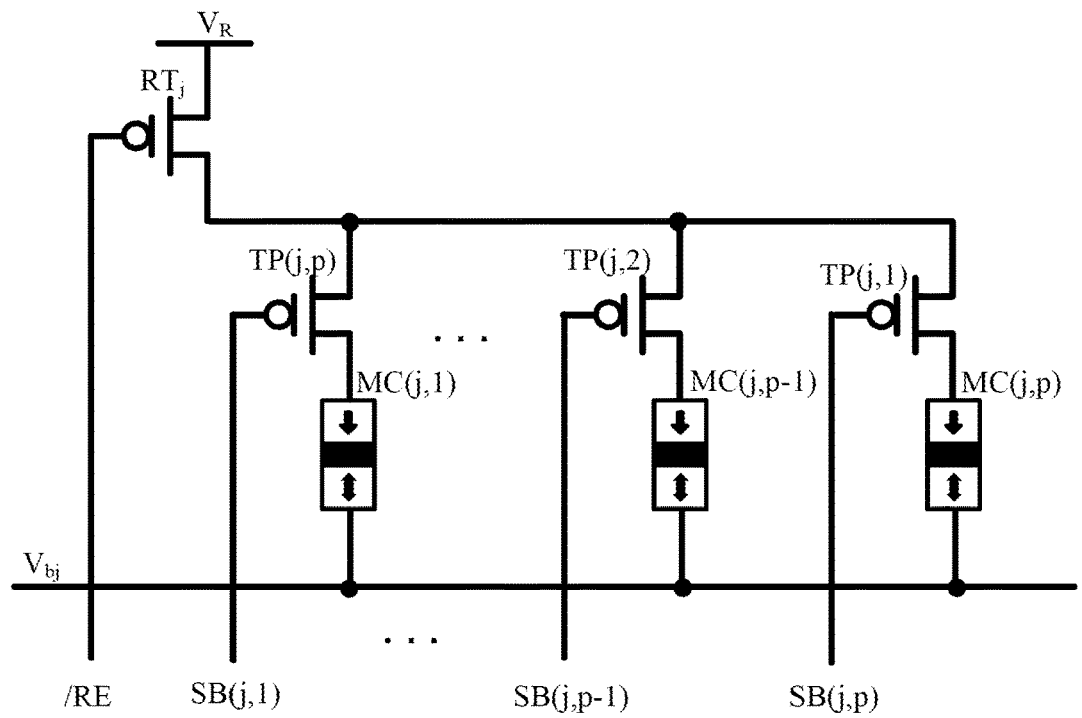

In addition, the series circuit of a memory cell MC and a PMOS transistor may be arranged, as illustrated in FIGS. 25A and 25B. A usual resistance element may be used instead of the memory cell MC.

A configuration example of a sense amplifier having the function of adjusting the offset voltage $\Delta V_{offset}$ illustrated in FIGS. 13C and 13D will now be described with reference to FIG. 26.

Figure 26:
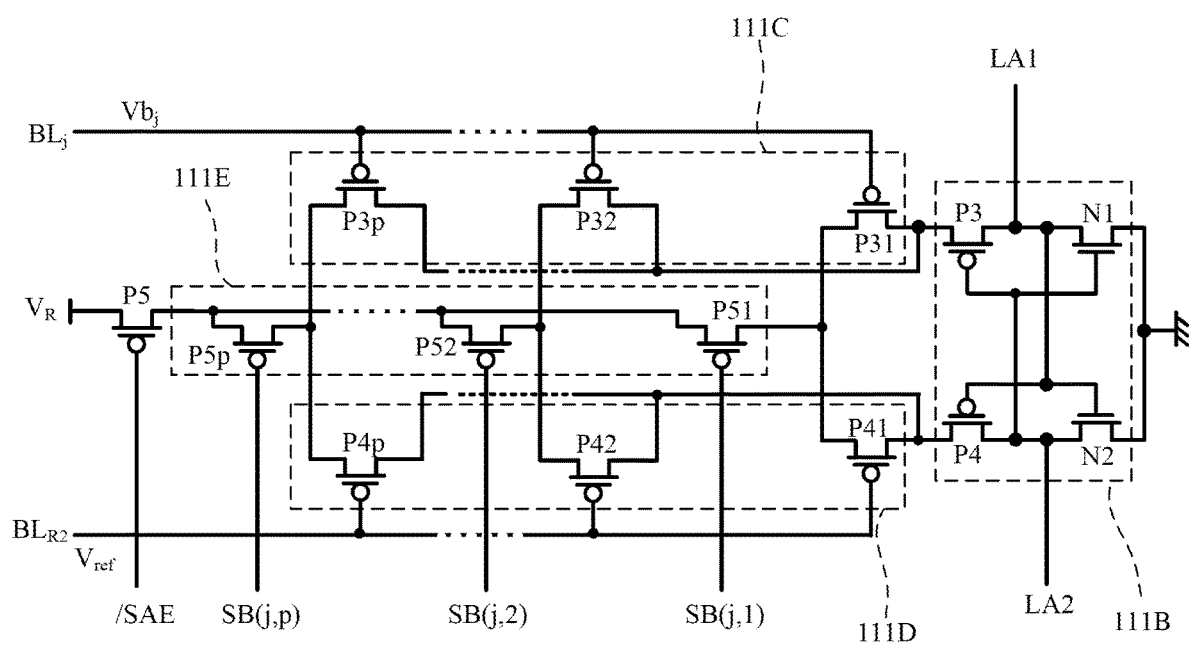
FIG. 26 is a circuit diagram illustrating an example of the configuration of a sense amplifier including a configuration in which an offset voltage is adjusted.

A sense amplifier $241a$ illustrated in FIG. 26 includes gate receiving circuits 111C and 111D, a CMOS latch 111B, a bias circuit 111E, and an activation PMOS transistor P5.

The configuration of the CMOS latch 111B is identical with the configuration illustrated in FIG. 18.

The gate receiving circuit 111C includes p PMOS transistors P31 to P3p. The gates of the PMOS transistors P31 to P3p are connected in common to a bit line $BL_j$, and receive a bit line voltage $V_{bj}$. The drains of the PMOS transistors P31 to P3p are connected in common to a connection node LA1.

The gate receiving circuit 111D includes p PMOS transistors P41 to P4p. The gates of the PMOS transistors P41 to P4p are connected in common to a reference bit line $BL_{R2}$, and receive a reference voltage $V_{ref}$. The drains of the PMOS transistors P41 to P4p are connected in common to a connection node LA2. The sources of the PMOS transistors P41 to P4p are connected to the sources of the PMOS transistors P31 to P3p, respectively.

The drains of PMOS transistors P51 to 5p included in the bias circuit 111E are connected to corresponding connection nodes between the sources of the PMOS transistors P31 to 3p and the sources of the PMOS transistors P41 to 4p. Voltage signals SB (j, 1) to SB (j, p) obtained by the analog conversion of the bit data of the corresponding bit of the correction memory $242_j$ are applied to the gates of the PMOS transistors P51 to 5p. A sense amplifier enable signal /SAE is applied to the gate of P5.

In accordance with such a configuration, the bias transistors P51 to P5p are turned on/off depending on correction data $D_j$ to pull up the voltage of a connection node NA1 and the voltage of LA2 to be closer to a readout voltage $V_R$. The degree of such pulling up varies in accordance with the correction data $D_1$.

The ON resistances of the PMOS transistors P31 to P3p vary depending on the bit line voltage $V_{bj}$. Likewise, the ON resistances of the PMOS transistors P41 to P4p vary depending on the reference voltage $V_{ref}$. Therefore, the potential difference between the connection nodes LA1 and LA2 varies depending on the bit line voltage $V_{bj}$, the reference voltage $V_{ref}$, and the correction data $D_j$. Such a variation is equivalent to a variation in offset voltage $\Delta V_{offset}$. In such a manner, the offset voltage $\Delta V_{offset}$ can be adjusted by the correction data $D_j$. Accordingly, it is possible to adjust the offset voltage $\Delta V_{offset}$ of the sense amplifier 241a for each column, and to appropriately determine data stored in a memory cell.

In the above description, the storage circuit 11 of a type in which the reference voltage $V_{ref}$ common to the plurality of memory cells is used is described. Examples of storage circuits include a storage circuit of a type in which a storage element is included in a pair of memory cells complementarily storing data, and the stored data is determined by comparing complementary bit line voltages $V_b$ and $/V_b$ generated by complementary data stored in the pair of memory cells. This disclosure can also be applied to this type of the storage circuit.

An embodiment in which the present disclosure is applied to this type of the storage circuit will be described below with reference to FIG. 27.

Figure 27:
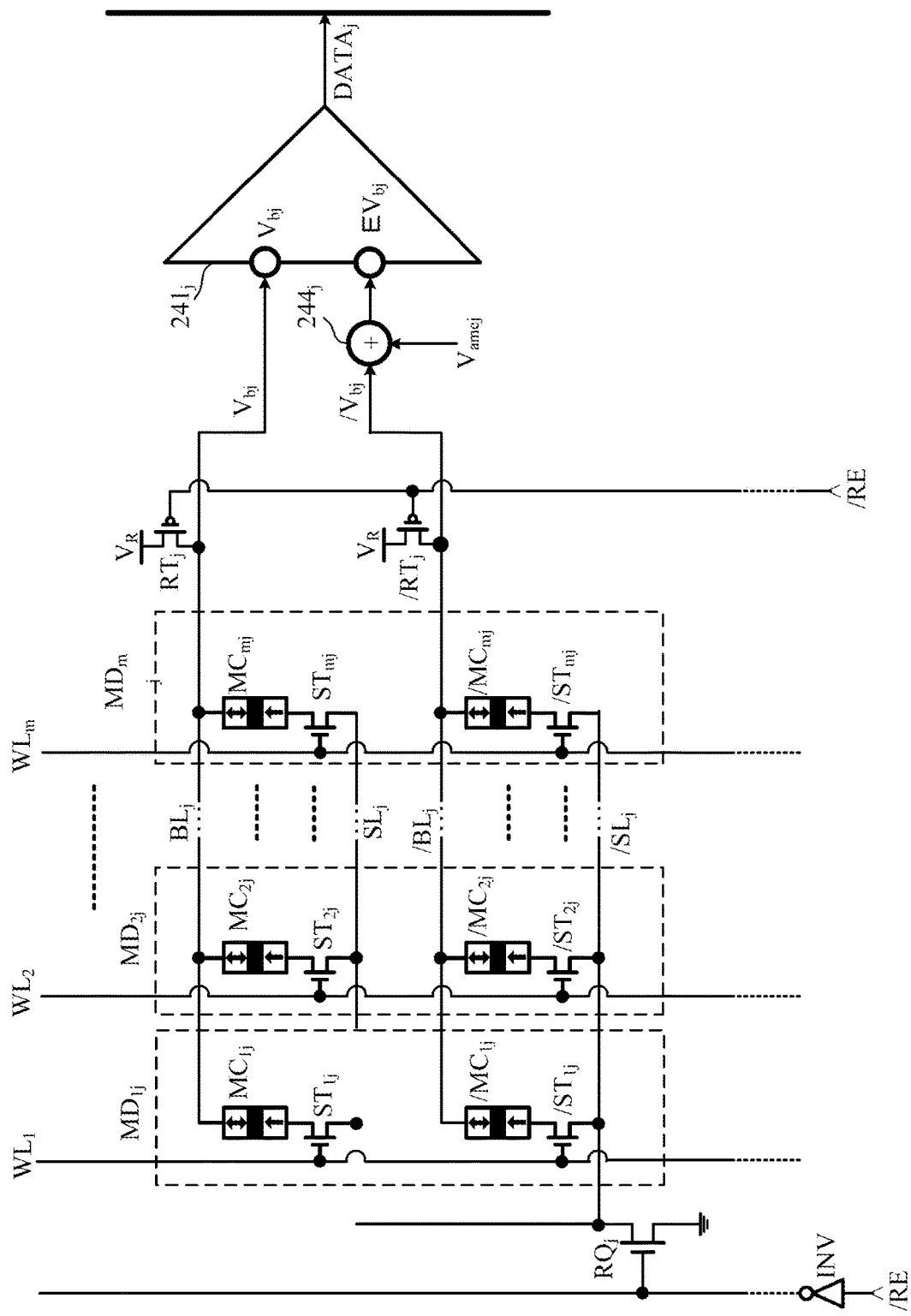
FIG. 27 is a circuit diagram of an embodiment in which the present disclosure is applied to a storage circuit having a type in which complementation data is stored in a pair of memory cells.
Figure 28:
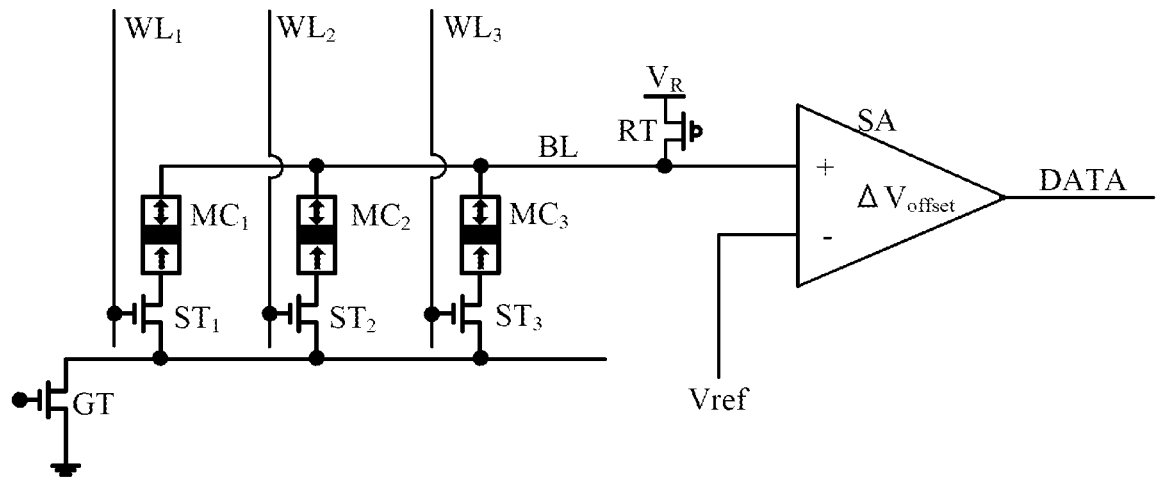
FIG. 28 is a block diagram illustrating the basic structure of a resistance variable storage circuit.
Figure 29:
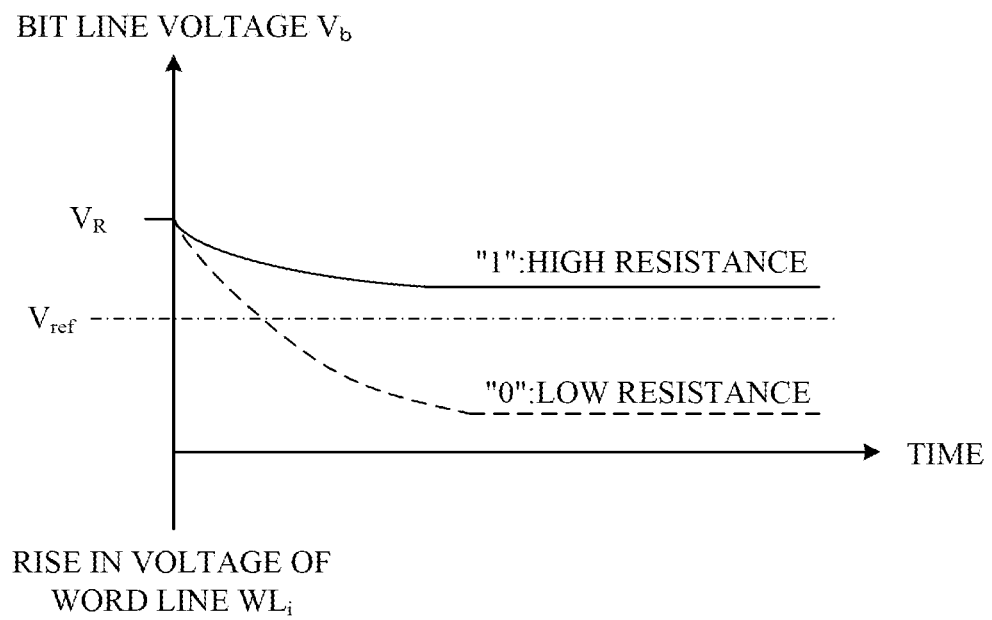
FIG. 29 is a timing chart for explaining the readout operation of the resistance variable storage circuit illustrated in FIG. 28.

In FIG. 27, storage elements $MD_{ij}$ to $MD_{mj}$ corresponding to m rows are arrayed in the column j. The memory element $MD_{ij}$ includes a pair of memory cells $MC_{ij}$ and $/MC_{ij}$. The memory cell $MC_{ij}$ stores variable data, and the memory cell $/MC_{ij}$ stores the complementary data thereof.

One ends of the memory cells $MC_{ij}$ in the column j are connected in common to a bit line $BL_j$. The bit line $BL_j$ is pulled up to a readout voltage $V_R$ by a load transistor $RT_j$. One end of the current path of each selection transistor $ST_{ij}$ is connected to the other end of each memory cell $MC_{ij}$. A source line $SL_j$ is connected in common to the other ends of the current paths of the selection transistors $ST_{ij}$ in the column j.

Likewise, one ends of the memory cell $/MC_{ij}$ in the column j are connected in common to a bit line $/BL_j$. The bit line $/BL_j$ is pulled up to the readout voltage $V_R$ by a load transistor $/RT_j$. One end of the current path of each selection transistor $/ST_{ij}$ is connected to the other end of each memory cell $/MC_{ij}$. A source line $/SL_j$ is connected in common to the other ends of the current paths of the selection transistors $/ST_{ij}$ in the column j.

The gates of the selection transistors $ST_{ij}$ and $/ST_{ij}$ in the row i are connected in common to a word line $WL_i$.

The source lines $SL_j$ and $/SL_j$ in the column j are grounded through a grounding transistor $RQ_j$. The invert signal of a read enable signal /RE is connected in common to the gates of the grounding transistors $RQ_j$.

The bit line $BL_j$ is connected to the positive input terminal of a sense amplifier. In contrast, the bit line $/BL_j$ is connected to an adder circuit $244_j$. The adder circuit $244_j$ adds a bit line voltage $/V_{bj}$ and a correction voltage $V_{amej}$, generates an effective bit line voltage $/EV_{bj}$, and supplies the effective bit line voltage $/EV_{bj}$ to the negative input terminal of the sense amplifier $241_j$. The sense amplifier $241_j$ differentially amplifies and latches a bit line voltage $V_{bj}$ and the effective bit line voltage $/EV_{bj}$, and outputs output data $DATA_j$.

In such a configuration, the bit line voltage $/V_{bj}$ can be corrected to a suitable value by correction data $D_j$ stored in a correction memory $242_j$. As a result, data stored in the memory cells $MC_{ij}$ and $/MC_{ij}$ can be appropriately read out even when the number of the memory cells $MC_{ij}$ and $/MC_{ij}$ connected to the bit lines $BL_j$ and $/BL_j$ is large.

In the case of using complementary memory elements as illustrated in FIG. 20, the examples illustrated in FIGS. 13A to 14D, 16, 17A, 17B, 21A to 23B, and 26 can also be applied. In other words, any circuit configuration may be adopted as long as it is possible to correct the bit line voltage $V_{bj}$ or $/V_{bj}$ in accordance with the correction data $D_j$ stored in the correction memory 242 or to adjust the offset voltage $\Delta V_{offset}$ of the sense amplifier $241_j$.

The disclosure is described using a positive logic in the above description. However, the present disclosure can be similarly applied to a storage circuit using a negative logic.

The plurality of correction circuits described above may be combined. For example, the configuration of FIG. 15A may also be adopted while adopting the configuration of FIG. 4.

In addition, the storage element is not limited to an MTJ element. The storage element may be a variable-resistance storage element such as a resistance random access memory (ReRAM). In such a case, the configuration of a variable-resistance element included in a reference circuit is also allowed to be identical with the configuration of a variable-resistance element included in a memory cell and to be set at a low resistance RL, and the resistance value of a fixed resistance FR is also set at more than 0 and less than the difference between the high resistance RH and low resistance RL of the variable-resistance element. In particular, it is desirable that the resistance value is substantially equal to $(\alpha/100) \times RL$. Here, $\alpha$ is the upper limit value (%) of variations in the resistance value of the variable-resistance element, acceptable from the resolution (the minimum detectable value of the difference between the voltage of the positive input terminal and the voltage of the negative input terminal) of the sense amplifier used in the storage circuit. In such a case, a configuration in which a fixed resistance is arranged for each reference cell, and a configuration in which one fixed resistance is arranged (used in common) in a plurality of reference cells (variable-resistance elements) are also possible.

The present disclosure is not limited to the description of the above-described embodiments and the drawings. The above-described embodiments, the drawing, and the like can be modified as appropriate.

This application claims the benefit of Japanese Patent Application No. 2020-134555, filed on Aug. 7, 2020, the entire disclosure of which is incorporated by reference herein.

What is claimed is:

1. A storage circuit comprising:
a memory cell array comprising a plurality of memory cells arranged in a matrix-form, each of the memory cells comprising a variable-resistance element;
a selection circuit that selects a memory cell in the memory cell array;
a conversion circuit that converts a resistance value of the memory cell selected by the selection circuit into an electric signal;
a reference signal generation circuit that generates a reference signal for determining data stored in the memory cell selected by the selection circuit;
sense amplifiers each of which is arranged in a respective column of the memory cell array, and compares a respective electric signal with the reference signal, to determine the data stored in the memory cell selected by the selection circuit;
a correction data storage that stores correction data for correcting, for each of the sense amplifiers, one of the respective electric signal and the reference signal for determining the data stored in the memory cell selected by the selection circuit; and
correction circuits each of which is provided for respective sense amplifier and corrects one of the respective electric signal and the reference signal based on respective correction data;

wherein
the correction data storage stores digital correction data for each of the sense amplifiers;
the correction circuits comprise:
digital to analog (D/A) circuits each of which is provided for a respective sense amplifier, and converts a respective digital correction data stored in the correction data storage to an analog correction signal; and
adder circuits each of which is provided for a respective sense amplifier, adds the analog correction signal output from the respective D/A circuit, to one of the respective electric signal and the reference signal, and supplies the resultant signal to the respective one of sense amplifies.

2. A storage circuit comprising:
a memory cell array comprising a plurality of memory cells arranged in a matrix-form, each of the memory cells comprising a variable-resistance element;
a selection circuit that selects a memory cell in the memory cell array;
a conversion circuit that converts a resistance value of the memory cell selected by the selection circuit into an electric signal;
a reference signal generation circuit that generates a reference signal for determining data stored in the memory cell selected by the selection circuit;
sense amplifiers each of which is provided for a respective column of the memory cell array, and compares respective electric signals with respective reference signals, to determine the data stored in the memory cell selected by the selection circuit;
a correction data storage that stores correction data for correcting, for each of the sense amplifiers, one of the respective electric signal and the reference signal for determining the data stored in the memory cell selected by the selection circuit; and
correction circuits each of which corrects one of the respective electric signals and the reference signal based on a respective correction data, and supplies a corrected signal to respective sense amplifier;
wherein
each of the correction circuit comprises,
a digital to analog (D/A) circuit that converts the digital correction data stored in the correction data storage to the analog correction signal; and
an amplifier circuit that amplifies one of the respective electric signal and the reference signal by an amplification factor corresponding to the analog correction signal, and supplies the amplified signal to the respective sense amplifier.

3. A storage circuit, comprising:
a memory cell array comprising a plurality of memory cells arranged in a matrix-form, each of the memory cell comprising a variable-resistance element;
a selection circuit that selects the memory cell in the memory cell array;
a conversion circuit that converts a resistance value of the memory cell selected by the selection circuit into an electric signal;
a reference signal generation circuit that generates a reference signal for determining data stored in the memory cell selected by the selection circuit;
sense amplifiers each of which is provided for a respective column of the memory cell array, and compares a respective electric signal with the reference signal, to determine the data stored in the memory cell selected by the selection circuit;
a correction data storage that stores correction data for correcting, for each of the sense amplifiers, a physical property for determining the data stored in the memory cell selected by the selection circuit; and
a correction circuit that corrects the physical property based on the correction data, for each sense amplifier;
wherein
the correction circuit comprises an amplifier circuit that amplifies one signal of the electric signal and the reference signal by an amplification factor based on the correction data stored in the correction data storage,
the amplifier circuit comprises:
an operational amplifier; and
an amplification factor change circuit that changes at least one of a resistance value between an output terminal and negative input terminal of the operational amplifier, and a resistance value between the reference voltage and the negative input terminal of the operational amplifier, based on the correction data.

4. A storage circuit comprising:
a memory cell array comprising a plurality of memory cells arranged in a matrix-form, each of the memory cells comprising a variable-resistance element;
a selection circuit that selects the memory cell in the memory cell array;
a conversion circuit that converts a resistance value of the memory cell selected by the selection circuit into an electric signal;
a reference signal generation circuit that generates a reference signal for determining data stored in the memory cell selected by the selection circuit;
sense amplifiers each of which is provided for respective column of the memory cell array, and compares a respective electric signal with the reference signal, to determine the data stored in the memory cell selected by the selection circuit;
a correction data storage that stores correction data for correcting, for each of the sense amplifiers, a physical property for determining the data stored in the memory cell selected by the selection circuit; and
a correction circuit that corrects the physical property based on the correction data stored in the correction data storage, for each sense amplifier;
wherein
the correction circuit comprises a dividing resistance changer that corrects an electric signal output from the conversion circuit by changing a resistance value between a first reference voltage and one end of each memory cell, and a resistance value between each memory cell and a second reference voltage, based on the correction data.

5. The storage circuit according to claim 4, wherein the correction circuit comprises a plurality of transistors that electrically connects between the first reference voltage and one end of each memory cell, the plurality of transistors being turned on/off based on the correction data stored in the correction data storage.

6. The storage circuit according to claim 5, wherein the correction circuit comprises resistance elements that are serially connected to current paths of the plurality of transistors.

7. A testing device for testing a storage circuit, the storage circuit having:
a memory cell array comprising a plurality of memory cells arranged in a matrix-form, each of the memory cells comprising a variable-resistance element;

a selection circuit that selects the memory cell in the memory cell array;

a conversion circuit that converts a resistance value of the memory cell selected by the selection circuit into an electric signal;

a reference signal generation circuit that generates a reference signal for determining data stored in the memory cell selected by the selection circuit;

sense amplifiers each of which is provided for a respective column of the memory cell array, and compares a respective electric signal with a respective reference signal, to determine the data stored in the memory cell selected by the selection circuit;

a correction data storage that stores correction data for correcting, for each of the sense amplifiers, a physical property for determining the data stored in the memory cell selected by the selection circuit; and a correction circuit that corrects the physical property based on the correction data stored in the correction data storage, for each sense amplifier;

wherein the testing circuit comprises a write circuit, a readout circuit, a determiner and a setter;

the write circuit writes first data having a first value into each of the memory cells;

the readout circuit reads out stored data from each of the memory cells for each of the correction data while changing correction quantity corresponding to the correction data by controlling the correction circuit, the determiner determines whether or not the stored first data can be correctly read out, for each of the correction data, the write circuit writes second data different from the first data into each of the memory cells;

the read circuit reads out stored data from each of the memory cells for each of the correction data while changing correction quantity corresponding to the correction data by controlling the correction circuit, the determiner determines whether or not the stored second data can be correctly read out, for each of the correction data, and the setter selects adequate correction data for each of the sense amplifiers based on the determination results obtained by the determiner, and sets selected correction data for each of the sense amplifiers into the correction memory.

8. The testing device according to claim 7, wherein the setter sets, in the correction memory, the correction data, with which it has been determined that all first and second data stored in the memory cells in each column can be correctly read out, based on the result of the determination, by the unit of the column of the matrix of the memory cells.

9. The testing device according to claim 7, wherein the storage circuit comprises a column of redundant memory cells, and the setter performs setting so that an access to a defective memory cell is replaced with an access to one of the redundant memory cells based on the result of the determination by the determiner.

10. The storage circuit according to claim 1, wherein each respective electric signal and respective reference signal comprises a voltage signal, each of the D/A circuits converts the correction data read from the correction data storage, to an analog voltage signal having one of a plurality of positive voltages, zero voltage, and a plurality of negative voltages, each of the adding circuits is provided for one of the respective sense amplifiers, and adds the voltage signal output from the D/A circuit to one of the respective electrical signal and the respective reference signal.

11. The storage circuit according to claim 1, wherein each respective electric signal and respective reference signal comprises a current signal, each of the D/A circuits converts the correction data read from the correction data storage, to an analog voltage signal having one of a plurality of positive voltages, a zero voltage, and a plurality of negative voltages, each of the adding circuits comprises:

a current generator which generates a correction current having a polarity and volume corresponding the analog voltage signal output from the D/A circuit, and a circuit which adds the correction current to one of the respective electric signal and the respective reference signal.

12. The storage circuit according to claim 2, wherein each of the respective electric signal and the respective reference signal comprises a voltage signal, each of the D/A circuits converts the correction data read for the correction data storage, to an analog correction voltage signal, each of the amplifier circuits is provided for one of the respective sense amplifiers, and amplifies one of the respective electric signal and the respective reference signal by an amplification factor corresponding to the analog correction voltage signal output from the D/A circuit.

13. The storage circuit according to claim 2, wherein each of the respective electric signals and the respective reference signals comprises a current signal, each of the D/A circuits converts the correction data read from the correction data storage, to an analog correction voltage signal, each of the amplification circuits is provided for one of the respective sense amplifiers, and amplifies one of the respective electric signal and the respective reference signal by an amplification factor corresponding to the analog correction voltage signal.

14. The storage circuit according to claim 10, wherein each of the sense amplifiers includes an input transistor circuit which includes a first and second MOS transistors, the first MOS transistor receives the electrical voltage signal or the corrected electrical voltage signal at a gate thereof, and the second MOS transistor receives the corrected reference voltage signal or the reference voltage signal at a gate thereof.

15. The storage circuit according to claim 12, wherein each of the sense amplifiers includes an input transistor circuit which includes a first and second MOS transistors, the first MOS transistor receives the electrical voltage signal or the corrected electrical voltage signal at a gate thereof, and the second MOS transistor receives the corrected reference voltage signal or the reference voltage signal at a gate thereof.

* * * * *